US008320159B2

(12) United States Patent
Wei et al.

(10) Patent No.: US 8,320,159 B2
(45) Date of Patent: Nov. 27, 2012

(54) RESISTANCE VARIABLE NONVOLATILE MEMORY DEVICE

(75) Inventors: Zhiqiang Wei, Osaka (JP); Ryotaro Azuma, Osaka (JP); Takeshi Takagi, Kyoto (JP); Mitsuteru Iijima, Osaka (JP); Yoshihiko Kanzawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/993,706

(22) PCT Filed: Mar. 15, 2010

(86) PCT No.: PCT/JP2010/001833
§ 371 (c)(1),
(2), (4) Date: Nov. 19, 2010

(87) PCT Pub. No.: WO2010/109803
PCT Pub. Date: Sep. 30, 2010

(65) Prior Publication Data
US 2011/0075469 A1    Mar. 31, 2011

(30) Foreign Application Priority Data

Mar. 25, 2009  (JP) ................................ 2009-074572

(51) Int. Cl.
*G11C 11/00* (2006.01)
(52) U.S. Cl. ............... 365/148; 365/51; 365/63; 365/72
(58) Field of Classification Search .................. 365/148, 365/158, 163, 171, 173
See application file for complete search history.

(56) References Cited

U.S. PATENT DOCUMENTS

| 6,815,781 | B2 * | 11/2004 | Vyvoda et al. | 257/377 |
|---|---|---|---|---|
| 6,862,214 | B2 * | 3/2005 | Lee et al. | 365/163 |
| 6,943,395 | B2 * | 9/2005 | Oh et al. | 257/295 |
| 7,298,640 | B2 * | 11/2007 | Chen et al. | 365/148 |
| 7,411,818 | B1 * | 8/2008 | Elmegreen et al. | 365/163 |
| 7,436,695 | B2 * | 10/2008 | Nirschl et al. | 365/148 |
| 7,474,555 | B2 * | 1/2009 | Nirschl et al. | 365/163 |

(Continued)

FOREIGN PATENT DOCUMENTS

JP    61-030063    2/1986

(Continued)

*Primary Examiner* — Tuan T Nguyen
*Assistant Examiner* — Lance Reidlinger
(74) *Attorney, Agent, or Firm* — McDermott Will & Emery LLP

(57) ABSTRACT

Each of memory cells (MC) includes one transistor and one resistance variable element. The transistor includes a first main terminal, a second main terminal and a control terminal. The resistance variable element includes a first electrode, a second electrode and a resistance variable layer provided between the first electrode and the second electrode. A first main terminal of one of two adjacent memory cells is connected to a second main terminal of the other memory cell, to form a series path (SP) sequentially connecting main terminals of the plurality of memory cells in series. Each of the memory cells is configured such that the control terminal is a part of a first wire (WL) associated with the memory cell or is connected to the first wire associated with the memory cell, the second electrode is a part of a second wire (SL) associated with the memory cell or is connected to the second wire associated with the memory cell; and the first electrode is a part of a series path (SP) associated with the memory cell or is connected to the series path associated with the memory cell.

9 Claims, 85 Drawing Sheets

U.S. PATENT DOCUMENTS

| | | | |
|---|---|---|---|
| 7,688,614 B2 * | 3/2010 | Morimoto | 365/148 |
| 7,719,882 B2 * | 5/2010 | Lin et al. | 365/158 |
| 2004/0113187 A1 | 6/2004 | Cha | |
| 2004/0174732 A1 | 9/2004 | Morimoto | |
| 2004/0264244 A1 | 12/2004 | Morimoto | |
| 2006/0289942 A1 | 12/2006 | Horii et al. | |
| 2008/0266934 A1 | 10/2008 | Yokoi | |
| 2009/0052225 A1 | 2/2009 | Morimoto | |
| 2009/0135641 A1 | 5/2009 | Tajiri et al. | |
| 2009/0161408 A1 | 6/2009 | Tanigami et al. | |
| 2010/0118590 A1 * | 5/2010 | Carter et al. | 365/148 |
| 2011/0096588 A1 * | 4/2011 | Fasoli | 365/148 |

FOREIGN PATENT DOCUMENTS

| | | |
|---|---|---|
| JP | 2004-200641 | 7/2004 |
| JP | 2004-272975 | 9/2004 |
| JP | 2005-025914 | 1/2005 |
| JP | 2006-203098 | 8/2006 |
| JP | 2007-005609 | 1/2007 |
| JP | 2007-026627 | 2/2007 |
| JP | 2008-146740 | 6/2008 |
| JP | 2008-269741 | 11/2008 |

* cited by examiner

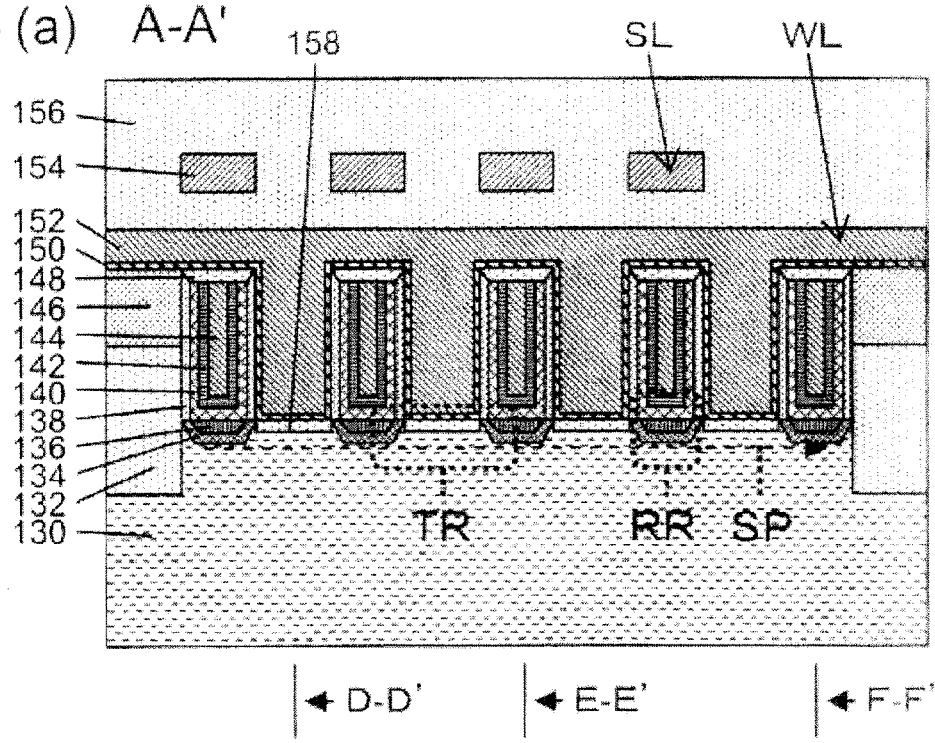
Fig. 4 (a) A-A'
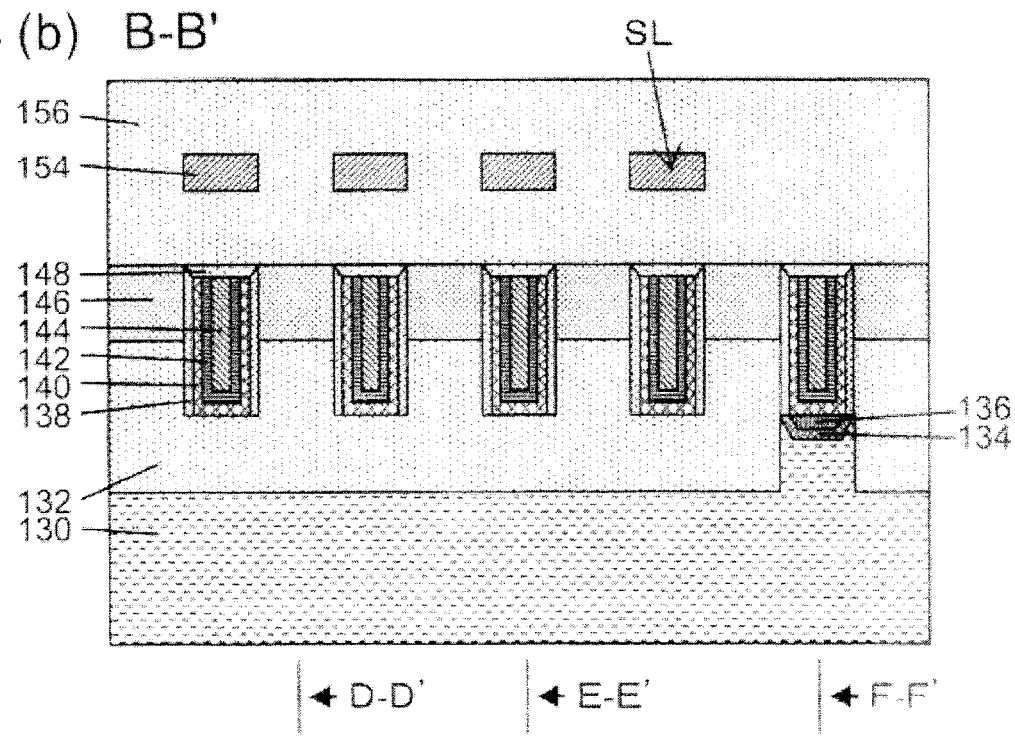
Fig. 4 (b) B-B'

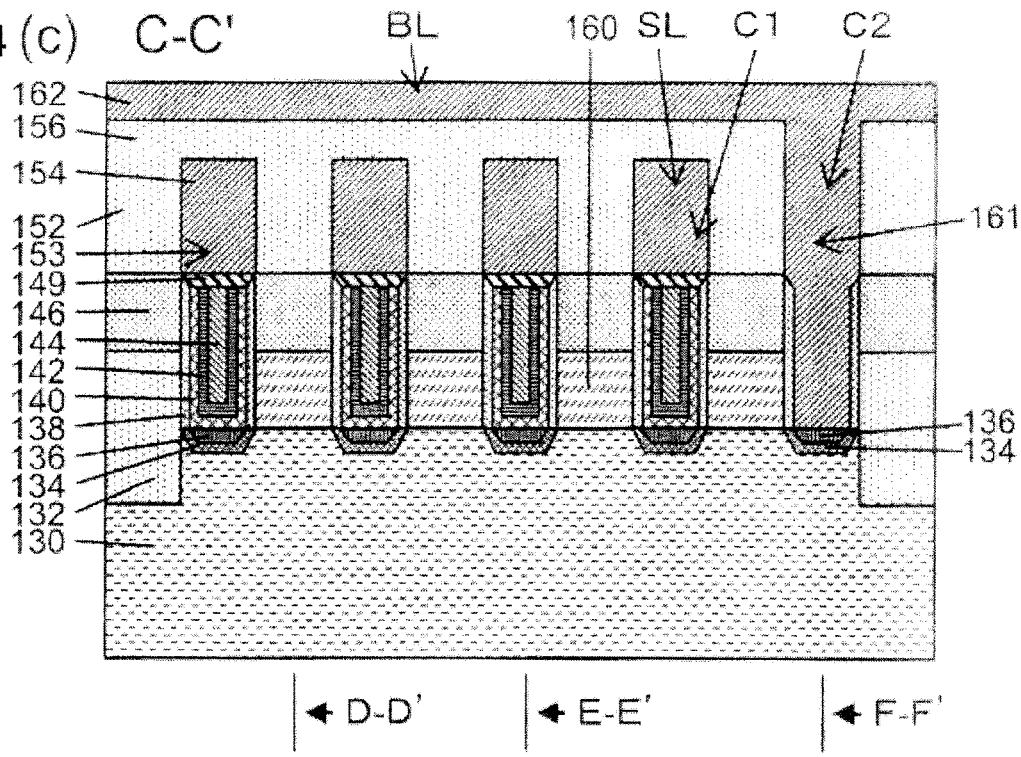
Fig. 4(c) C-C'
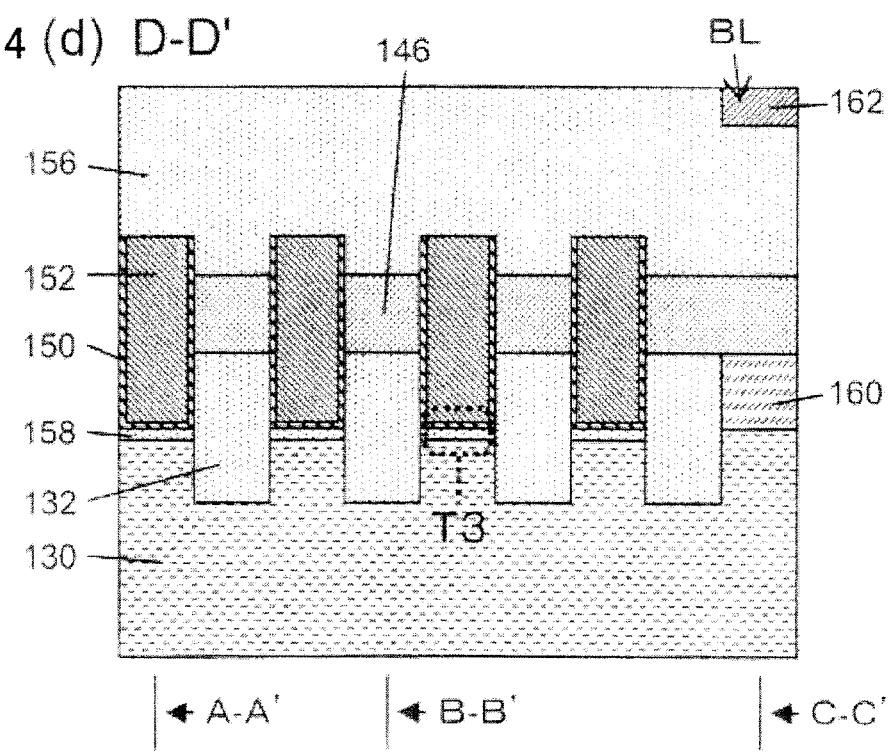
Fig. 4(d) D-D'

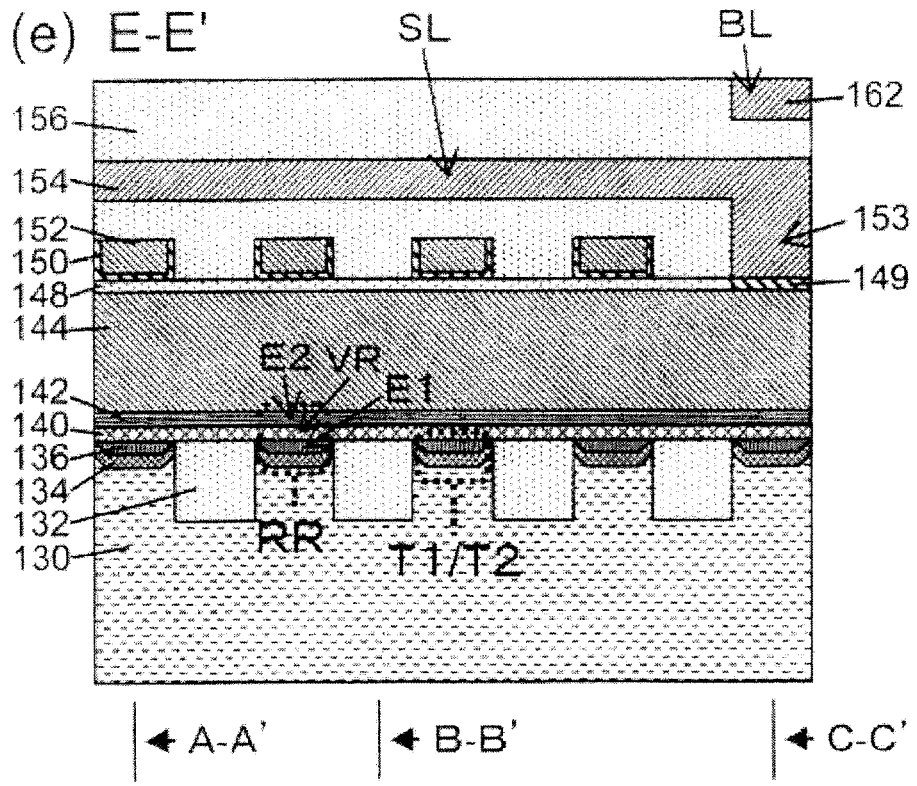
Fig. 4 (e) E-E'
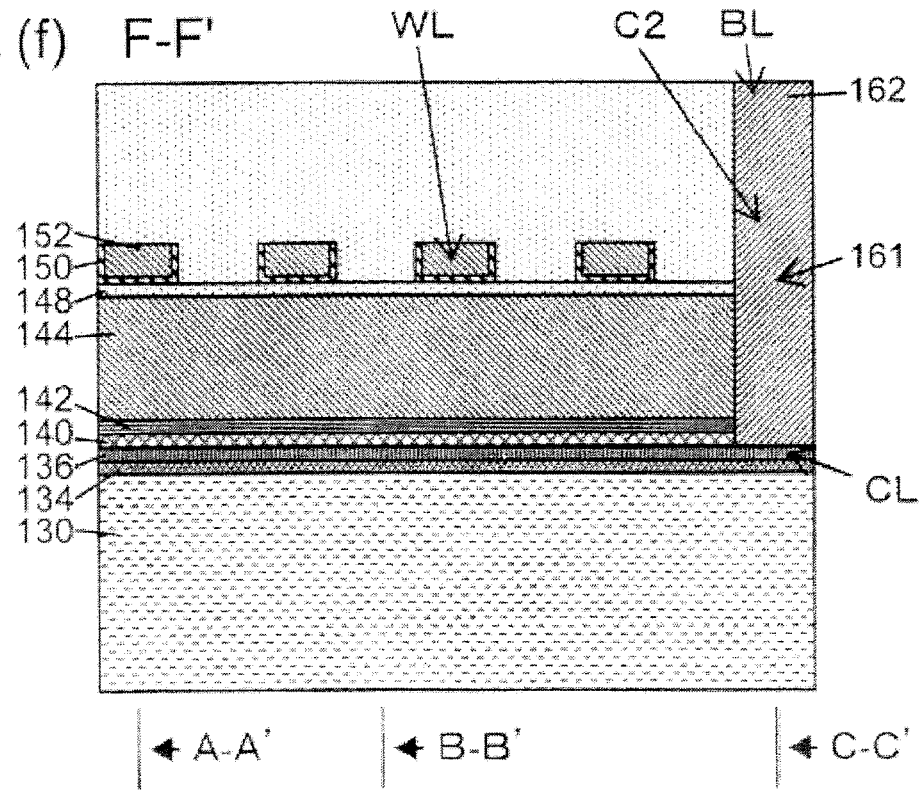
Fig. 4 (f) F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

A-A'

B-B'

C-C'

D-D'

E-E'

F-F'

RESISTANCE VARIABLE NONVOLATILE MEMORY DEVICE

RELATED APPLICATIONS

This application is the U.S. National Phase under 35 U.S.C. §371 of International Application No. PCT/JP2010/001833, filed on Mar. 15, 2010, which in turn claims the benefit of Japanese Application No. 2009-074572, filed on Mar. 25, 2009, the disclosures of which Applications are incorporated by reference herein.

TECHNICAL FIELD

The present invention relates to a resistance variable nonvolatile memory device including a memory cell configured to include a resistance variable element which changes resistance values reversibly in response to electric signals and a transistor.

BACKGROUND ART

In recent years, a nonvolatile memory device incorporating a memory cell configured to include a resistance variable element has been studied and developed. As used herein, the resistance variable element refers to an element which has a characteristic in which its resistance values change reversibly in response to electric signals and is capable of storing data corresponding to the resistance values in a nonvolatile manner.

The memory cell including the resistance variable element is configured in, for example, a cross-point structure. In the cross-point structure, memory cells are respectively arranged at cross points of bit lines and word lines which cross each other in a direction perpendicular to each other such that each memory cell is sandwiched between the associated bit line and the associated word line. A practicable area of the memory cell is $4F^2$. Patent literature 1 discloses a cross-point resistance variable memory device incorporating a bipolar resistance variable element. In this resistance variable memory device, when data is written, Vpp is applied to a selected bit line, Vss (0V) is applied to a selected word line, and 1/2Vpp is applied to an unselected word line and to an unselected bit line, while when data is erased, Vpp is applied to a selected word line, Vss (0V) is applied to a selected bit line, and Vpp/2 is applied to an unselected word line and to an unselected bit line.

As a nonvolatile memory device incorporating the resistance variable element, a nonvolatile memory device is generally known, in which 1T1R memory cells are arrayed in matrix at intersections of bit lines, word lines, and source lines, and the word lines and the source lines extending in a direction perpendicular to the bit lines, such that each memory cell includes a MOS transistor and a resistance variable element which are coupled to each other in series. A necessary area of the memory cell is $6F^2$ at least.

Patent literature 2 discloses a nonvolatile memory device including a 1T1R memory cell comprising oxide having a perovskite crystalline structure as a resistance variable element.

FIG. 47 is a schematic view of a cross-section of the memory cell disclosed in FIG. 2 of Patent literature 2.

A memory cell 1011 includes a transistor 1006 and a resistance variable element 1010 which are electrically connected to each other in series.

The transistor 1006 includes on a semiconductor substrate 1001, a source region 1002 which is a first diffusion layer region, a drain region 1003 which is a second diffusion layer region, and a gate electrode 1005 formed on a gate oxide layer 1004.

The resistance variable element 1010 includes a resistance variable layer 1008 which changes resistance values in response to voltages applied, a lower electrode 1007, and an upper electrode 1009 such that the resistance variable layer 1008 is sandwiched between the lower electrode 1007 and the upper electrode 1009.

The drain region 1003 is electrically connected to the lower electrode 1007.

The upper electrode 1009 is connected to a metal wire which serves as a bit line 1012, the gate electrode 1005 is connected to a word line, and the source region 1002 is connected to a metal wire which serves as a source line 1013.

As a material used for the resistance variable layer 1008, $Pr_{1-x}Ca_xMnO_3$, $La_{1-x}Ca_xMnO_3$ (LCMO) and other materials are disclosed, but an electrode material is not mentioned specifically.

A method of writing data to the memory cell 1011, is also disclosed, in which the resistance variable layer 1008 changes from a low-resistance state to a high-resistance state when Vpp is applied to the upper electrode 1009, Vss is applied to the source region 1002, and a pulse voltage with a specified voltage amplitude Vwp is applied to the gate electrode, while the resistance variable layer 1008 changes from the high-resistance state to the low-resistance state when Vss is applied to the upper electrode 1009, Vpp is applied to the source region 1002, and a pulse voltage with a specified voltage amplitude Vwe is applied to the gate electrode.

Patent literature 3 and Patent literature 4 disclose a structure for achieving an area of memory cell of $4F^2$ using the 1T1R memory structure.

FIG. 48 is a circuit diagram disclosed in FIG. 5 of Patent literature 3. As shown, a memory cell is configured to include a resistance variable element and a transistor which are arranged in parallel. A memory array is configured by connecting memory cells in series. With this arrangement, the area of the memory cell is determined by the area of the transistor and can be reduced to $4F^2$ in practice.

CITATION LIST

Patent Literatures
 Patent literature 1: Japanese Laid-Open Patent Application Publication No. 2006-203098
 Patent literature 2: Japanese Laid-Open Patent Application Publication No. 2005-25914
 Patent literature 3: Japanese Laid-Open Patent Application Publication No. 2004-272975
 Patent literature 4: U.S. Pat. No. 7,298,640 specification

SUMMARY OF THE INVENTION

Solution to Problem

However, Patent literature 1 reciting that the area of the memory cell smaller than the area of 1T1R memory cell of $6F^2$, discloses the cross-point resistance variable memory device including a varistor as a rectifying element. In general, a cross-point resistance variable memory device uses a diode as the rectifying element. The diode has a characteristic in which its current increases exponentially with respect to a voltage. A value of the current flowing through the diode does not fully reach zero even when an applied voltage is lower than a threshold voltage Vth. In a case where an electric potential difference of Vpp/2 is applied to an unselected memory cell as recited in Patent literature 1, a current flowing through the unselected cell is about one hundredth to about one thousandth of the current flowing through the selected cell, if Schottky or MIM diode model is used. In a large-scale memory array, several hundreds to several thousands memory cells are arranged along one row or one column. Therefore, a total current flowing through unselected cells connected to a selected bit line or selected word line (leak current) is not always negligible as compared to a value of the current flowing through a selected cell.

In Patent literature 3 and Patent literature 4, since the resistance variable element and the transistor are arranged in parallel, all of transistors disposed along the same column are turned ON and a source-drain voltage is applied to unselected resistance variable elements, when one memory cell is selected from among the memory cells arranged in series. In addition, the resistance of the resistance variable element in a low-resistance state is several hundreds $\Omega$ and the ON-resistance of the transistor is about 1 k$\Omega$, and therefore, a more current flows in amount through the resistance variable element in a low resistance state than the transistor, which deteriorates a memory characteristic of the element.

The present invention has been made to solve the above described problem, and a primary object of the present invention is to provide a nonvolatile memory device which devises a structure for positioning a resistance variable element to implement a memory cell of $4F^2$ while effectively suppressing a current flowing through an unselected memory cell.

Solution to Problem

To solve the above described problem, a nonvolatile memory device of the present invention comprises a plurality of first wires extending in parallel with each other in a first direction within a first plane; a plurality of second wires extending in parallel with each other in a second direction within a second plane parallel to the first plane such that the plurality of second wires three-dimensionally cross the plurality of first wires, respectively; and memory cells provided to respectively correspond to three-dimensional cross-points of the first wires and the second wires; each of the memory cells including one transistor and one resistance variable element; the transistor including a first main terminal, a second main terminal and a control terminal; the resistance variable element including a first electrode, a second electrode and a resistance variable layer provided between the first electrode and the second electrode; the memory cells including a plurality of memory cells which are arranged along the first direction and configured such that a first main terminal of one of two adjacent memory cells is connected to a second main terminal of the other memory cell, to form a series path extending in the first direction and sequentially connecting main terminals of the plurality of memory cells in series; and each of the memory cells being configured such that: the control terminal is connected to a first wire associated with the memory cell; the second electrode is connected to a second wire associated with the memory cell; and the first electrode is connected to a series path associated with the memory cell.

In such a configuration, it is possible to provide a nonvolatile memory device which implements a memory cell of $4F^2$ while effectively suppressing a current flowing through an unselected memory cell.

The nonvolatile memory device may further comprise a plurality of third wires extending in parallel with each other in the first direction. The plurality of memory cells arranged along the first direction may form a plurality of memory blocks each of which includes a predetermined number of memory cells arranged successively. The series path may be connected to the associated third wire for each of the memory blocks.

In such a configuration, a wire delay in the series path can be suppressed by using an electric conductor with a low resistivity for a bit line BL.

In the nonvolatile memory device, both ends of the series path may be connected to the associated third wire for each of the memory blocks.

In such a configuration, since the electric potential propagates from the both sides of the series path, the wire delay can be suppressed more effectively.

The nonvolatile memory device may further comprise an electric power supply circuit for applying voltages to the resistance variable element included in each of the memory cells. The electric power supply circuit may be configured to change output voltages, according to the number of transistors included in a portion of a series path associated with a selected memory cell, from a connecting point of the associated series path and the associated third wire to the first electrode of the selected memory cell.

In such a configuration, the voltages applied between the electrodes of the resistance variable element are constant irrespective of the location of the memory cell. Therefore, it is possible to uniformize the respective resistance values after writing and to suppress an unnecessary voltage stress applied to the resistance variable element more effectively, as compared to the conventional configuration.

In the nonvolatile memory device, each of the first main terminal and the second main terminal may include a silicide layer; and the silicide layer may constitute the first electrode.

In the nonvolatile memory device, the silicide layer may comprise platinum silicide.

The above and further objects, features and advantages of the present invention will more fully be apparent from the following detailed description of preferred embodiments with reference to accompanying drawings.

Advantageous Effects of the Invention

The present invention has the above described configuration, and can provide a a nonvolatile memory device which implements a memory cell of $4F^2$ while suppressing a current flowing through an unselected memory cell more effectively.

BRIEF DESCRIPTION OF DRAWINGS

FIG. 4 is a cross-sectional view of the memory block indicated by one-dotted line of FIG. 3, in which FIG. 4(*a*) is a cross-sectional view taken along line A-A' of FIG. 3, FIG. 4(*b*) is a cross-sectional view taken along line B-B' of FIG. 3, FIG. 4(*c*) is a cross-sectional view taken along line C-C' of FIG. 3, FIG. 4(*d*) is a cross-sectional view taken along line D-D' of FIG. 3, FIG. 4(*e*) is a cross-sectional view taken along line E-E' of FIG. 3, and FIG. 4(*f*) is a cross-sectional view taken along line F-F' of FIG. 3.

FIG. 6 is a timing chart showing an exemplary operation of the nonvolatile memory device according to Embodiment 1 of the present invention, in which FIG. 6(a) shows an operation in which "0" is written (resistance variable element RR is changed to a low-resistance state) to a memory cell $MC00_{00}$, FIG. 6(b) shows an operation in which "1" is written (resistance variable element RR is changed to a high-resistance state) to the memory cell $MC00_{00}$, and FIG. 6(c) shows an operation in which data is read from the memory cell $MC00_{00}$.

FIG. 8 is cross-sectional views showing the step of forming the polysilicon layer on the P-type silicon substrate, in which FIG. 8(a) is a cross-sectional view taken in the direction of arrows along A-A' of FIG. 7, FIG. 8(b) is a cross-sectional view taken in the direction of arrows along B-B' of FIG. 7, FIG. 8(c) is a cross-sectional view taken in the direction of arrows along C-C' of FIG. 7, FIG. 8(d) is a cross-sectional view taken in the direction of arrows along D-D' of FIG. 7, FIG. 8(e) is a cross-sectional view taken in the direction of arrows along E-E' of FIG. 7, and FIG. 8(f) is a cross-sectional view taken in the direction of arrows along F-F' of FIG. 7.

FIG. 10 is cross-sectional views showing the step of etching the P-type silicon substrate and the polysilicon layer to form the trench into which the STI is filled, in which FIG. 10(a) is a cross-sectional view taken in the direction of arrows along A-A' of FIG. 9, FIG. 10(b) is a cross-sectional view taken in the direction of arrows along B-B' of FIG. 9, FIG. 10(c) is a cross-sectional view taken in the direction of arrows along C-C' of FIG. 9, FIG. 10(d) is a cross-sectional view taken in the direction of arrows along D-D' of FIG. 9, FIG. 10(e) is a cross-sectional view taken in the direction of arrows along E-E' of FIG. 9, and FIG. 10(f) is a cross-sectional view taken in the direction of arrows along F-F' of FIG. 9.

FIG. 12 is cross-sectional views showing the step of filling silicon dioxide into the trench to form the STI, in which FIG. 12(a) is a cross-sectional view taken in the direction of arrows along A-A' of FIG. 11, FIG. 12(b) is a cross-sectional view taken in the direction of arrows along B-B' of FIG. 11, FIG. 12(c) is a cross-sectional view taken in the direction of arrows along C-C' of FIG. 11, FIG. 12(d) is a cross-sectional view taken in the direction of arrows along D-D' of FIG. 11, FIG. 12(e) is a cross-sectional view taken in the direction of arrows along E-E' of FIG. 11, and FIG. 12(f) is a cross-sectional view taken in the direction of arrows along F-F' of FIG. 11.

FIG. 14 is a cross-sectional views showing the step of forming the $Si_3N_4$ layer to cover the silicon dioxide layer and the polysilicon layer, in which FIG. 14(c) is a cross-sectional view taken in the direction of arrows along C-C' of FIG. 13, FIG. 14(d) is a cross-sectional view taken in the direction of arrows along D-D' of FIG. 13, FIG. 14(e) is a cross-sectional view taken in the direction of arrows along E-E' of FIG. 13, and FIG. 14(f) is a cross-sectional view taken in the direction of arrows along F-F' of FIG. 13.

FIG. 16 is cross-sectional views showing the step of forming the memory trench, in which FIG. 16(a) is a cross-sectional view taken in the direction of arrows along A-A' of FIG. 15, FIG. 16(b) is a cross-sectional view taken in the direction of arrows along B-B' of FIG. 15, FIG. 16(c) is a cross-sectional view taken in the direction of arrows along C-C' of FIG. 15, FIG. 16(d) is a cross-sectional view taken in the direction of arrows along D-D' of FIG. 15, FIG. 16(e) is a cross-sectional view taken in the direction of arrows along E-E' of FIG. 15, and FIG. 16(f) is a cross-sectional view taken in the direction of arrows along F-F' of FIG. 15.

FIG. 18 is cross-sectional views showing the step of implanting the phosphorous atoms (P) into the region of the bottom surface of each memory trench, where the P-type silicon substrate is exposed, in which FIG. 18(a) is a cross-sectional view taken in the direction of arrows along A-A' of FIG. 17, FIG. 18(b) is a cross-sectional view taken in the direction of arrows along B-B' of FIG. 17.

FIG. 20 is cross-sectional views showing the step of forming the $Si_3N_4$ portions (side walls) on the right and left side walls of each memory trench, in which FIG. 20(a) is a cross-sectional view taken in the direction of arrows along A-A' of FIG. 19, FIG. 20(b) is a cross-sectional view taken in the direction of arrows along B-B' of FIG. 19, FIG. 20(c) is a cross-sectional view taken in the direction of arrows along C-C' of FIG. 19, FIG. 20(d) is a cross-sectional view taken in the direction of arrows along D-D' of FIG. 19, FIG. 20(e) is a cross-sectional view taken in the direction of arrows along E-E' of FIG. 19, and FIG. 20(f) is a cross-sectional view taken in the direction of arrows along F-F' of FIG. 19.

FIG. 22 is cross-sectional views showing the step of implanting the phosphorous atoms (P) into the region between the pair of $Si_3N_4$ portions formed on each memory trench, where the P-type silicon substrate is exposed, in which FIG. 22(a) is a cross-sectional view taken in the direction of arrows along A-A' of FIG. 21, FIG. 22(b) is a cross-sectional view taken in the direction of arrows along B-B' of FIG. 21, FIG. 22(c) is a cross-sectional view taken in the direction of arrows along C-C' of FIG. 21, FIG. 22(d) is a cross-sectional view taken in the direction of arrows along D-D' of FIG. 21, FIG. 22(e) is a cross-sectional view taken in the direction of arrows along E-E' of FIG. 21, and FIG. 22(f) is a cross-sectional view taken in the direction of arrows along F-F' of FIG. 21.

FIG. 24 is cross-sectional views showing the step of forming the platinum silicide layer into the region between the pair of $Si_3N_4$ portions formed on each memory trench, where the P-implanted region is exposed, in which FIG. 24(a) is a cross-sectional view taken in the direction of arrows along A-A' of FIG. 23, FIG. 24(b) is a cross-sectional view taken in the direction of arrows along B-B' of FIG. 23, FIG. 24(c) is a cross-sectional view taken in the direction of arrows along C-C' of FIG. 23, FIG. 24(d) is a cross-sectional view taken in the direction of arrows along D-D' of FIG. 23, FIG. 24(e) is a cross-sectional view taken in the direction of arrows along E-E' of FIG. 23, and FIG. 24(f) is a cross-sectional view taken in the direction of arrows along F-F' of FIG. 23.

FIG. 26 is cross-sectional views showing the step of forming the tantalum oxide layer and the tantalum nitride layer over the entire surface including the side surfaces and the bottom surface of each memory trench, in which FIG. 26(a) is a cross-sectional view taken in the direction of arrows along A-A' of FIG. 25, FIG. 26(b) is a cross-sectional view taken in the direction of arrows along B-B' of FIG. 25, FIG. 26(e) is a cross-sectional view taken in the direction of arrows along E-E' of FIG. 25, and FIG. 26(f) is a cross-sectional view taken in the direction of arrows along F-F' of FIG. 25.

FIG. 28 is a cross-sectional view showing the step of removing the tantalum oxide layer and the tantalum nitride layer except for the portion of the tantalum oxide layer and the portion of the tantalum nitride layer which are present inside the memory trench, in which FIG. 28(a) is a cross-sectional view taken in the direction of arrows along A-A' of FIG. 27, FIG. 28(b) is a cross-sectional view taken in the direction of arrows along B-B' of FIG. 27, FIG. 28(c) is a cross-sectional view taken in the direction of arrows along C-C' of FIG. 27, FIG. 28(d) is a cross-sectional view taken in the direction of arrows along D-D' of FIG. 27, FIG. 28(e) is a cross-sectional view taken in the direction of arrows along E-E' of FIG. 27, and FIG. 28(f) is a cross-sectional view taken in the direction of arrows along F-F' of FIG. 27.

FIG. 30 is cross-sectional views showing the step of forming the tungsten layer into the trench formed inside the tantalum nitride layer and forming the silicon dioxide layer into the recess, in which FIG. 30(c) is a cross-sectional view taken in the direction of arrows along C-C' of FIG. 29, FIG. 30(d) is a cross-sectional view taken in the direction of arrows along D-D' of FIG. 29, FIG. 30(e) is a cross-sectional view taken in the direction of arrows along E-E' of FIG. 29, and FIG. 30(f) is a cross-sectional view taken in the direction of arrows along F-F' of FIG. 29.

FIG. 32 is cross-sectional views showing the step of forming the silicon dioxide layer over the entire surface and forming the trench into which the word line is filled, in which FIG. 32(a) is a cross-sectional view taken in the direction of arrows along A-A' of FIG. 31, FIG. 32(b) is a cross-sectional view taken in the direction of arrows along B-B' of FIG. 31, FIG. 32(c) is a cross-sectional view taken in the direction of arrows along C-C' of FIG. 31, FIG. 32(d) is a cross-sectional view taken in the direction of arrows along D-D' of FIG. 31, FIG. 32(e) is a cross-sectional view taken in the direction of arrows along E-E' of FIG. 31, and FIG. 32(f) is a cross-sectional view taken in the direction of arrows along F-F' of FIG. 31.

FIG. 34 is cross-sectional views showing the step of forming the hole into which the control electrode (gate) of the transistor is filled, in which FIG. 34(a) is a cross-sectional view taken in the direction of arrows along A-A' of FIG. 33, FIG. 34(b) is a cross-sectional view taken in the direction of arrows along B-B' of FIG. 33, FIG. 34(c) is a cross-sectional view taken in the direction of arrows along C-C' of FIG. 33, FIG. 34(d) is a cross-sectional view taken in the direction of arrows along D-D' of FIG. 33, FIG. 34(e) is a cross-sectional view taken in the direction of arrows along E-E' of FIG. 33, and FIG. 34(f) is a cross-sectional view taken in the direction of arrows along F-F' of FIG. 33.

FIG. 36 is cross-sectional views showing the step of forming the word line and the control electrode (gate) of the transistor, in which FIG. 36(a) is a cross-sectional view taken in the direction of arrows along A-A' of FIG. 35, FIG. 36(b) is a cross-sectional view taken in the direction of arrows along B-B' of FIG. 35, FIG. 36(c) is a cross-sectional view taken in the direction of arrows along C-C' of FIG. 35, FIG. 36(d) is a cross-sectional view taken in the direction of arrows along D-D' of FIG. 35, FIG. 36(e) is a cross-sectional view taken in the direction of arrows along E-E' of FIG. 35, and FIG. 36(f) is a cross-sectional view taken in the direction of arrows along F-F' of FIG. 35.

FIG. 38 is cross-sectional views showing the step of forming the trench into which the source line is filled and the hole into which the contact is filled, in which FIG. 38(a) is a cross-sectional view taken in the direction of arrows along A-A' of FIG. 37, FIG. 38(b) is a cross-sectional view taken in the direction of arrows along B-B' of FIG. 37, FIG. 38(c) is a cross-sectional view taken in the direction of arrows along C-C' of FIG. 37, FIG. 38(d) is a cross-sectional view taken in the direction of arrows along D-D' of FIG. 37, FIG. 38(e) is a cross-sectional view taken in the direction of arrows along E-E' of FIG. 37, and FIG. 38(f) is a cross-sectional view taken in the direction of arrows along F-F' of FIG. 37.

FIG. 40 is cross-sectional views showing the step of forming the source line and the contact, in which FIG. 40(a) is a cross-sectional view taken in the direction of arrows along A-A' of FIG. 39, FIG. 40(b) is a cross-sectional view taken in the direction of arrows along B-B' of FIG. 39, FIG. 40(c) is a cross-sectional view taken in the direction of arrows along C-C' of FIG. 39, FIG. 40(d) is a cross-sectional view taken in the direction of arrows along D-D' of FIG. 39, FIG. 40(e) is a cross-sectional view taken in the direction of arrows along E-E' of FIG. 39, and FIG. 40(f) is a cross-sectional view taken in the direction of arrows along F-F' of FIG. 39.

FIG. 42 is cross-sectional views showing the step of forming the bit line and the contact, in which FIG. 42(a) is a cross-sectional view taken in the direction of arrows along A-A' of FIG. 41, FIG. 42(b) is a cross-sectional view taken in the direction of arrows along B-B' of FIG. 41, FIG. 42(c) is a cross-sectional view taken in the direction of arrows along C-C' of FIG. 41, FIG. 42(d) is a cross-sectional view taken in the direction of arrows along D-D' of FIG. 41, FIG. 42(e) is a cross-sectional view taken in the direction of arrows along E-E' of FIG. 41, and FIG. 42(f) is a cross-sectional view taken in the direction of arrows along F-F' of FIG. 41.

DESCRIPTION OF EMBODIMENTS

Hereinafter, preferred embodiments of the present invention will be described with reference to the drawings.

(Embodiment 1)
[Device Configuration]

Figure 1:
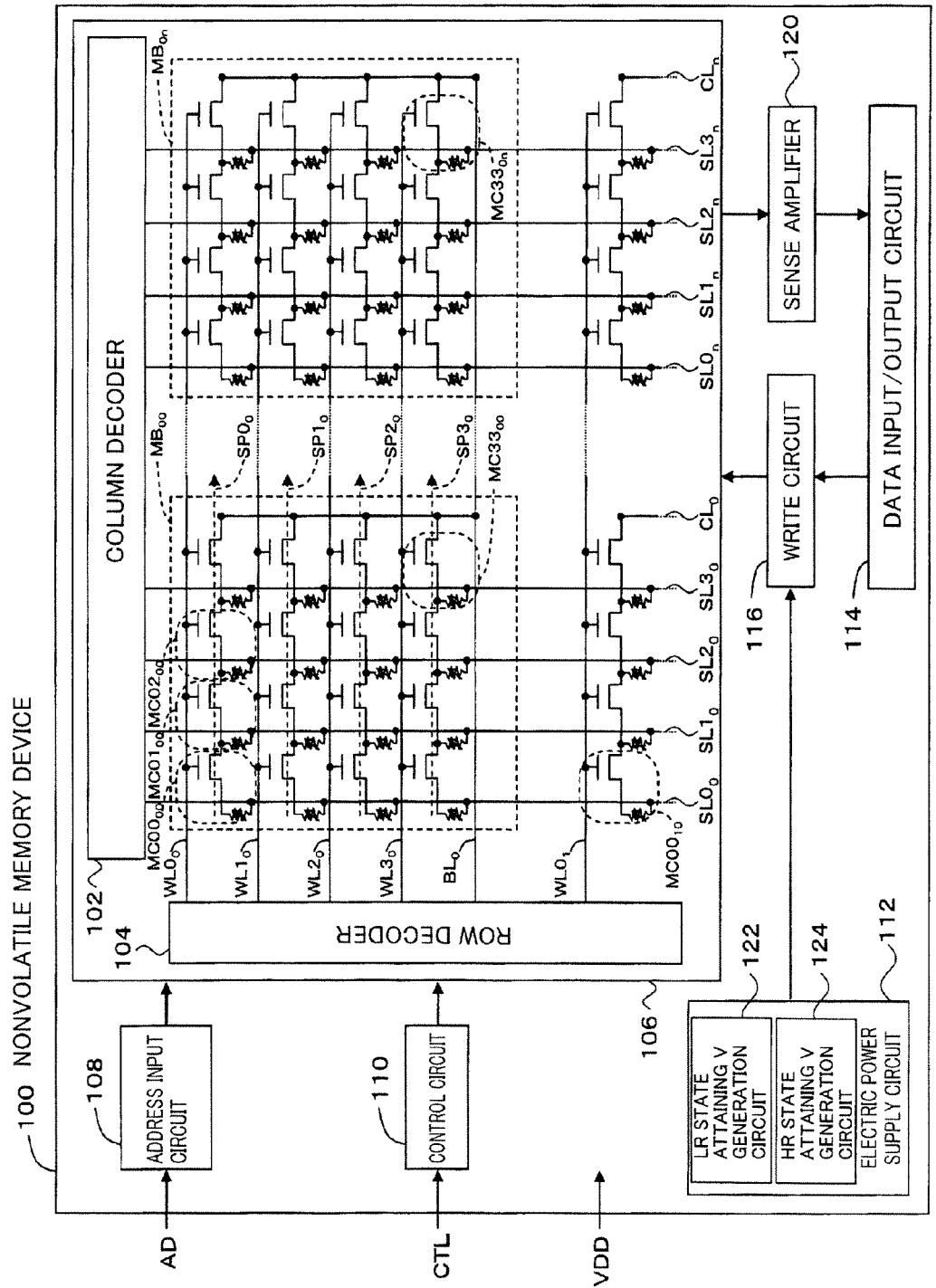
FIG. 1 is a block diagram showing an exemplary circuit configuration of a nonvolatile memory device 100 according to Embodiment 1 of the present invention.
Figure 2:
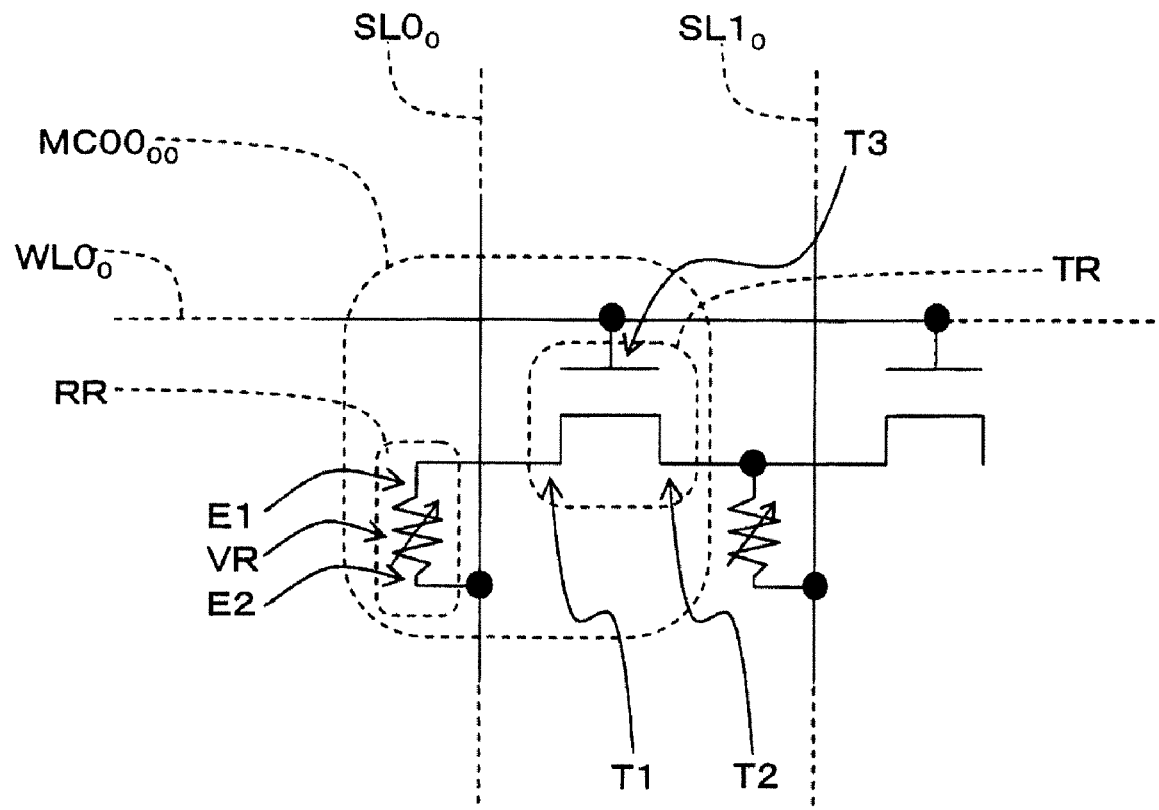
FIG. 2 is an enlarged view of a memory cell MC of FIG. 1, in which subscripts indicate a row and column of the associated memory block.

FIG. 1 is a block diagram showing an exemplary circuit configuration of a nonvolatile memory device 100 according to Embodiment 1 of the present invention. FIG. 2 is an enlarged view of a memory cell MC of FIG. 1, in which subscripts indicate a row and column of the associated memory block.

As shown in FIGS. 1 and 2, the nonvolatile memory device 100 includes a plurality of word lines $WL0_0$, $WL1_0$, $WL2_0$, $WL3_0$, $WL1_0$, $WL1_1$, . . . (first wires comprising, for example, tungsten: hereinafter simply referred to as "WL") extending in parallel with each other in a first direction within a first plane, a plurality of source lines $SL0_0$, $SL1_0$, $SL2_0$, $SL3_0$, $SL0_1$, $SL1_1$, . . . (second wires comprising, for example, copper: hereinafter simply referred to as "SL") extending in parallel with each other in a second direction within a second plane parallel to the first plane to three-dimensionally cross the first wires, and memory cells $MC00_{00}$, $MC01_{00}$, $MC02_{00}$, $MC03_{00}$, $MC10_{00}$, . . . $MC33_{00}$, . . . $MC32_{mn}$, $MC33_{mn}$ (hereinafter simply referred to as "MC") arranged to respectively correspond to three-dimensional cross-points of the word lines WL and the source lines SL.

Each of the memory cells MC includes one transistor TR (e.g., FET transistor) and one resistance variable element RR (e.g., ReRAM element). Each transistor TR includes a first main terminal T1 (source/drain), a second main terminal T2 (source/drain) and a control terminal T3 (gate). Each resistance variable element RR includes a first electrode E1 (lower electrode comprising, for example, platinum or platinum silicide), a second electrode E2 (upper electrode comprising, for example, tantalum nitride), and a resistance variable layer VR (comprising, for example, oxide of transition metal such as Ta, Ni, Ti, Hf, or Zr, preferably comprising tantalum oxide, and more preferably made of tantalum oxide) provided between the first electrode E1 and the second electrode E2.

A plurality of memory cells MC arranged along the first direction are configured such that the first main terminal T1 of one memory cell MC included in two adjacent memory cells MC and the second main terminal T2 of the other memory cell MC are connected to each other, thereby forming series paths $SP0_{00}$, $SP1_{00}$, $SP2_{00}$, $SP3_{00}$, $SP0_{01}$, . . . (hereinafter simply referred to as "SP") extending in the first direction and sequentially connecting the main terminals of the plurality of memory cells in series.

The control terminal T3 of each memory cell MC is connected to the word line WL associated with the memory cell MC.

The second electrode E2 of each memory cell MC is connected to the source line SL associated with the memory cell MC. The second electrode E2 may be a part of the source line SL associated with the memory cell MC.

The first electrode E1 of each memory cell MC is connected to the series path SP associated with the memory cell MC. The first electrode E1 may be a part of the series path SP associated with the memory cell MC.

In such a configuration, one resistance variable element is provided for one transistor. In other words, two adjacent resistance variable elements share one transistor at their first electrodes E1 and their second electrodes E2 are not connected to the transistor but to the wire. A current fed to a selected memory cell flows through the series path SP, but does not flow between the electrodes of an unselected memory cell. In such a configuration, it is possible to implement a nonvolatile memory device having a 1T1R memory cell array including memory cells of $4F^2$ while effectively suppressing a current flowing through an unselected memory cell.

The nonvolatile memory device 100 further includes a plurality of bit lines BL0, BL1, . . . (third wire comprising, for example, copper: hereinafter simply referred to as "BL") extending in parallel with each other in the first direction. The plurality of memory cells MC arranged along the first direction are configured such that a predetermined number of memory cells MC arranged successively constitute each of a plurality of memory blocks MB. For each memory block MB, the series paths SP are connected to the bit line BL via a contact wire CL (comprising, for example, platinum silicide: hereinafter simply referred to as "CL") extending in the second direction.

In such a configuration, a wire delay in the series path can be suppressed by using an electric conductor with a low resistivity as the bit line BL.

In this embodiment, each of the first main terminal T1 and the second terminal T2 includes a silicide layer which constitutes the first electrode E1. The silicide layer preferably comprises platinum silicide.

In such a configuration, since the silicide formed on the silicon substrate is used as the electrode of the resistance variable element, the size of the element can be further reduced. Especially, since platinum is suitable for use as an electrode material of the resistance variable element, the silicide layer preferably comprises platinum silicide.

The source lines SL are each connected to a column decoder 102. The word lines WL and the bit lines BL are each connected to a row decoder 104. The memory cells MC, the word lines WL, the source lines SL, the bit lines BL, the contact wires CL, the column decoder 102 and the row decoder 104 constitute one memory cell array 106, as a whole.

The memory cell array 106 includes memory blocks MB of m rows and n columns. Each memory block MB includes (4×4=16) memory cells MC. The memory cell array 106 entirely includes 16 mn memory cells MC. The number of word lines WL is 4 m, the number of source lines is 4 n, the number of bit lines is m, and the number of contact wires CL is n.

The memory cells MC belonging to a memory cell block $MB_{xy}$ on the same column (y column) are configured such that the memory cells MC belonging to the same column number (column number in 4×4 matrix) within the memory cell block $MB_{xy}$ are connected to one another via an identical source line SL. To be specific, for example, the memory cells ($MC00_{00}$, $MC10_{00}$, $MC20_{00}$, $MC30_{00}$, $MC00_{10}$, ... ) on the first line (first column) from the left, belonging to the memory cell block $MB_{xo}$ on the first column are connected to one another via an identical source line $SL0_0$, while the memory cells ($MC01_{00}$, $MC11_{00}$, $MC21_{00}$, $MC31_{00}$, $MC01_{10}$, ... ) on the second line (second column) from the left are connected to one another via an identical source line $SL1_0$.

The nonvolatile memory device 100 further includes an address input circuit 108 which receives address signals AD from outside and transfer them to the memory cell array 106, a control circuit 110 which receives a control signal CTL from outside and transfers it to the memory cell array 106, an electric power supply circuit 112 which outputs predetermined voltages (write voltages such as low-resistance state attaining voltage and high-resistance state attaining voltage, read voltage, etc), a data input/output circuit 114 which receives and outputs data from and to outside, a write circuit 116 which outputs voltages from the electric power supply circuit 112 to the memory cell array, based on the write data output from the data input/output circuit, and a sense amplifier 120. The sense amplifier 120 detects an amount of current flowing through a selected bit line, and determines that data is "1" when the detected current amount corresponds to a state where the memory cell is in a high-resistance state and data is "0" when the detected current amount corresponds to a state where the memory cell is in a low-resistance state.

The electric power supply circuit 112 includes a low-resistance state attaining voltage generating circuit 122 for generating a voltage applied to change the memory cell MC to the low-resistance state (change the resistance variable element RR included in the memory cell MC to the low-resistance state), and a high-resistance state attaining voltage generating circuit 124 for generating a voltage applied to change the memory cell MC to the high-resistance state (change the resistance variable element RR included in the memory cell MC to the high-resistance state).

[Schematic Configuration of Memory Block]

Figure 3:
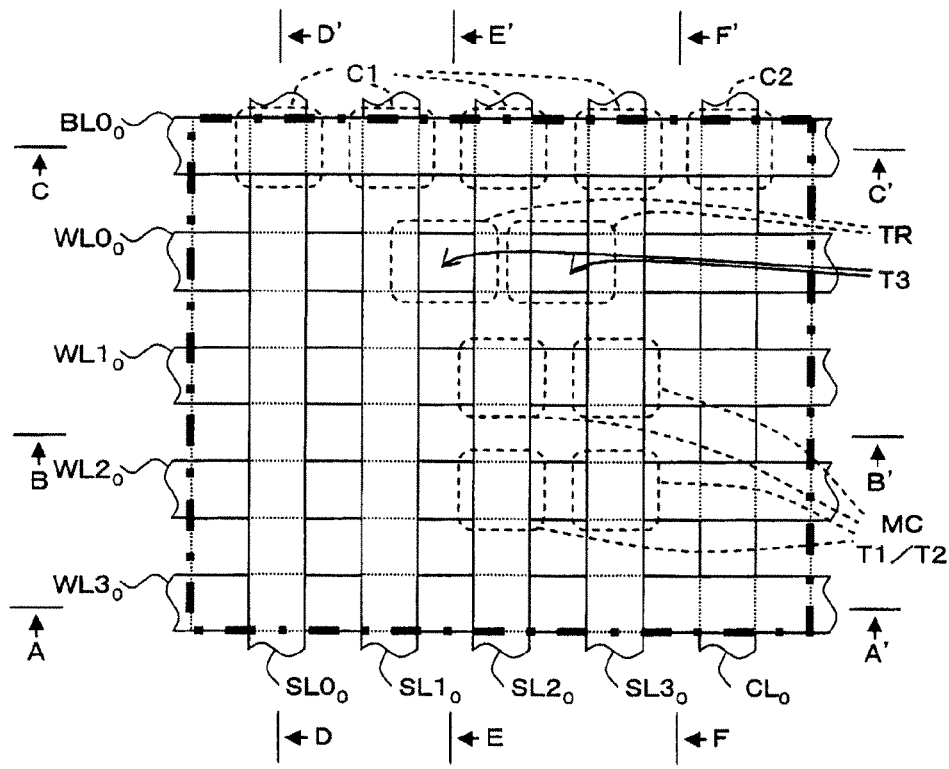
FIG. 3 is a view showing one memory block, in which FIG. 3(*a*) is a top plan view of the memory block and FIG. 3(*b*) is an equivalent circuit diagram of FIG. 3(*a*).
Figure 3:
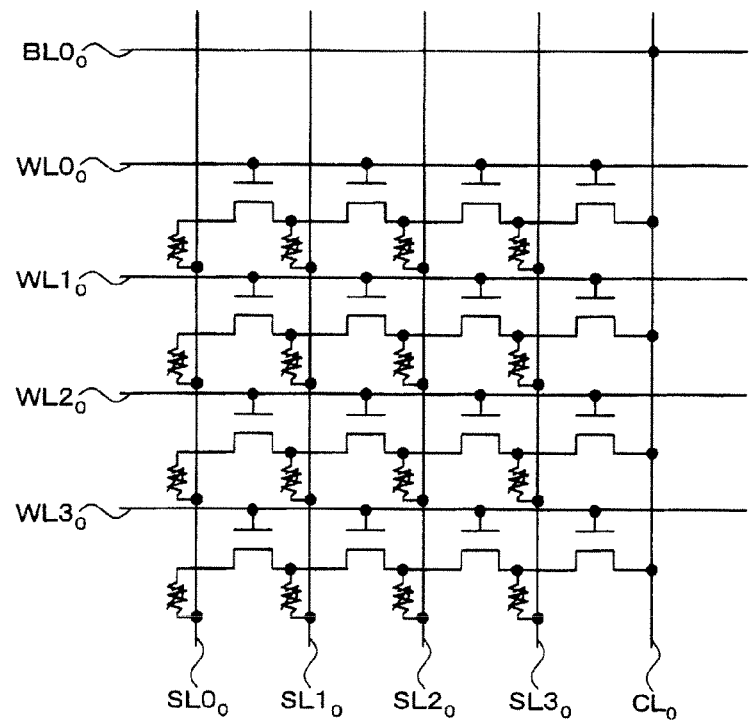

FIG. 3 is a view showing one memory block, in which FIG. 3(a) is a top plan view of the memory block and FIG. 3(b) is an equivalent circuit diagram of FIG. 3(a). FIG. 3(b) shows an enlarged view of the memory block MB extracted from FIG. 1.

As shown in FIG. 3(a), the word lines WL (first wires) extend in parallel with each other in the first direction (rightward and leftward direction in FIG. 3(a)) within the first plane, the source lines SL (second wires) extend in parallel with each other in the second direction (upward and downward direction in FIG. 3(a)) within a second plane parallel to the first plane and three-dimensionally cross the word lines WL, the bit lines BL (third wires) extend in parallel with each other in the first direction (rightward and leftward direction in FIG. 3(a)) within a third plane parallel to the second plane, and the contact wires CL (fourth wires) extend in parallel with each other in the second direction (upward and downward direction in FIG. 3(a)) within a fourth plane parallel to the third plane.

The memory cell MC, the first main terminal T1 of the transistor TR and the second main terminal T2 of the transistor TR are provided at the three-dimensional cross-point of the word line WL and the source line SL. The control terminal T3 of the transistor TR is provided at a portion of the word line WL which does not overlap with the source line SL.

A contact C1 (connecting portion of the source line SL and the second electrode E2) is provided below the three-dimensional cross-point of the bit line BL and the source line SL. As described later, in this embodiment, the second electrode E2 extends in the second direction and serves as upper electrodes of a plurality of resistance variable elements RR. Although it looks like that the second electrode E2 is connected to the source line SL for each memory cell in the equivalent circuit diagram (FIG. 3b), the second electrode E2 is actually connected to the source line SL for each memory cell block. Nonetheless, the circuit is actually equivalent to that shown in FIG. 3(b).

A contact C2 (connecting portion of the bit line BL and the contact wire CL) is provided at three-dimensional cross-point of the bit line BL and the contact wire CL.

[Configuration of Cross-Section of Memory Block]

FIG. 4 is a cross-sectional view of the memory block indicated by one-dotted line of FIG. 3, in which FIG. 4(a) is a cross-sectional view taken along line A-A' of FIG. 3, FIG. 4(b) is a cross-sectional view taken along line B-B' of FIG. 3, FIG. 4(c) is a cross-sectional view taken along C-C' of FIG. 3, FIG. 4(d) is a cross-sectional view taken along line D-D' of FIG. 3, FIG. 4(e) is a cross-sectional view taken along line E-E' of FIG. 3, and FIG. 4(f) is a cross-sectional view taken along line F-F' of FIG. 3. Hereinafter, in FIG. 4, the direction in which the source line SL extends is expressed as a forward and rearward direction, a thickness direction of the substrate is expressed as an upward and downward direction, and the direction in which the word line WL extends is expressed as a rightward and leftward direction. The portions indicated by the same mesh patterns in FIG. 4 mean that they comprise substantially the same material in principle, but even the portions indicated by the same mesh patterns in FIG. 4 means that they have different compositions or contents in a strict sense, in some cases.

As shown in FIG. 4, in the memory block MB, a plurality of silicon dioxide layers 132 are formed on the P-type silicon substrate layer 130 to extend in the rightward and leftward direction at predetermined intervals. It should be noted that the left end of the silicon dioxide layer 132 extends continuously in the forward and leftward direction. The portion of the silicon dioxide layer 132, extending in the rightward and leftward direction constitutes STI [Shallow Trench Insulator] region. The size of the STI region is, for example, 0.18 μm in width and 300 nm in depth.

A plurality of trenches (hereinafter referred to as "memory trenches": the number of the memory trenches is five in FIG. 4) are formed to penetrate the upper half portions of the silicon dioxide layers 132 and extend in the forward and rearward direction. The size of the memory trench is for example, 0.18 µm in width and 550 nm in depth (STI plus height of dummy gate). $Si_3N_4$ portions 138 (side walls) are formed on right and left side walls of the memory trench. A tantalum oxide layer 140 (resistance variable layer) and a tantalum nitride layer 142 (upper electrode layer) are formed in this order to cover the surfaces of the $Si_3N_4$ portions 138 and the bottom surface of the memory trench. The thickness of the bottom portion of the tantalum oxide layer 140 is, for example, 30 nm. A tungsten layer 144 (embedded electric conductor layer) is formed to fill the trench formed inside the tantalum nitride layer 142. The $Si_3N_4$ portions 138, the tantalum oxide layer 140, the tantalum nitride layer 142 and the tungsten layer 144 are entirely filled into the memory trench, their upper end surfaces define a recess, and a silicon dioxide layer 148 is filled into the recess. It should be noted that a titanium/titanium nitride layer 149 (adhesive layer) is filled into a recess in a portion (cross-section taken along C-C') where a copper layer 154 (source line SL) is connected to the tantalum nitride layer 142. The embedded electric conductor layer may comprise copper or aluminum.

A tungsten layer 152 forming the word line WL and a titanium/titanium nitride layer 150 (adhesive layer) extend in the rightward and leftward direction above the region where the STI region is not present. The size of the tungsten layer 152 is, for example, 0.18 µm in width and 300 nm in depth. In a region where the memory trench is not present, the tungsten layer 152 and the titanium/titanium nitride layer 150 extend downward and are connected to the P-type silicon substrate layer 130 via the silicon dioxide layer 158. The thickness of the silicon dioxide layer 158 is, for example, 10 nm. A region where the tungsten layer 152 is connected to the P-type silicon substrate layer 130 via the silicon dioxide layer 158 serves as the control terminal T3 (gate) of the transistor TR. The size of the control terminal T3 is for example, 0.18 µm×0.18 µm.

A P-implanted region 134 (source/drain region) is formed in a region where the P-type silicon substrate layer 130 is connected to the memory trench. A platinum silicide layer 136 is formed over the P-implanted region 134. The P-implanted region 134 and the platinum silicide layer 136 are formed inside the P-type silicon substrate layer 130. The P-implanted region 134 may be replaced by an As-implanted region (phosphorous atoms [P] may be replaced by arsenic atoms [As]).

The rightmost memory trench (hereinafter referred to as contact wire trench), among five memory trenches, is not provided with the silicon dioxide layer 132 even in the STI region and is connected to the P-type silicon substrate layer 130. The P-implanted region 134 and the platinum silicide layer 136 are formed continuously (to extend in the forward and rearward direction) on the bottom surface of the contact wire trench. The platinum silicide layer 136 connected to the contact wire trench constitutes the contact wire CL.

The platinum silicide layer 136 connected to the memory trench other than the contact wire trench constitutes the lower electrode layer (first electrode E1). A portion of the tantalum nitride layer 142 which corresponds to the lower electrode layer serves as the second electrode E2. A portion of the tantalum oxide layer 140 which is sandwiched between the lower electrode layer and the upper electrode layer serves as the resistance variable layer VR. In the cross-section taken along A-A', the P-implanted region 134 and the platinum silicide layer 136 serve as the first main terminal T1 (source/drain) of the transistor TR and the second main terminal T2 (source/drain) of the transistor TR.

In the cross-section taken along A-A', a region (gate) where the tungsten layer 152 is connected to the P-type silicon substrate layer 130 via the silicon dioxide layer 158 and a region (source/drain) comprising the P-implanted region 134 and the platinum silicide layer 136 are arranged continuously alternately in the rightward and leftward direction, thereby forming one series path SP. The platinum silicide layer 136 constitutes a part of the series path SP as well as the lower electrode of the resistance variable element RR. The P-implanted region 134 which is a constituent of the first main terminal T1 and the second main terminal T2 of the transistor TR also constitutes a part of the series path SP.

A plurality of copper layers 154 constituting the source lines SL are formed above the tungsten layers 152 to interpose the silicon dioxide layer 156 (interlayer insulating layer) between them such that the copper layers 154 extend in the forward and rearward direction. In the cross-section taken along C-C', the copper layer 154 is connected to the titanium/titanium nitride layer 149 (adhesive layer). The connecting portion of the copper layer 154 constitutes a contact 153 (contact C1 in FIG. 3). A titanium/titanium nitride layer may be formed as an adhesive layer at a boundary region between the copper layer 154 and the silicon dioxide layer 156, although not shown.

In the cross-section taken along C-C', a copper layer 162 constituting the bit line BL is formed above the copper layer 154 to interpose the silicon dioxide layer 156 (interlayer insulating layer) between them such that the copper layer 162 extends in the rightward and leftward direction. In the cross-section taken along F-F,' the copper layer 162 is connected to the platinum silicide layer 136, and the connecting portion of the copper layer 162 constitutes a contact 161 (contact C2 in FIG. 3). In other words, in this region, the tantalum oxide layer 140, the tantalum nitride layer 142 and the tungsten layer 144 are removed and the bit line BL and the platinum silicide layer 136 (contact wire CL) are short-circuited via the contact 161. A titanium/titanium nitride layer may be formed as an adhesive layer at a boundary region between the copper layer 162 and the silicon dioxide layer 156, although not shown.

In the cross-section taken along C-C', a polysilicon layer 160 which derives from a manufacturing step is formed at a lower half portion of the region between the memory trenches. The thickness of the polysilicon layer 160 is, for example, 250 nm. A $Si_3N_4$ layer 146 which derives from a manufacturing step is formed on the polysilicon layer 160 and the silicon dioxide layer 132. The thickness of the $Si_3N_4$ layer 146 is, for example, 50 nm.

[Characteristic of Resistance Variable Element]

Figure 5:
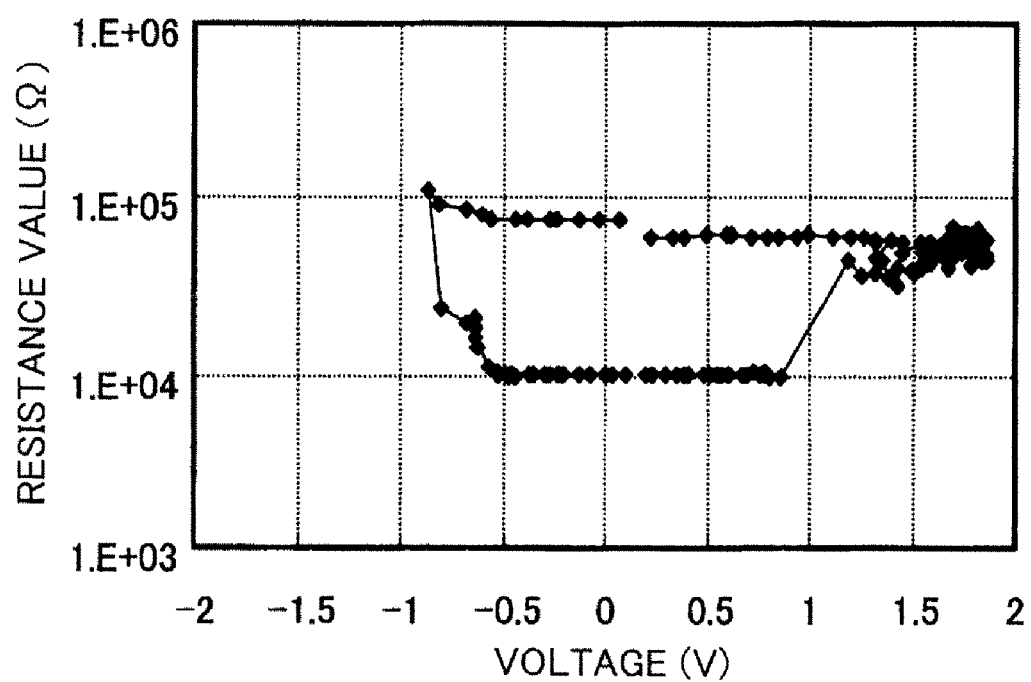
FIG. 5 is a view showing an exemplary characteristic (relationship between voltages and resistance values) of a resistance variable element included in a nonvolatile memory device according to Embodiment 1 of the present invention.

FIG. 5 is a view showing an exemplary characteristic (relationship between voltages and resistance values) of a resistance variable element included in the nonvolatile memory device according to Embodiment 1 of the present invention.

As a resistance variable element exhibiting the characteristic of FIG. 5, a resistance variable element was manufactured to include a lower electrode comprising platinum (50 nm thickness), a resistance variable layer comprising tantalum oxide (0<x<2.5 when tantalum oxide is expressed as $TaO_x$), and an upper electrode comprising tantalum nitride (100 nm thickness) and having an electrode area of 0.5 µm×0.5 µm. The tantalum oxide was deposited by sputtering (300 degrees C.).

Electric pulses of a pulse width 100 nsec were applied to the manufactured resistance variable element while changing the voltage gradually. After every application of the electric pulse, a voltage of 50 mV was applied to the resistance variable element and a current was measured, thus obtaining resistance values of the resistance variable element. Plots in FIG. 5 indicate the voltages (voltages generated between the upper electrode and the lower electrode) actually applied to the resistance variable element. The polarity of the voltages is indicated by an electric potential of the lower electrode on the basis of the upper electrode. To be specific, the polarity was regarded as plus when the electric potential of the lower electrode was higher than the electric potential of the upper electrode.

As shown in FIG. 5, when the applied voltages were below −0.8V, the resistance variable element was changed from a high-resistance state (about $10^5\Omega$) to a low-resistance state (about $10^4\Omega$). On the other hand, when the applied voltages were above +0.8V, the resistance variable element was changed from the low-resistance state to the high-resistance state.

[Operation]

The outline of the operation of the nonvolatile memory device 100 configured as described above will be described.

Figure 6:
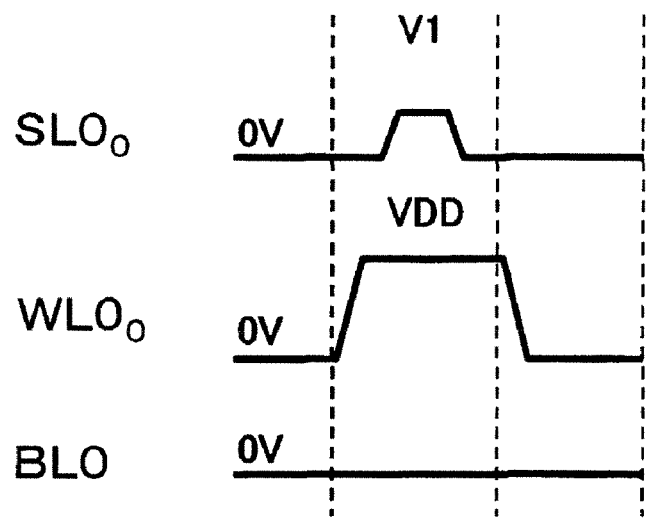
Figure 6:
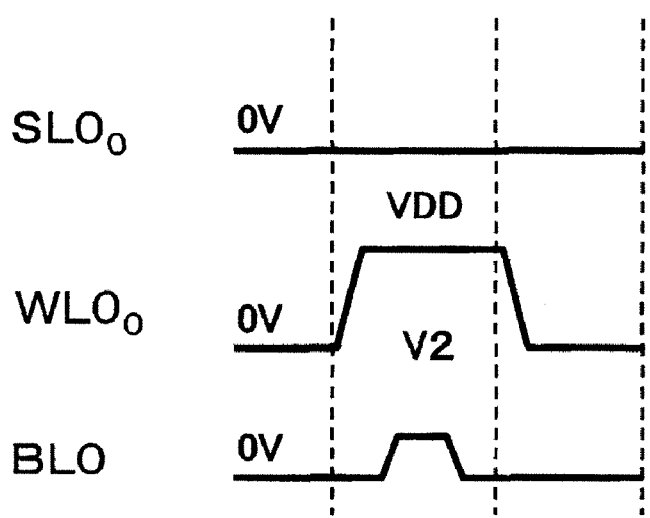
Figure 6:
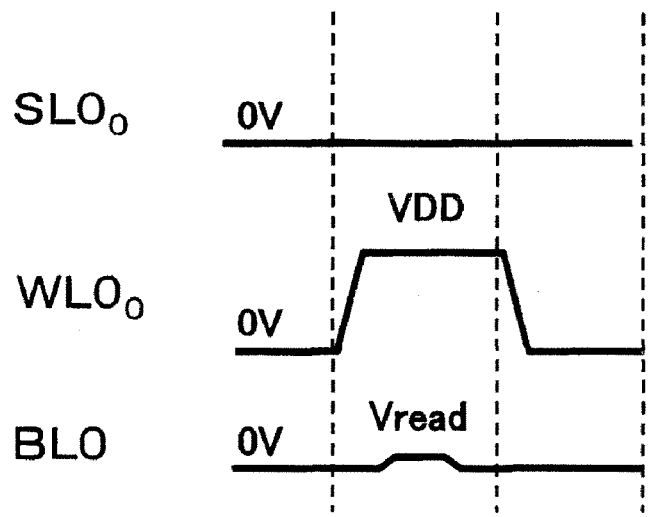

FIG. 6 is a timing chart showing an exemplary operation of the nonvolatile memory device according to Embodiment 1 of the present invention, in which FIG. 6(*a*) shows an operation in which "0" is written (resistance variable element RR is changed to a low-resistance state) to a memory cell $MC00_{00}$, FIG. 6(*b*) shows an operation in which "1" is written (resistance variable element RR is changed to a high-resistance state) to the memory cell $MC00_{00}$, and FIG. 6(*c*) shows an operation in which data is read from the memory cell $MC00_{00}$. In this embodiment, an event that the resistance variable element RR is in a low-resistance state (LR) is allocated to data "0," while an event that the resistance variable element RR is in a high-resistance state (HR) is allocated to data "1."

In FIG. 6(*a*), V1 indicates a voltage output from the low-resistance state attaining voltage generating circuit 122. In the case of element having the characteristic of FIG. 5, for example, V1 may be +1.5V (positive voltage larger in absolute value than −0.8V which is a threshold which enables the low-resistance state to be attained in the characteristic of FIG. 5).

In FIG. 6(*b*), V2 indicates a voltage output from the high-resistance state attaining voltage generating circuit 124. In the case of element having the characteristic of FIG. 5, for example, V2 may be +1.5V (positive voltage larger in absolute value than +1.2V which is a threshold which enables the high-resistance state to be attained in the characteristic of FIG. 5).

In FIG. 6(*c*), Vread is a read voltage generated in the sense amplifier 120. In the case of element having the characteristic of FIG. 5, for example, Vread may be +0.5V (positive voltage smaller in absolute value than +0.8V which is a low-resistance state disturb boundary voltage [upper limit voltage at which the resistance value of the resistance variable element in the low-resistance state does not change] in FIG. 5).

VDD in FIG. 6 corresponds to an electric power supply voltage supplied to the nonvolatile memory element 100 from outside, and is, for example, +4.5V.

When data "0" is written to the resistance variable element RR (resistance variable element RR is changed to the low-resistance state), as shown in FIG. 6(*a*), initially, the voltage of a selected bit line BL0 and a voltage of a selected source line $SL0_0$ are set to 0V (GND). Other bit lines BL and other source lines SL are placed in a high-impedance state. Then, a voltage of a selected word line $WL0_0$ is set to VDD. Then, the voltage of the selected source line $SL0_0$ is set to V1 for a specified time and then is returned to 0V. That is, a rectangular voltage pulse (electric pulse) is applied to the selected source line $SL0_0$. Thus, a voltage of −V1 (−1.5V) is applied to the first electrode E1 (lower electrode) on the basis of the second electrode E2 (upper electrode) between the electrodes of the resistance variable element RR included in the memory cell $MC00_{00}$. As a result, the resistance variable element RR changes from the high-resistance state to the low-resistance state. Thereafter, the voltage of the selected word line $WL0_0$ is set to 0V and a write operation of data "0" is completed.

When data "1" is written to the resistance variable element RR (resistance variable element RR is changed to the high-resistance state), as shown in FIG. 6(*b*), initially, the voltage of a selected bit line BL0 and the voltage of a selected source line $SL0_0$ are set to 0V (GND). Other bit lines BL and other source lines SL are placed in a high-impedance state. Then, the voltage of a selected word line $WL0_0$ is set to VDD. Then, the voltage of the selected bit line BL0 is set to V2 for a specified time and then is returned to 0V. That is, a rectangular voltage pulse (electric pulse) is applied to the selected bit line BL0. Thus, a voltage of +V2 (+1.5V) is applied to the first electrode E1 (lower electrode) on the basis of the second electrode E2 (upper electrode) between the electrodes of the resistance variable element RR included in the memory cell $MC00_{00}$. As a result, the resistance variable element RR changes from the low-resistance state to the high-resistance state. Thereafter, the voltage of the selected word line $WL0_0$ is set to 0V and a write operation of data "1" is completed.

The address input circuit 108 receives address signals from an external circuit (not shown) and outputs row address signals to the column decoder 102 and column address signals to the row decoder 104 based on the address signals. The address signals are signals indicating address of a specified memory cell selected from among a plurality of memory cells.

In a write cycle of data, the control circuit 110 outputs to the write circuit 116, a write signal for causing application of a write voltage, according to the input data Din input to the data input/output circuit 114.

The column decoder 102 receives row address signals output from the address input circuit 108, and the row decoder 104 applies a predetermined voltage to a word line selected from among a plurality of word lines, based on the row address signals. In the same manner, the column decoder 102 receives row address signals output from the address input circuit 108, and applies a predetermined voltage to a source line selected from among a plurality of source lines, based on the row address signals.

The row decoder 104 receives column address signals output from the address input circuit 108, selects one from among the plurality of bit lines, based on the column address signals and applies a write voltage or a read voltage to the selected bit line.

Receiving the write signal output from the control circuit 110, the write circuit 116 outputs to the row decoder 104 a signal for causing application of a write voltage to the selected bit line. The write electric power supply 112 includes a low-resistance state attaining LR electric power supply 122 and a high-resistance state attaining HR electric power supply 124. The outputs of the low-resistance state attaining LR electric power supply 122 and the high-resistance state attaining HR electric power supply 124 are each input to the row decoder 104 and the write circuit 116.

When data is read from the resistance variable element RR, as shown in FIG. 6(*c*), initially, the voltage of a selected bit line BL0 and the voltage of a selected source line $SL0_0$ are set to 0V (GND). Other bit lines BL and other source lines SL are placed in a high-impedance state. Then, the voltage of a selected word line $WL0_0$ is set to VDD. Then, the voltage of the selected bit line BL0 is set to Vread for a specified time and then is returned to 0V. This is accomplished by feeding a voltage from a clamping circuit 118 to the selected bit line BL0. The sense amplifier 120 detects a value of a current flowing through the selected memory cell MC00$_{00}$ to determine whether the resistance variable element RR is in the low-resistance state (data is "0") or in the high-resistance state ("data" is 1). Thereafter, the voltage of the selected word line WL0$_0$ is set to 0V, thus completing a read operation of the data.

[Manufacturing Method]

Figure 7:
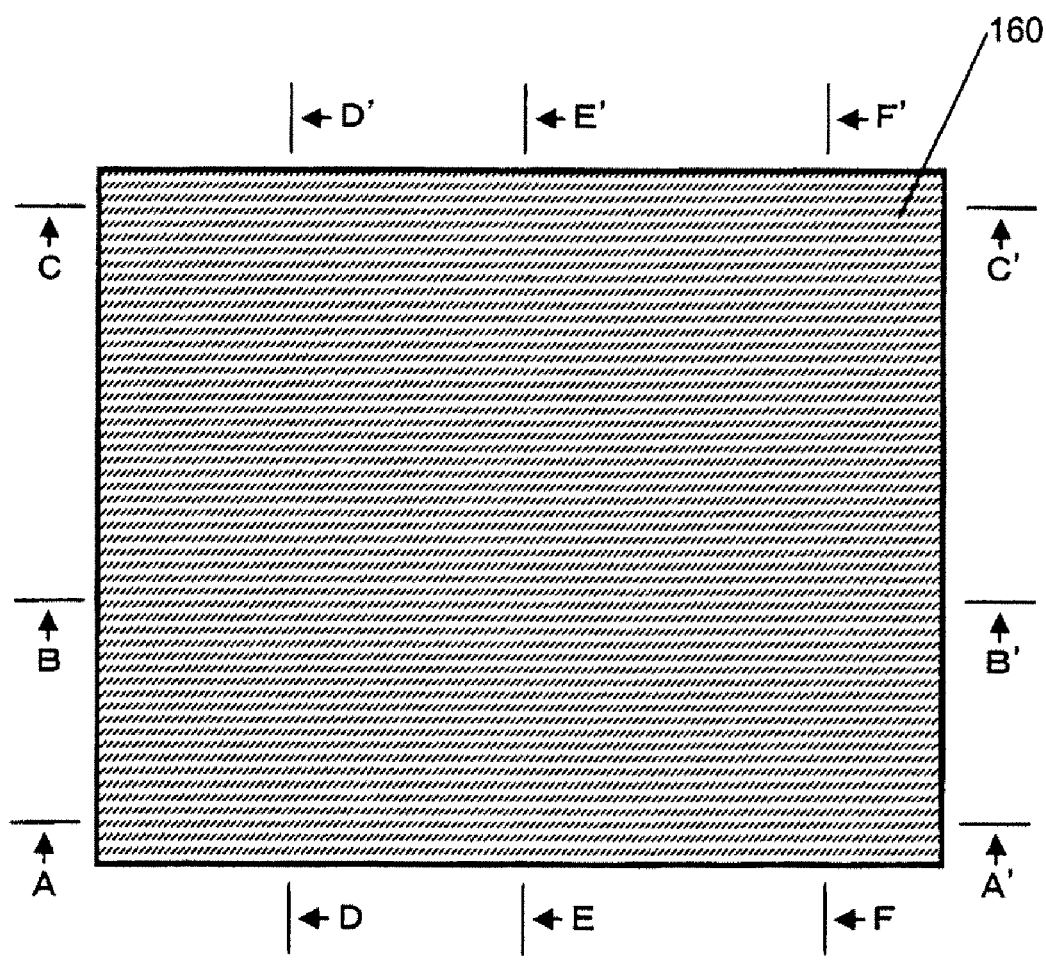
FIG. 7 is a top plan view showing the step of forming a polysilicon layer on a P-type silicon substrate.
Figure 8:
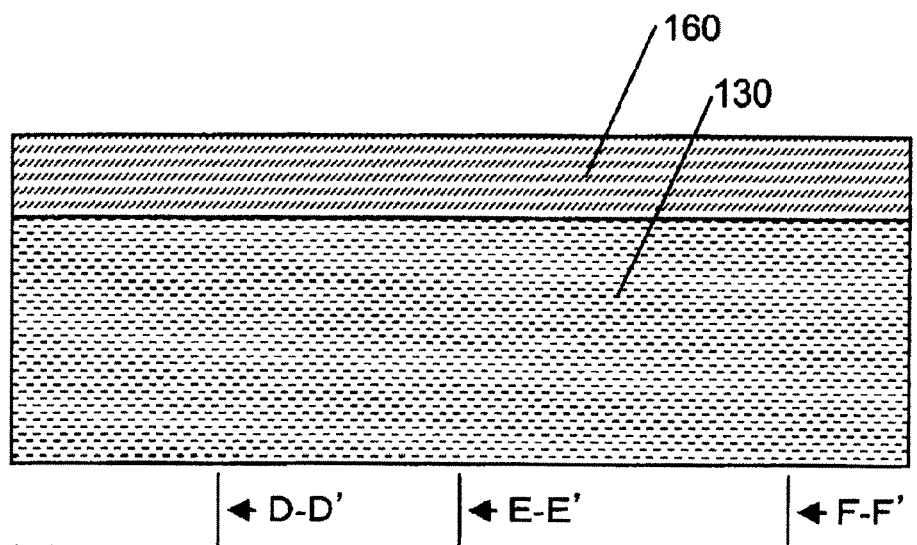
Figure 8:
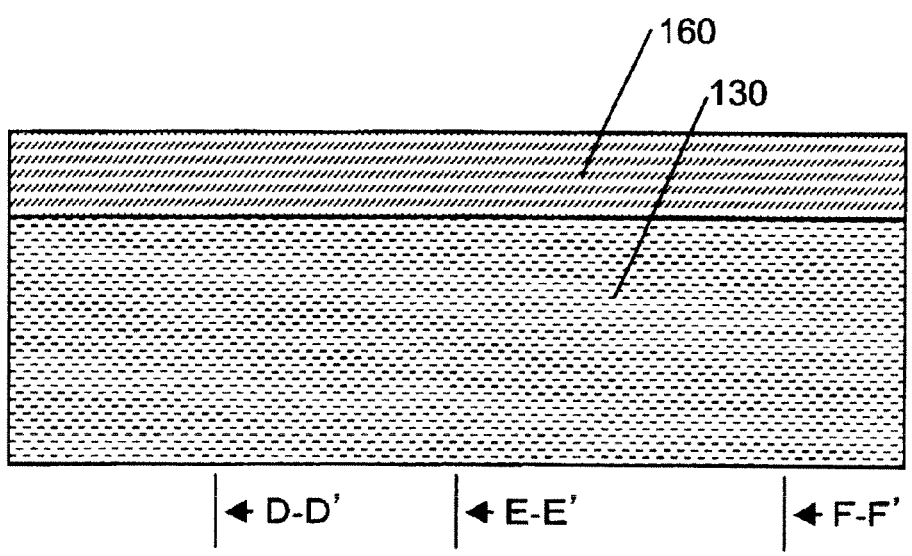
Figure 8:
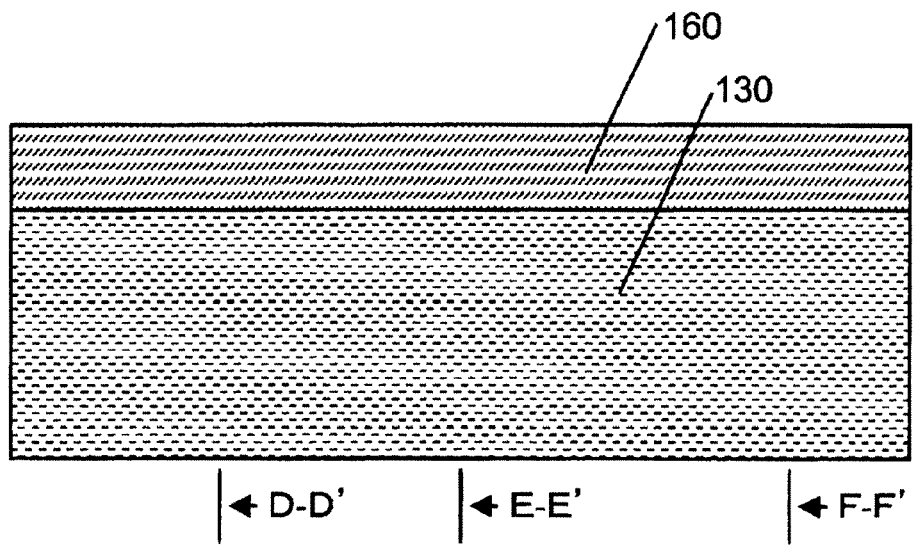
Figure 8:
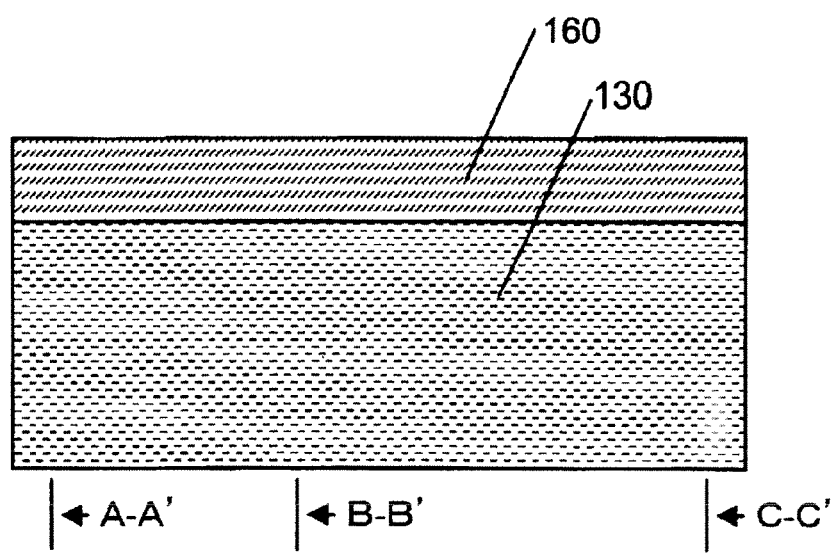
Figure 8:
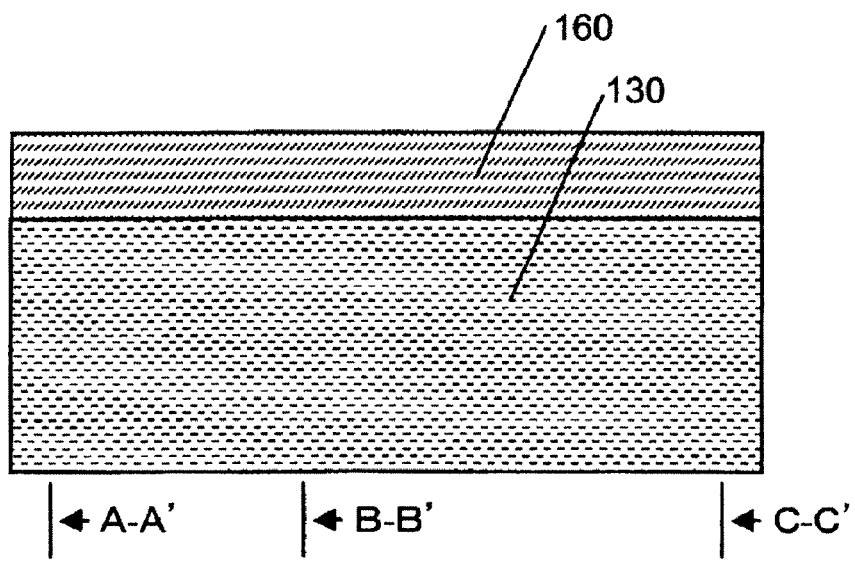
Figure 8:
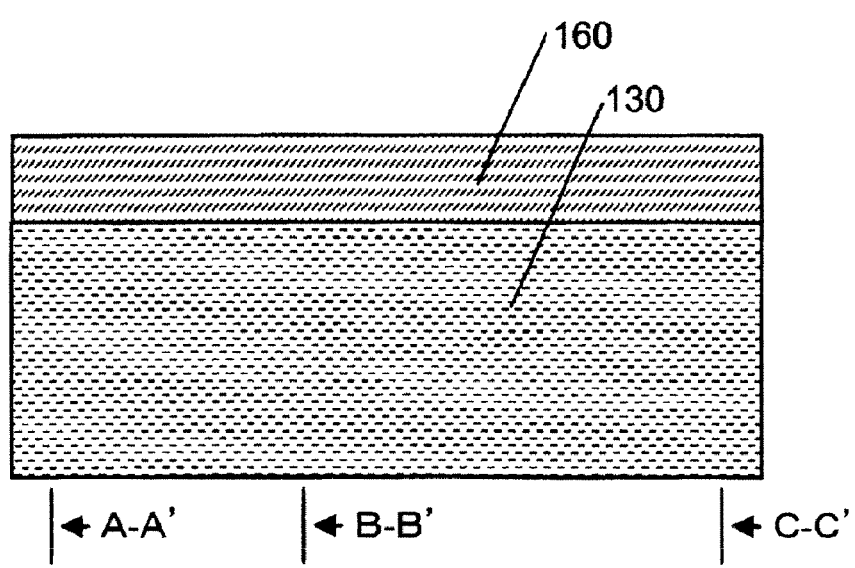

FIGS. 7 to 42 are views showing the steps of manufacturing the nonvolatile memory device according to Embodiment 1 of the present invention. Steps other than those shown in FIGS. 7 to 42 are necessary to manufacture the nonvolatile memory device 100, but well-known steps may be used as these steps and will not be described FIGS. 7 and 8 are a top plan view and cross-sectional views, respectively, showing the step of forming the polysilicon layer on the P-type silicon substrate. FIG. 8(a) is a cross-sectional view taken in the direction of arrows along A-A' of FIG. 7, FIG. 8(b) is a cross-sectional view taken in the direction of arrows along B-B' of FIG. 7, FIG. 8(c) is a cross-sectional view taken in the direction of arrows along C-C' of FIG. 7, FIG. 8(d) is a cross-sectional view taken in the direction of arrows along D-D' of FIG. 7, FIG. 8(e) is a cross-sectional view taken in the direction of arrows along E-E' of FIG. 7, and FIG. 8(f) is a cross-sectional view taken in the direction of arrows along F-F' of FIG. 7.

In a step (step S1) of forming the polysilicon layer over the P-type silicon substrate, polysilicon is deposited over the P-type silicon substrate comprising the P-type silicon layer 130 by, for example, CVD, thereby forming the polysilicon layer 160. The height of a dummy gate is desirably implemented by a layer thickness optimized for a process, in view of a dry etching property, etc.

Figure 9:
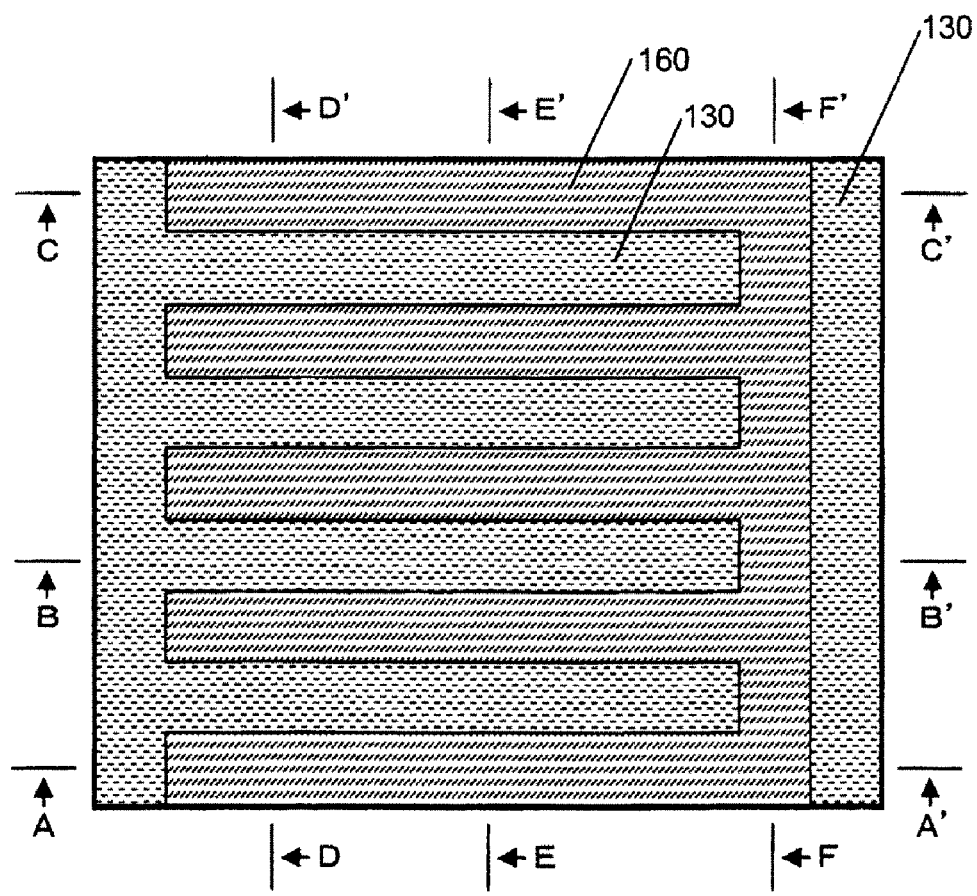
FIG. 9 is a top plan view showing the step of etching the P-type silicon substrate and the polysilicon layer to form a trench into which STI is filled.
Figure 10:
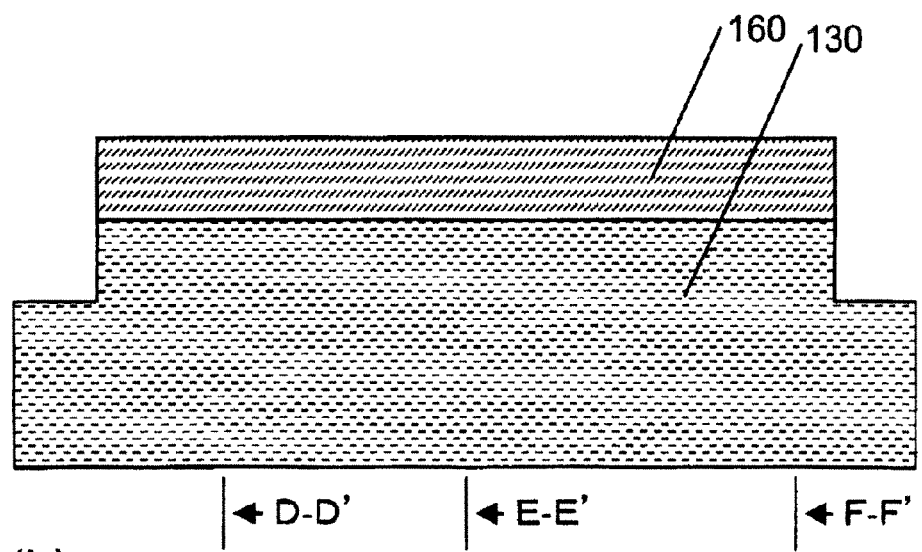
Figure 10:
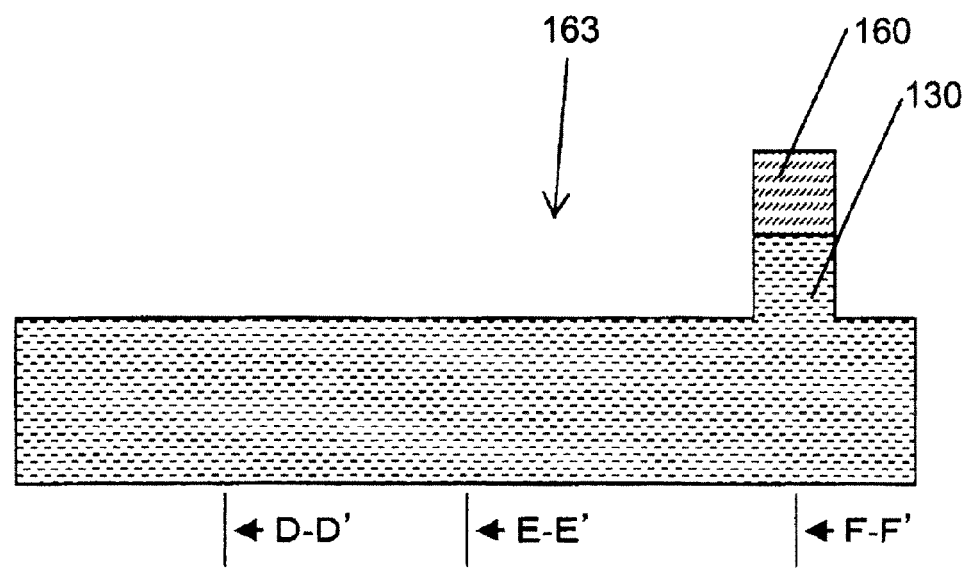
Figure 10:
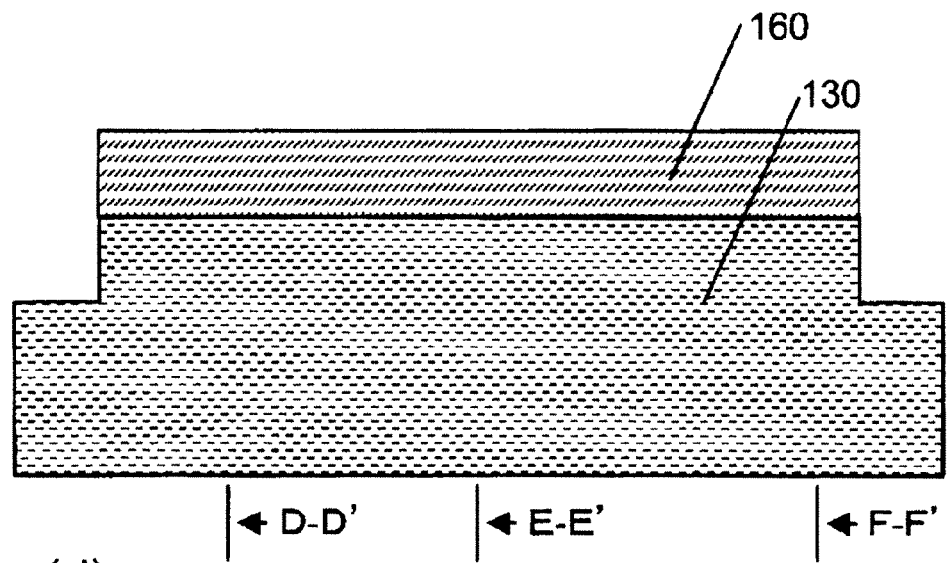
Figure 10:
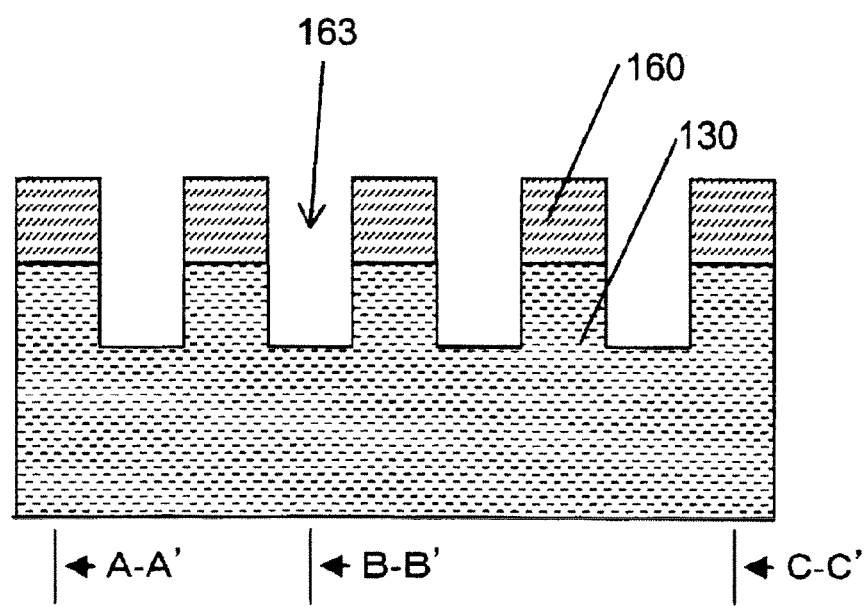
Figure 10:
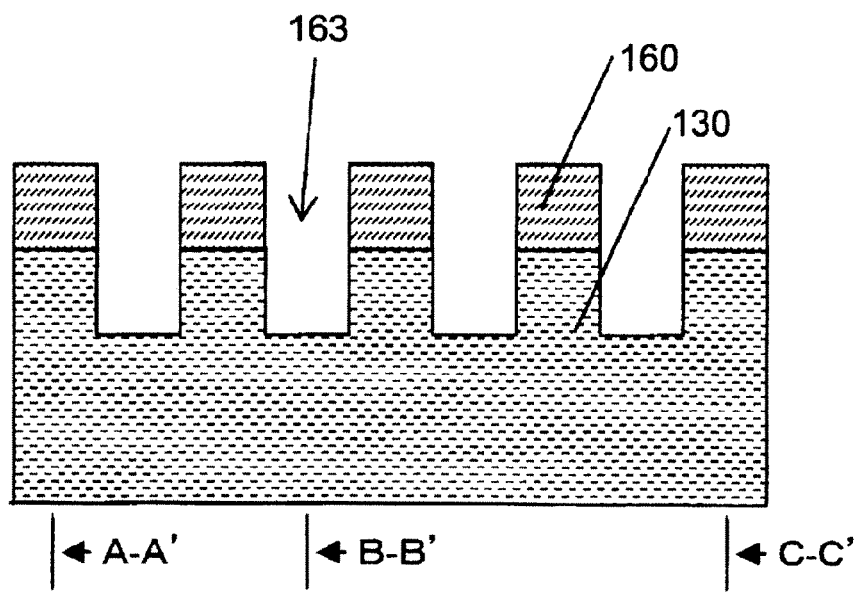
Figure 10:
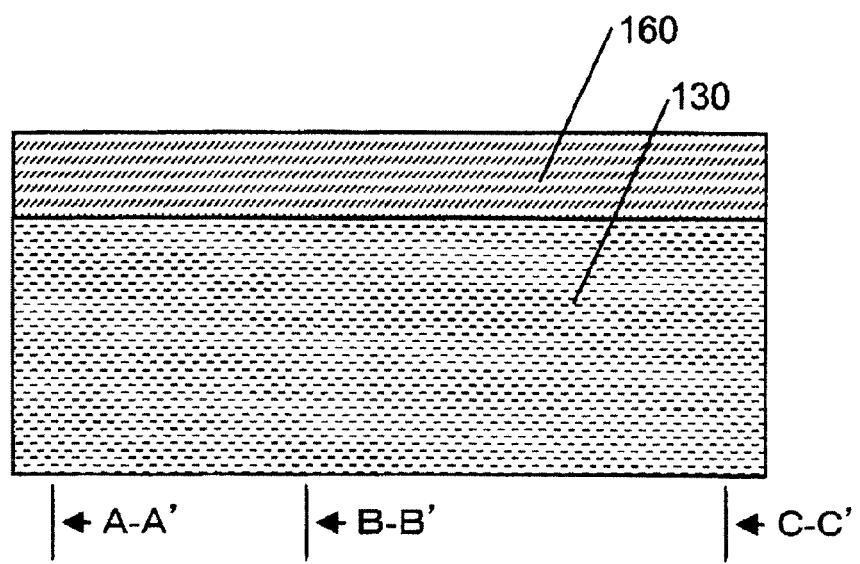

FIGS. 9 and 10 are a top plan view and cross-sectional views, respectively, showing the step of etching the P-type silicon substrate and the polysilicon layer to form STI. FIG. 10(a) is a cross-sectional view taken in the direction of arrows along A-A' of FIG. 9, FIG. 10(b) is a cross-sectional view taken in the direction of arrows along B-B' of FIG. 9, FIG. 10(c) is a cross-sectional view taken in the direction of arrows along C-C' of FIG. 9, FIG. 10(d) is a cross-sectional view taken in the direction of arrows along D-D' of FIG. 9, FIG. 10(e) is a cross-sectional view taken in the direction of arrows along E-E' of FIG. 9, and FIG. 10(f) is a cross-sectional view taken in the direction of arrows along F-F' of FIG. 9.

In a step (step S2) of etching the P-type silicon substrate and the polysilicon layer to form the trench 163 into which the STI is filled, a desired trench is formed by a patterning step using a mask.

Figure 11:
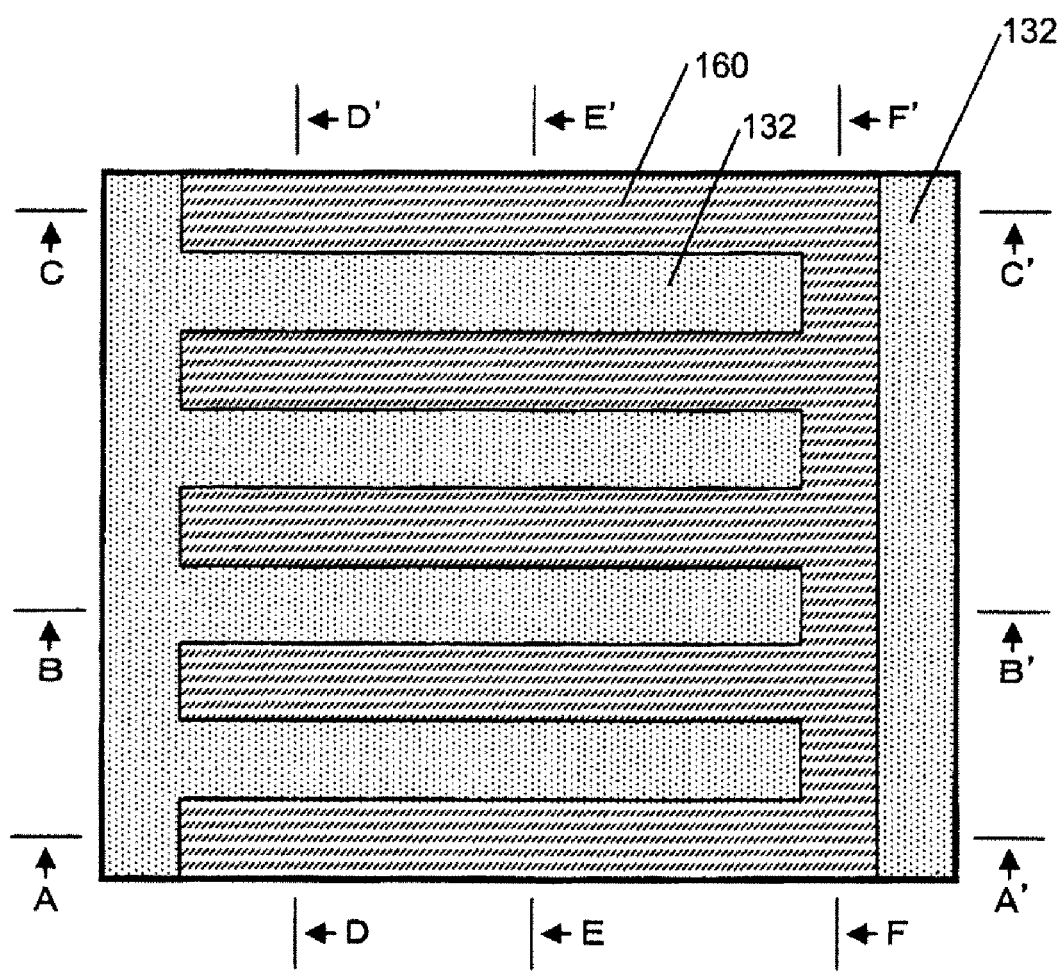
FIG. 11 is a top plan view showing the step of filling silicon dioxide into the trench to form the STI.
Figure 12:
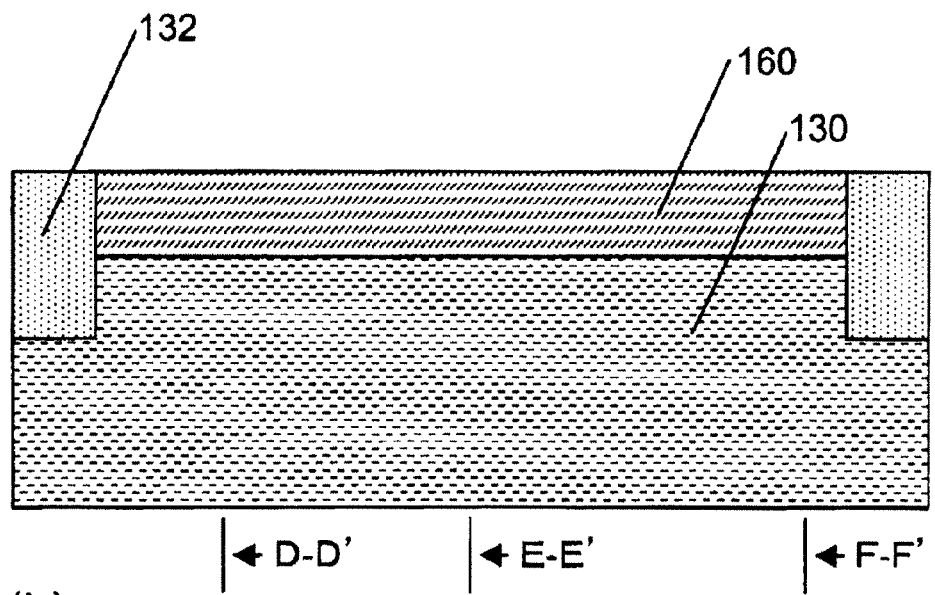
Figure 12:
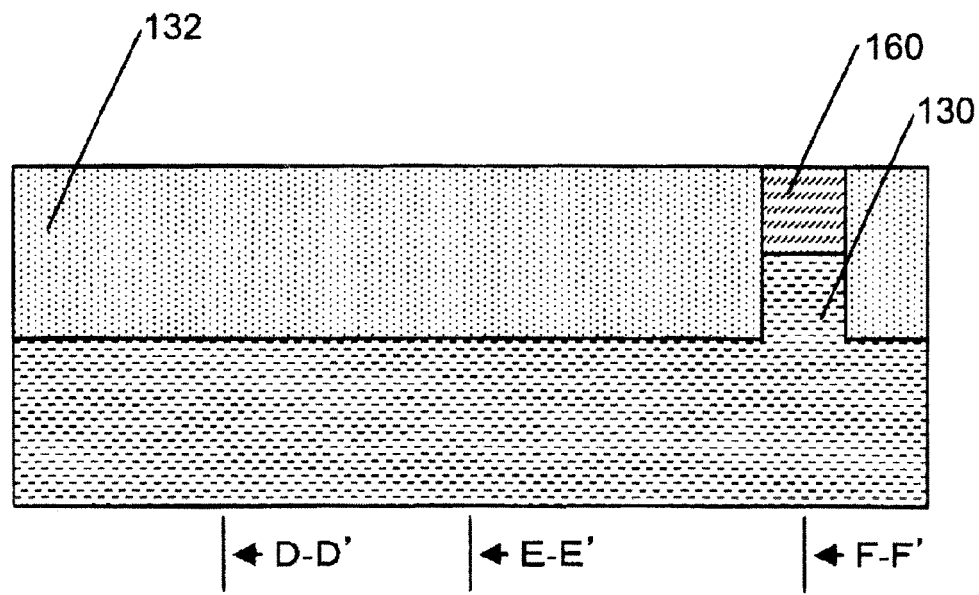
Figure 12:
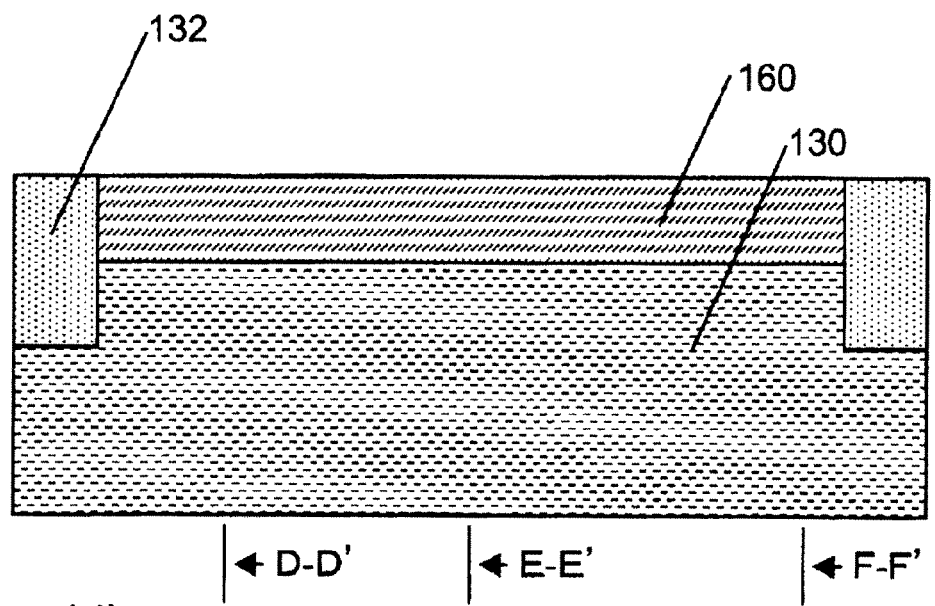
Figure 12:
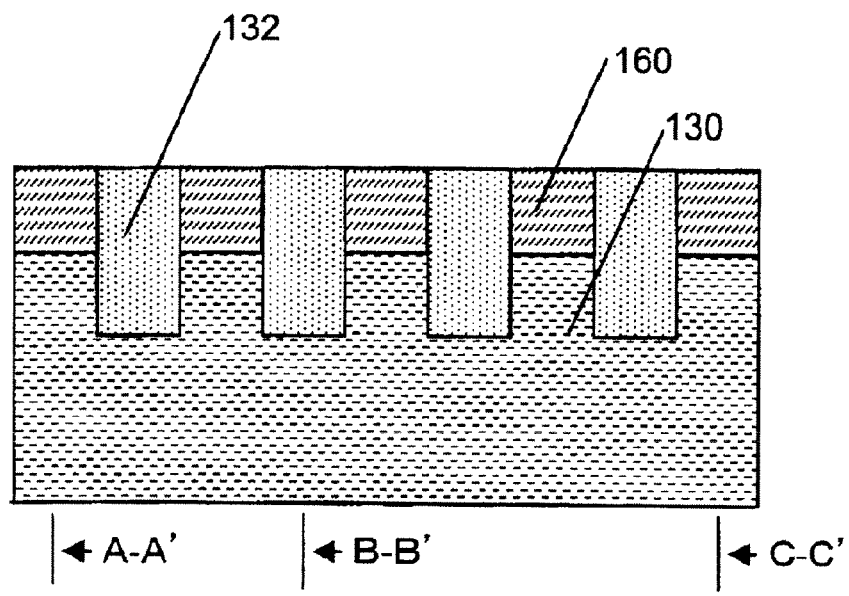
Figure 12:
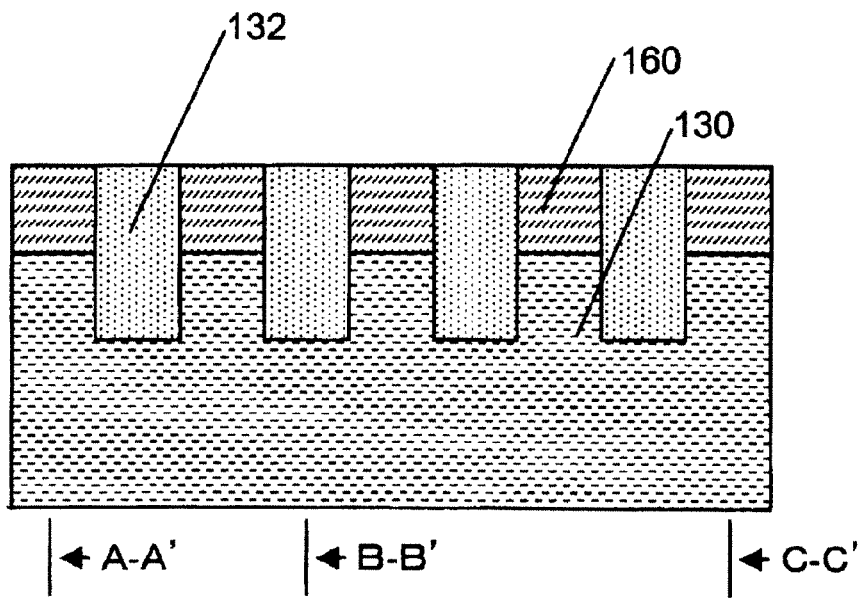
Figure 12:
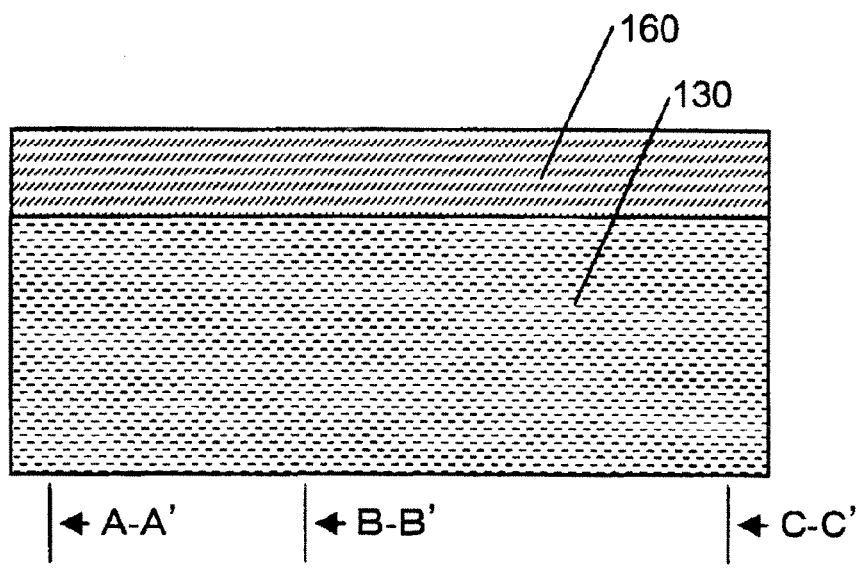

FIG. 11 and FIG. 12 are a top plan view and cross-sectional view, respectively, showing the step of filling silicon dioxide into the trench to form STI. FIG. 12(a) is a cross-sectional view taken in the direction of arrows along A-A' of FIG. 11, FIG. 12(b) is a cross-sectional view taken in the direction of arrows along B-B' of FIG. 11, FIG. 12(c) is a cross-sectional view taken in the direction of arrows along C-C' of FIG. 11, FIG. 12(d) is a cross-sectional view taken in the direction of arrows along D-D' of FIG. 11, FIG. 12(e) is a cross-sectional view taken in the direction of arrows along E-E' of FIG. 11, and FIG. 12(f) is a cross-sectional view taken in the direction of arrows along F-F' of FIG. 11.

In a step (step S3) of filling silicon dioxide into the trench to form the STI, silicon dioxide ($SiO_2$) (HDP-NSG layer) is deposited by HDP-CVD (600 nm) to fill the trench 163 formed in step S2, and is removed to reach the upper end surface of the polysilicon layer 160 by CMP, thereby forming the silicon dioxide layer 130.

Figure 13:
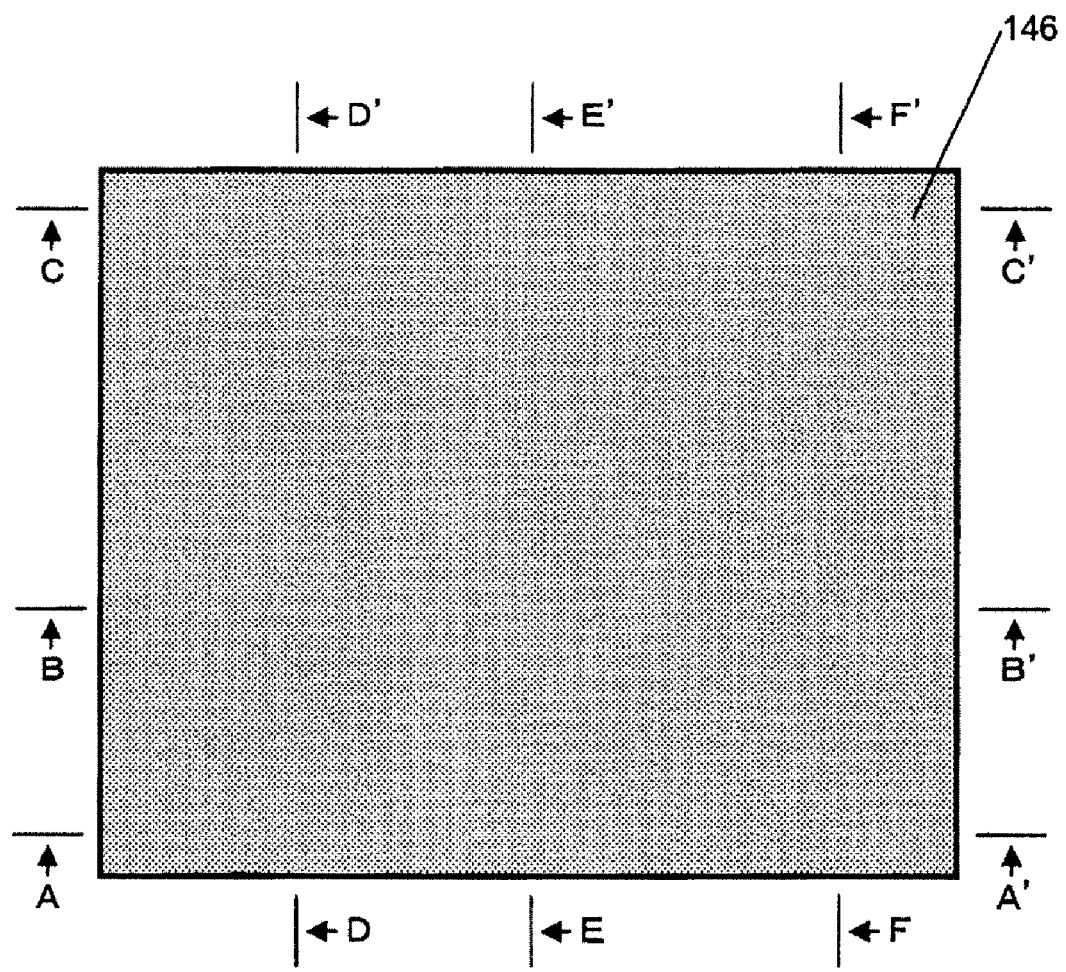
FIG. 13 is a top plan view showing the step of forming a $Si_3N_4$ layer to cover the silicon dioxide layer and the polysilicon layer.
Figure 14A:
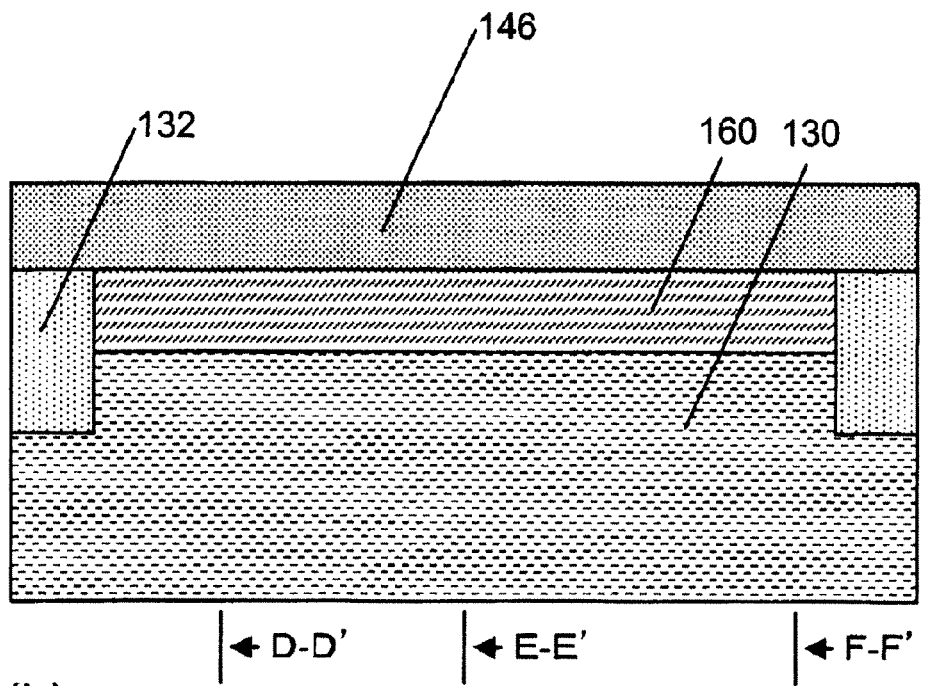
FIG. 14(a) is a cross-sectional view taken in the direction of arrows along A-A' of FIG. 13.
Figure 14B:
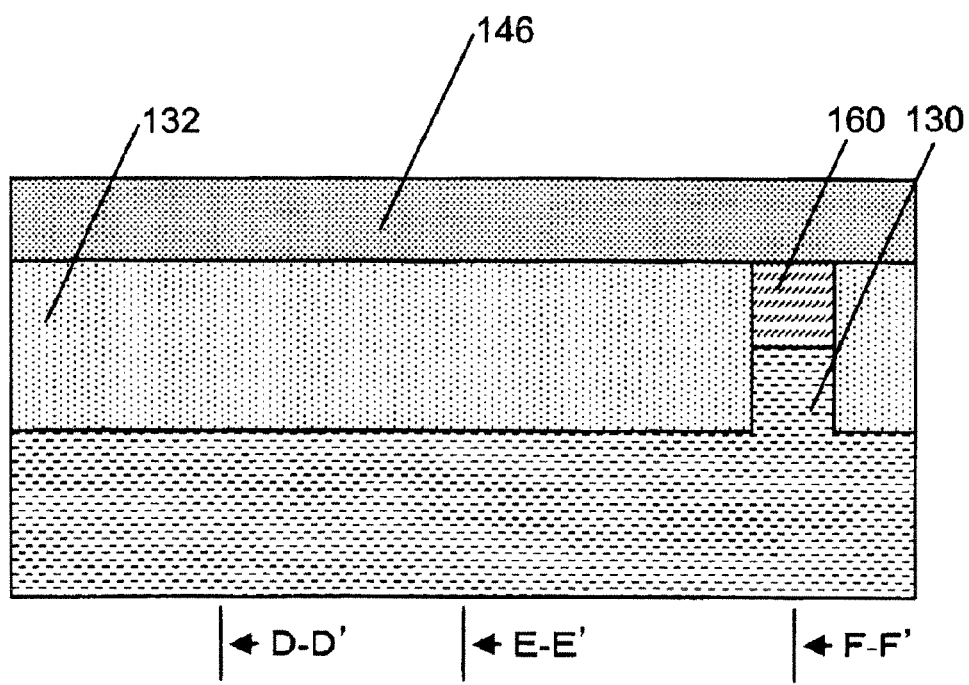
FIG. 14(b) is a cross-sectional view taken in the direction of arrows along B-B' of FIG. 13.
Figure 14:
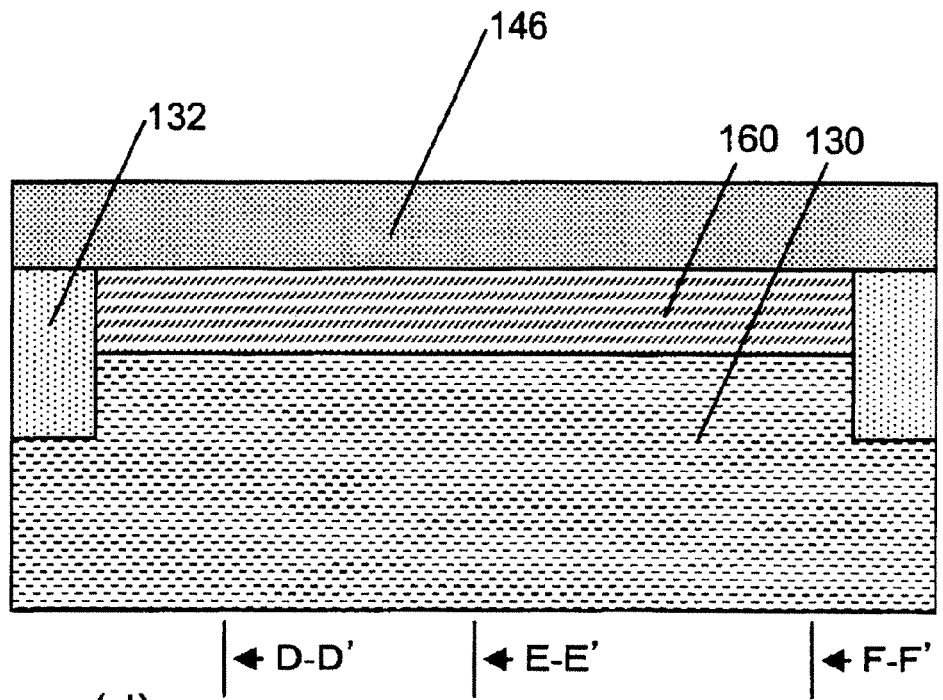
Figure 14:
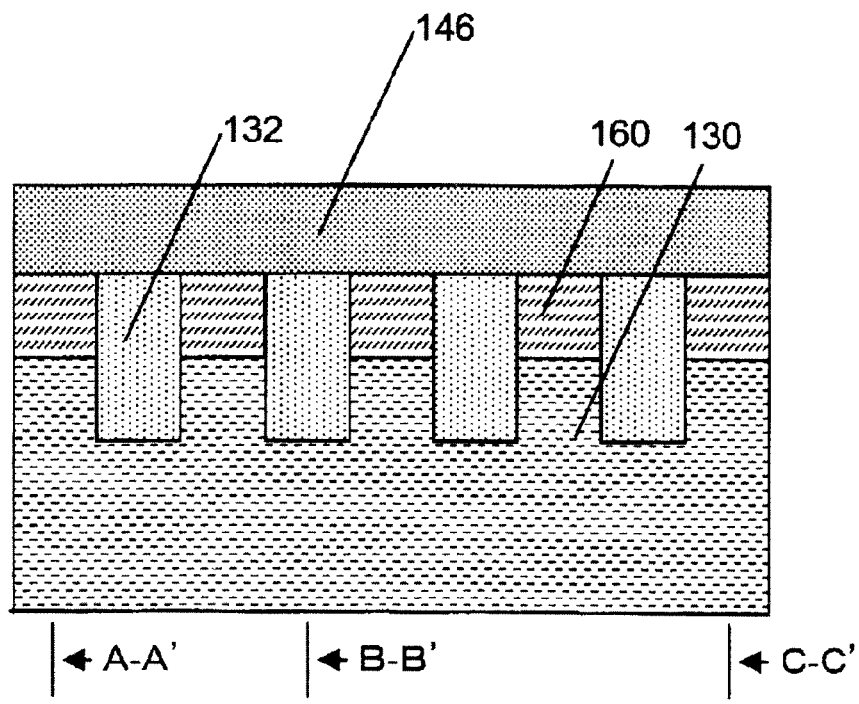
Figure 14:
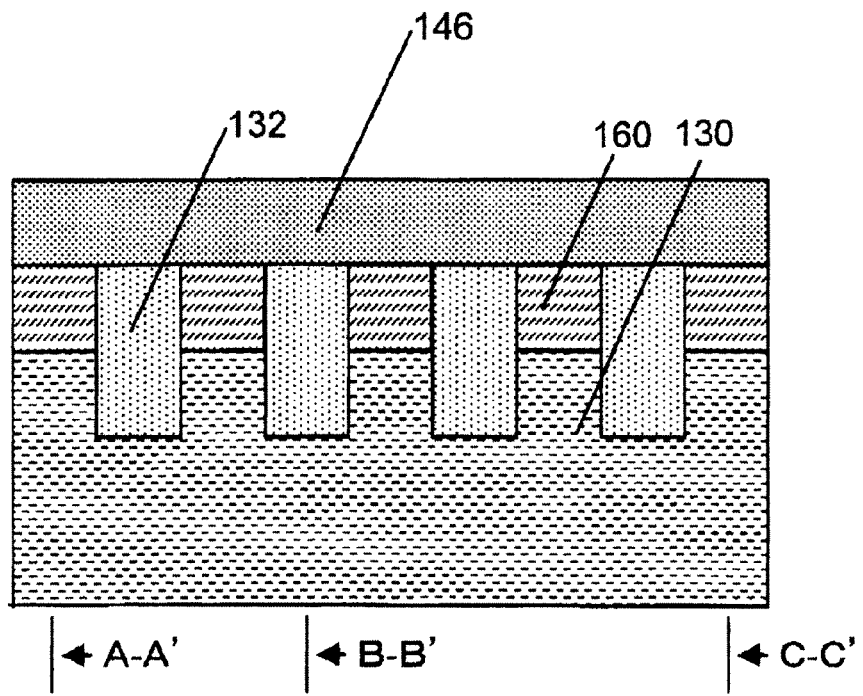
Figure 14:
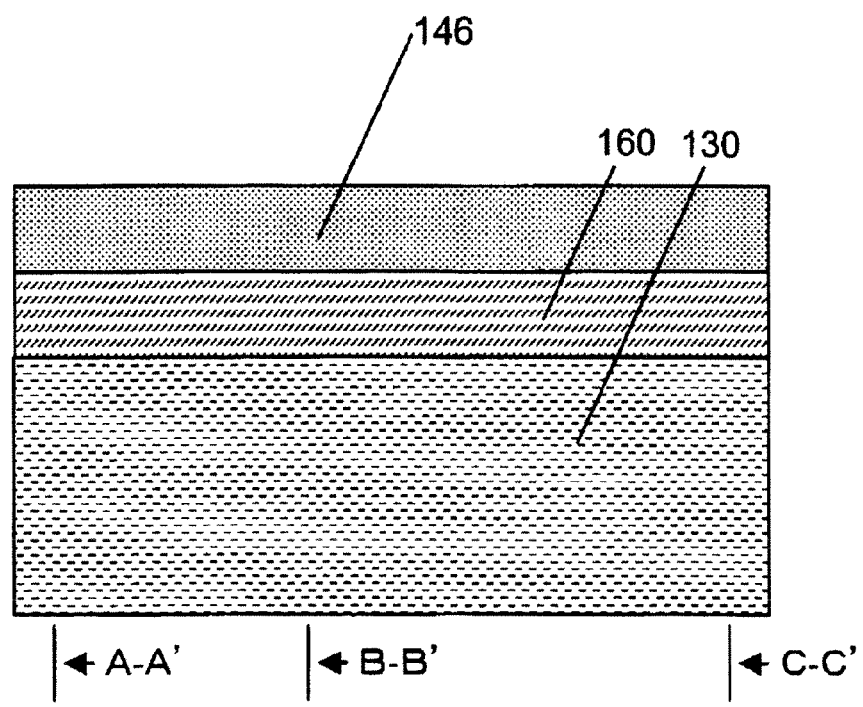

FIG. 13 and FIG. 14 are a top plan view and cross-sectional views, respectively, showing the step of forming a $Si_3N_4$ layer to cover the silicon dioxide layer and the polysilicon layer. FIG. 14(a) is a cross-sectional view taken in the direction of arrows along A-A' of FIG. 13, FIG. 14(b) is a cross-sectional view taken in the direction of arrows along B-B' of FIG. 13, FIG. 14(c) is a cross-sectional view taken in the direction of arrows along C-C' of FIG. 13, FIG. 14(d) is a cross-sectional view taken in the direction of arrows along D-D' of FIG. 13, FIG. 14(e) is a cross-sectional view taken in the direction of arrows along E-E' of FIG. 13, and FIG. 14(f) is a cross-sectional view taken in the direction of arrows along F-F' of FIG. 13.

In a step (step S4) of forming the $Si_3N_4$ layer to cover the silicon dioxide layer and the polysilicon layer, $Si_3N_4$ is deposited over the entire surface by CVD to form the $Si_3N_4$ layer 146.

Figure 15:
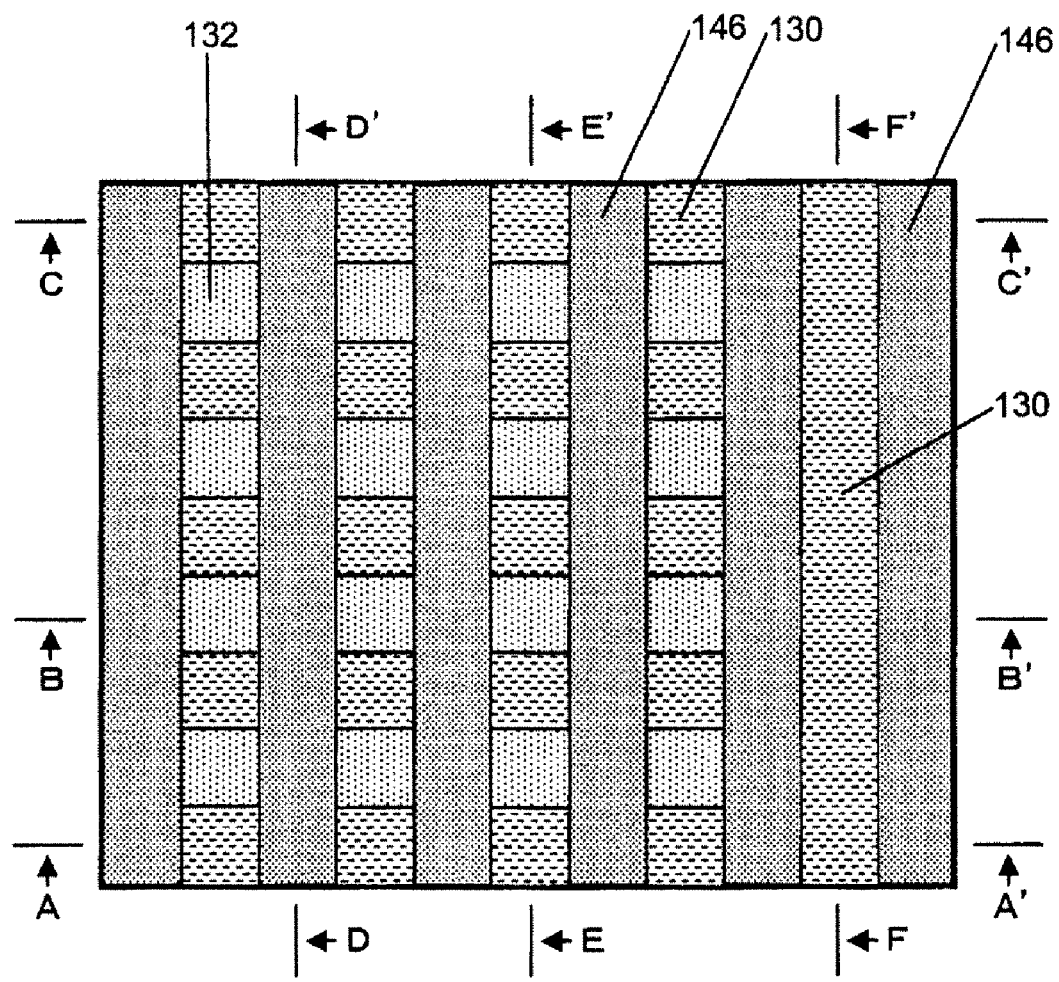
FIG. 15 is a top plan view showing the step of forming a memory trench.
Figure 16:
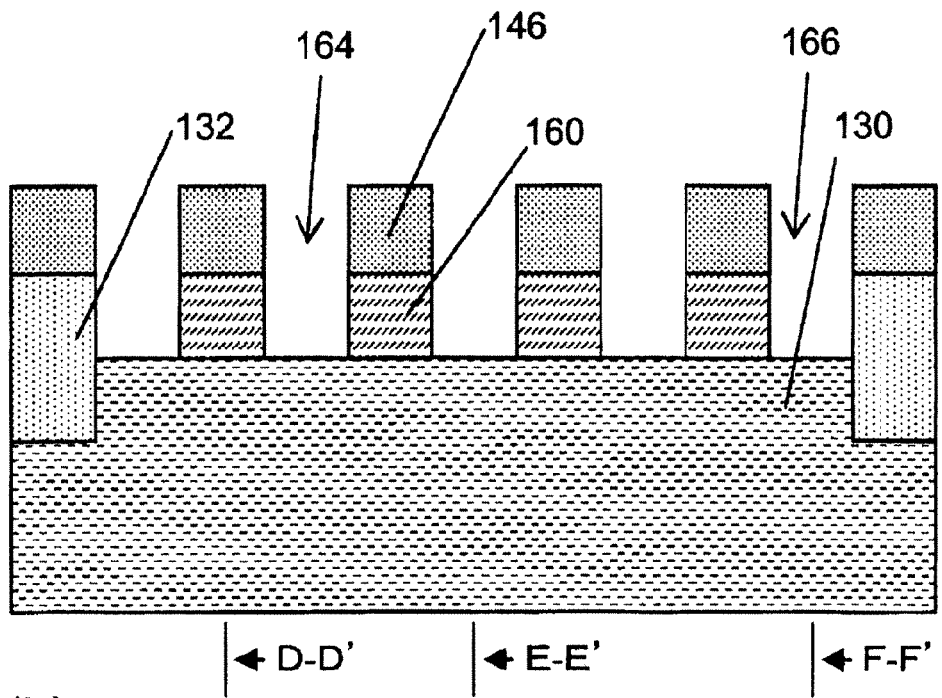
Figure 16:
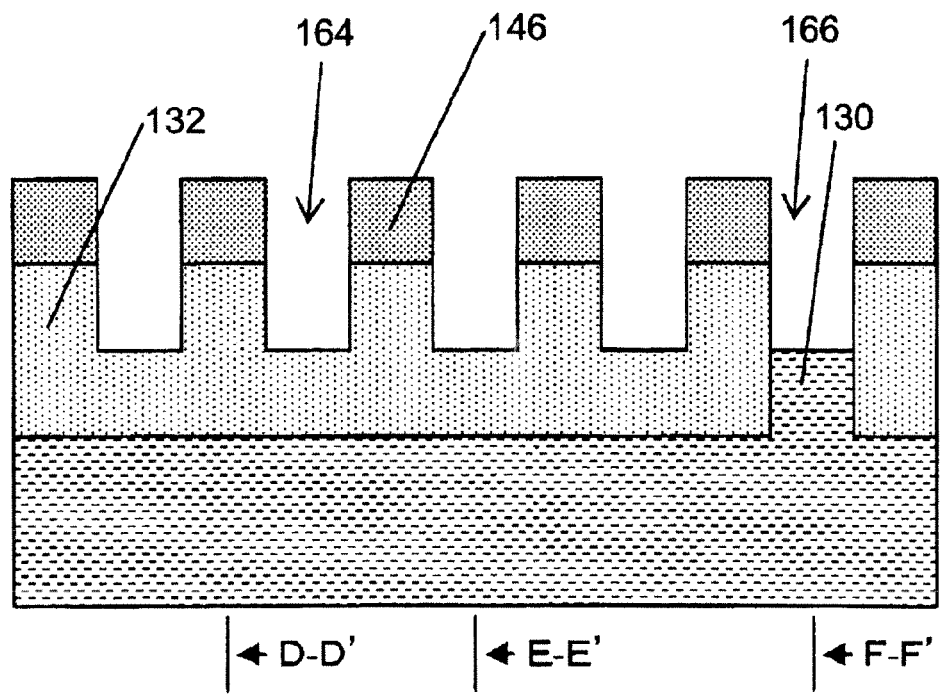
Figure 16:
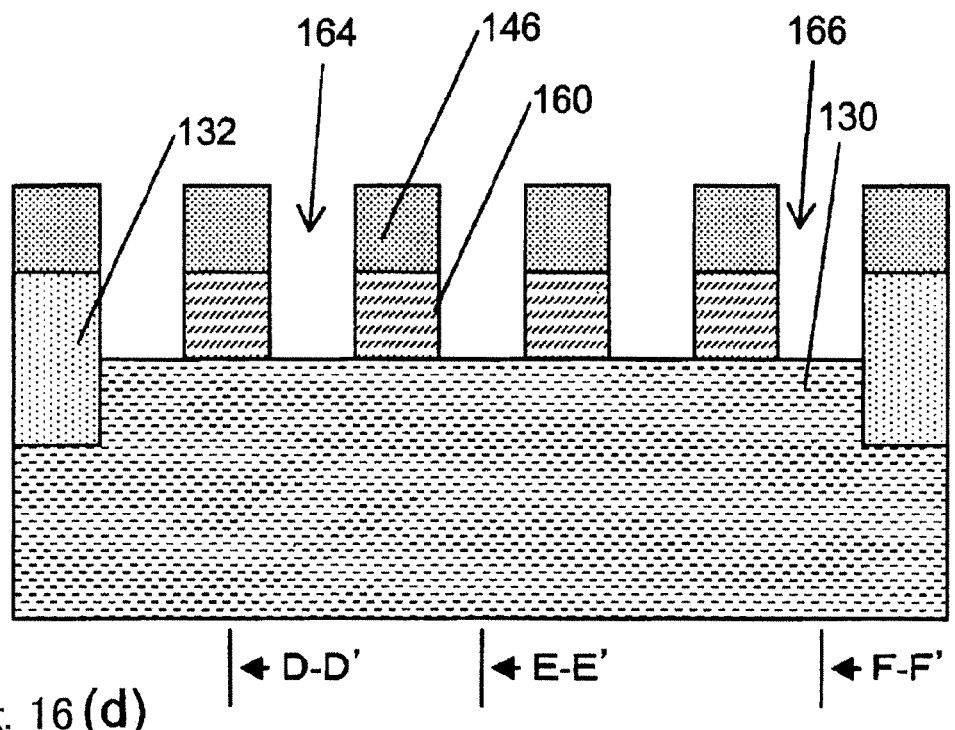
Figure 16:
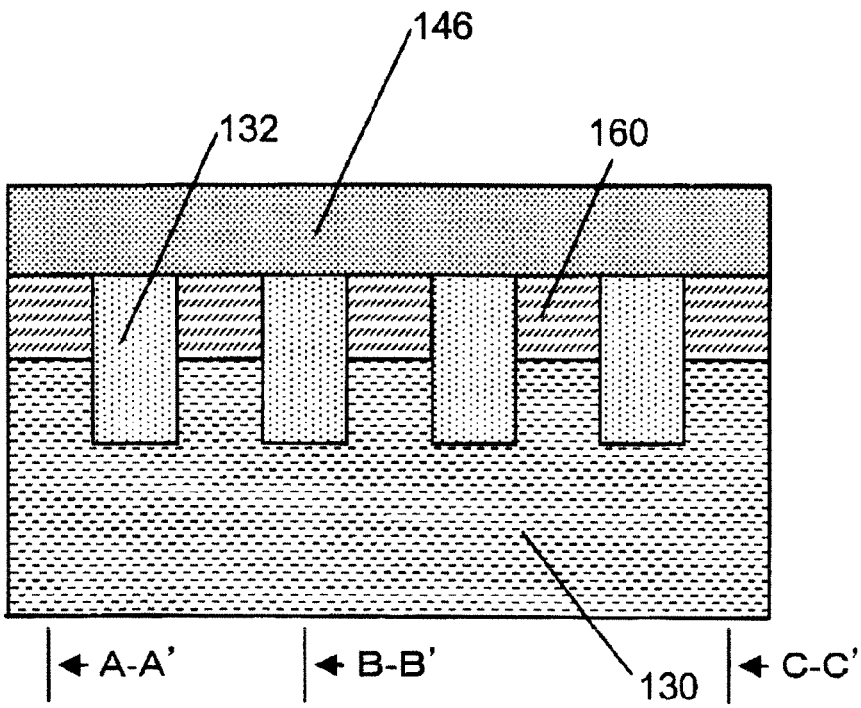
Figure 16:
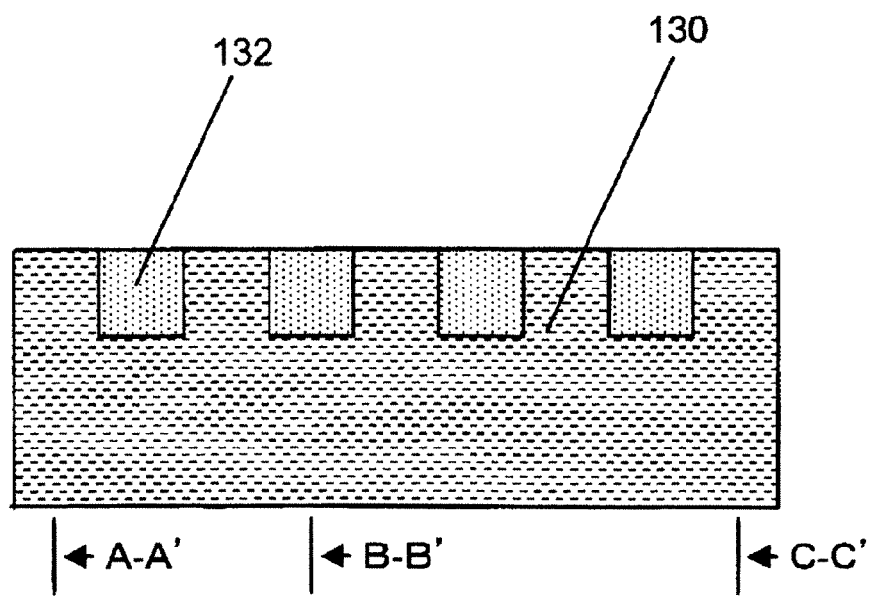
Figure 16:
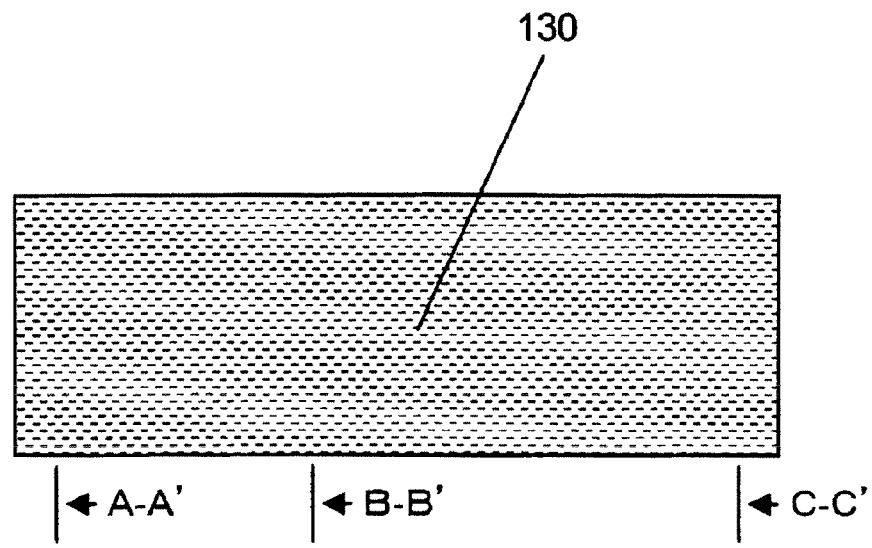

FIG. 15 and FIG. 16 are a top plan view and cross-sectional views, respectively, showing the step of forming the memory trench. FIG. 16(a) is a cross-sectional view taken in the direction of arrows along A-A' of FIG. 15, FIG. 16(b) is a cross-sectional view taken in the direction of arrows along B-B' of FIG. 15, FIG. 16(c) is a cross-sectional view taken in the direction of arrows along C-C' of FIG. 15, FIG. 16(d) is a cross-sectional view taken in the direction of arrows along D-D' of FIG. 15, FIG. 16(e) is a cross-sectional view taken in the direction of arrows along E-E' of FIG. 15, and FIG. 16(f) is a cross-sectional view taken in the direction of arrows along F-F' of FIG. 15.

In a step (step S5) of forming the memory trench, the $Si_3N_4$ layer 146, the polysilicon layer 160 and the silicon dioxide layer 132 are removed at predetermined widths and intervals, to form the memory trenches 164 extending in the upward and downward direction (second direction) of FIG. 15. The bottom surface of the memory trench is flat and its position is controlled to be coplanar with the bottom surface of the polysilicon layer 160. The rightmost trench 164, among the five memory trenches 164 shown in FIG. 16(a), is the contact wire trench 166.

Figure 17:
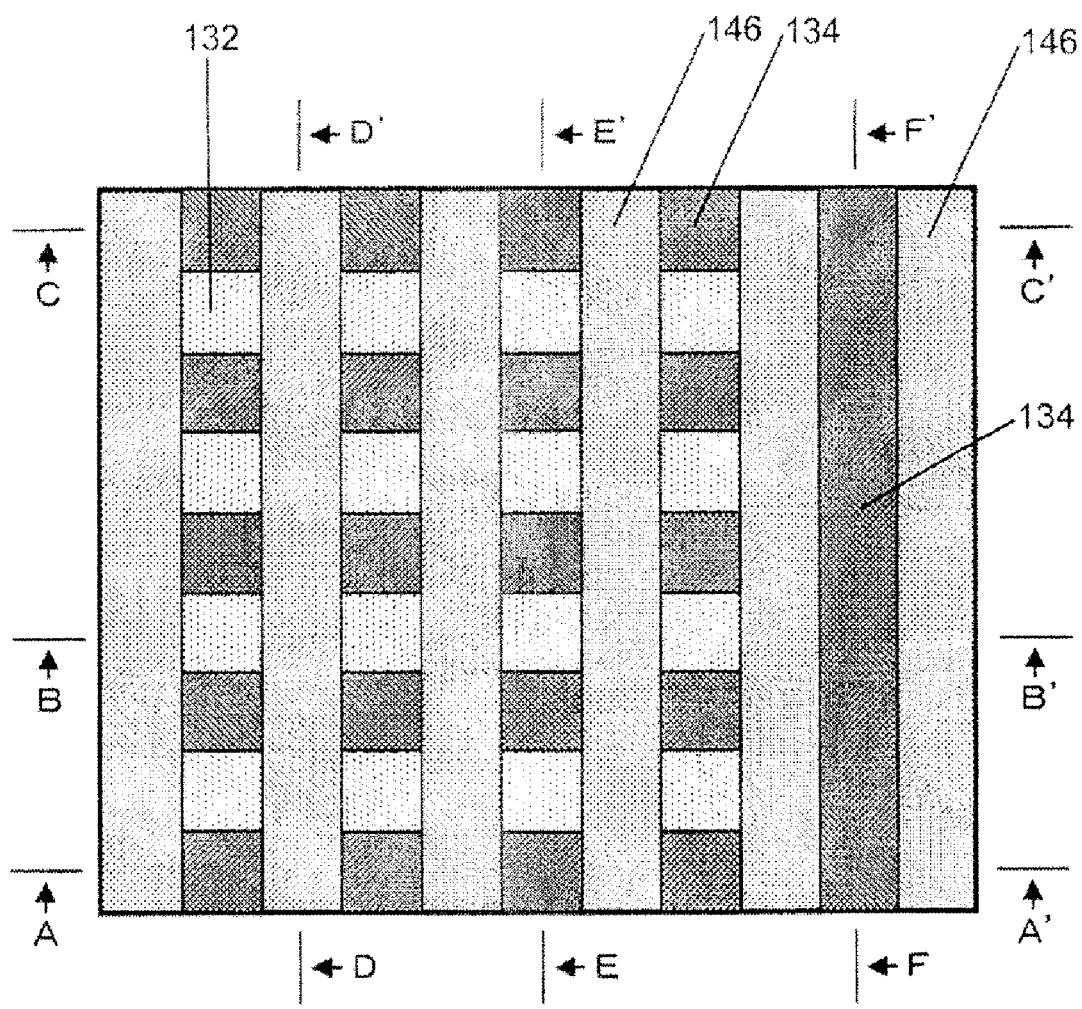
FIG. 17 is a top plan view showing the step of implanting phosphorous atoms (P) into a region of the bottom surface of each memory trench, where the P-type silicon substrate is exposed.
Figure 18:
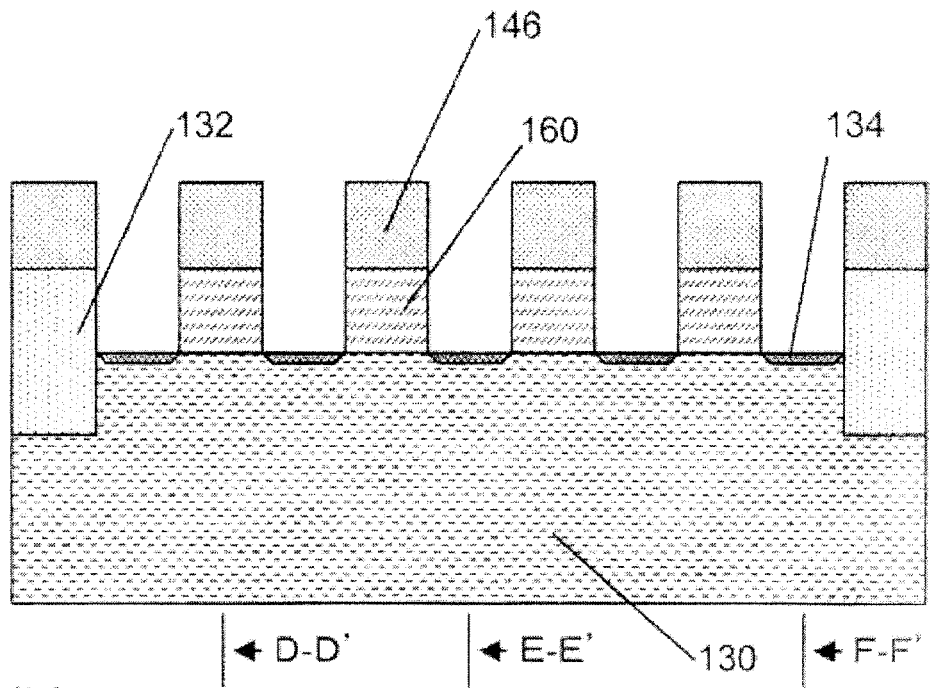
Figure 18:
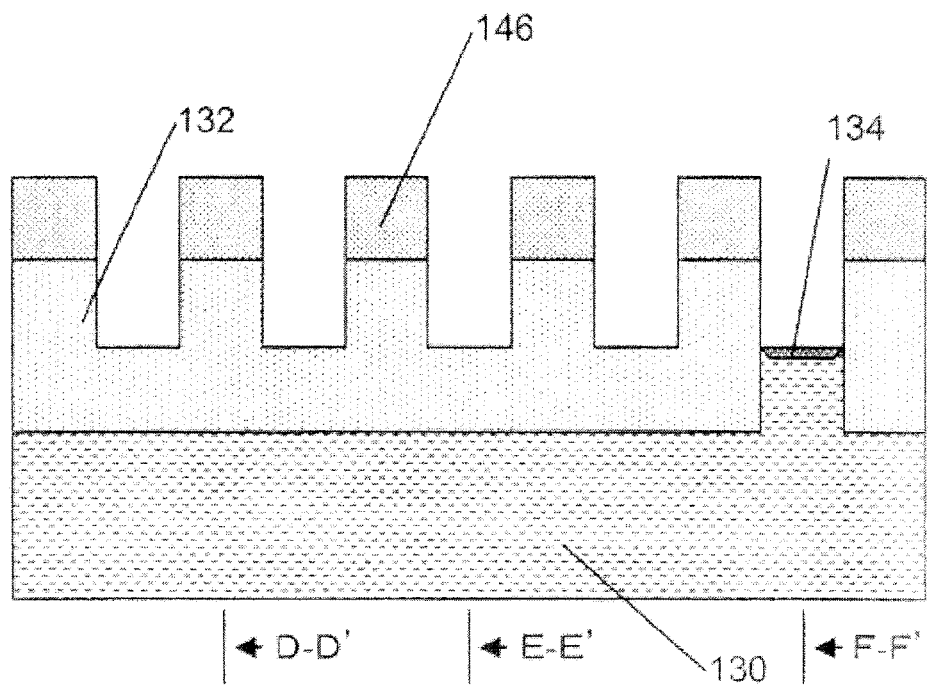
Figure 18C:
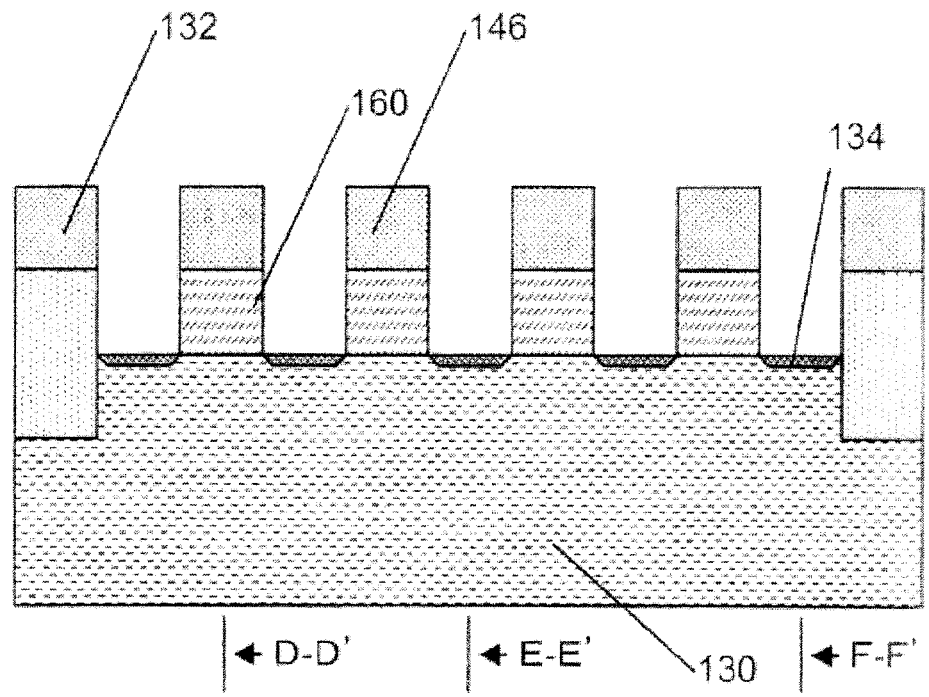
FIG. 18(c) is a cross-sectional view taken in the direction of arrows along C-C' of FIG. 17.
Figure 18D:
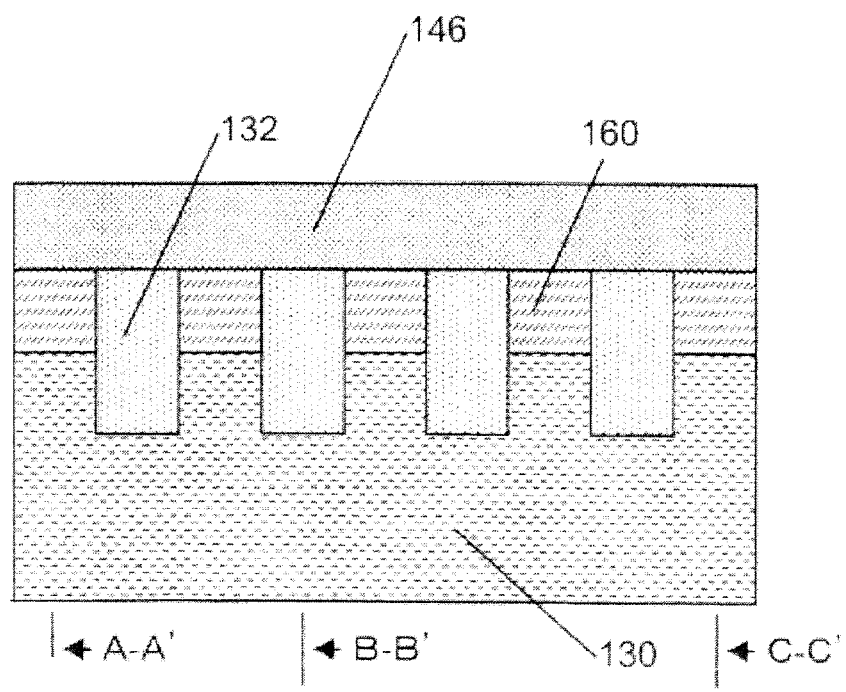
FIG. 18(d) is a cross-sectional view taken in the direction of arrows along D-D' of FIG. 17.
Figure 18E:
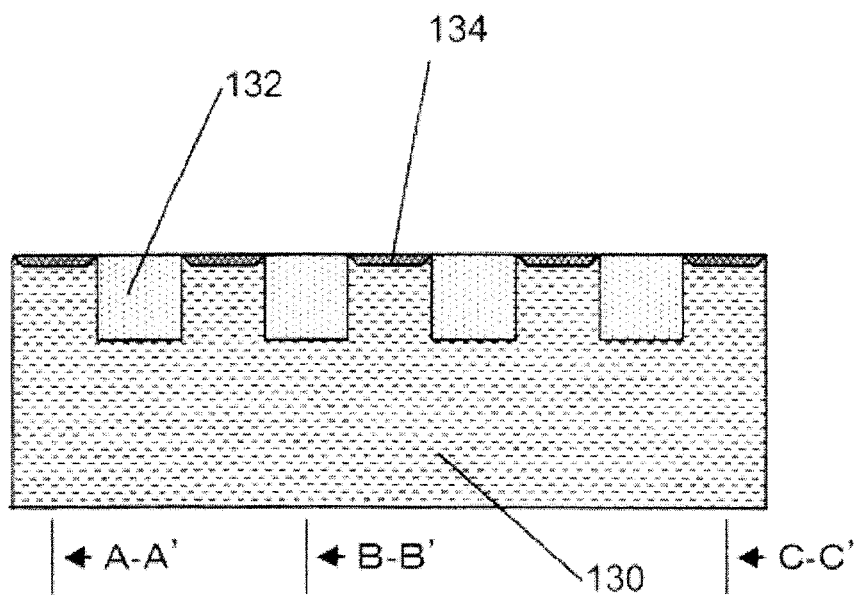
FIG. 18(e) is a cross-sectional view taken in the direction of arrows along E-E' of FIG. 17.
Figure 18F:
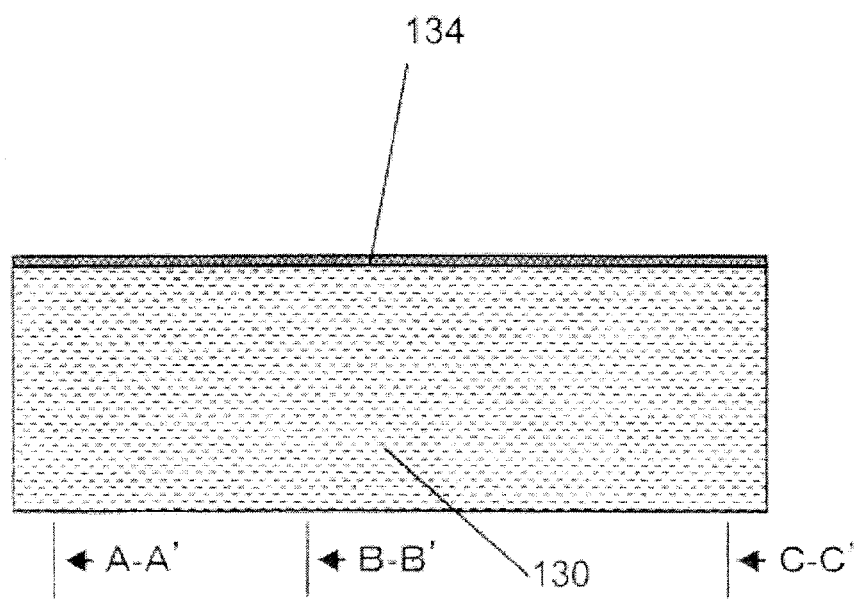
FIG. 18(f) is a cross-sectional view taken in the direction of arrows along F-F' of FIG. 17.

FIG. 17 and FIG. 18 are a top plan view and cross-sectional views, respectively, showing the step of implanting phosphorous atoms (P) into a region of the bottom surface of each memory trench, where the P-type silicon substrate is exposed. FIG. 18(a) is a cross-sectional view taken in the direction of arrows along A-A' of FIG. 17, FIG. 18(b) is a cross-sectional view taken in the direction of arrows along B-B' of FIG. 17, FIG. 18(c) is a cross-sectional view taken in the direction of arrows along C-C' of FIG. 17, FIG. 18(d) is a cross-sectional view taken in the direction of arrows along D-D' of FIG. 17, FIG. 18(e) is a cross-sectional view taken in the direction of arrows along E-E' of FIG. 17, and FIG. 18(f) is a cross-sectional view taken in the direction of arrows along F-F' of FIG. 17.

In a step (step S6) of implanting phosphorous atoms (P) into the region of the bottom surface of each memory trench where the P-type silicon substrate is exposed, the phosphorous atoms (P) are implanted into the bottom surface of the memory trench 164 formed in step S5 with a low energy, by ion implantation, and the P-implanted region 134 is formed by high-speed annealing. The phosphorous atoms are implanted only to a region of the bottom surface of the memory trench 164 where the P-type silicon substrate layer 130 is exposed, thereby forming the P-implanted region 134. The phosphorous atoms are not implanted to a region of the bottom surface of the memory trench 164 where the silicon dioxide layer 132 is exposed, and thus, the P-implanted region 134 is not formed there. Therefore, the P-implanted region 134 is formed over the entire bottom surface of the contact wire trench 166. In contrast, the P-implanted regions 134 are formed like islands at specified intervals on the bottom surface of the other memory trenches 164 (see FIG. 17). Arsenic (As) atoms may be implanted instead of the phosphorous atoms.

Figure 19:
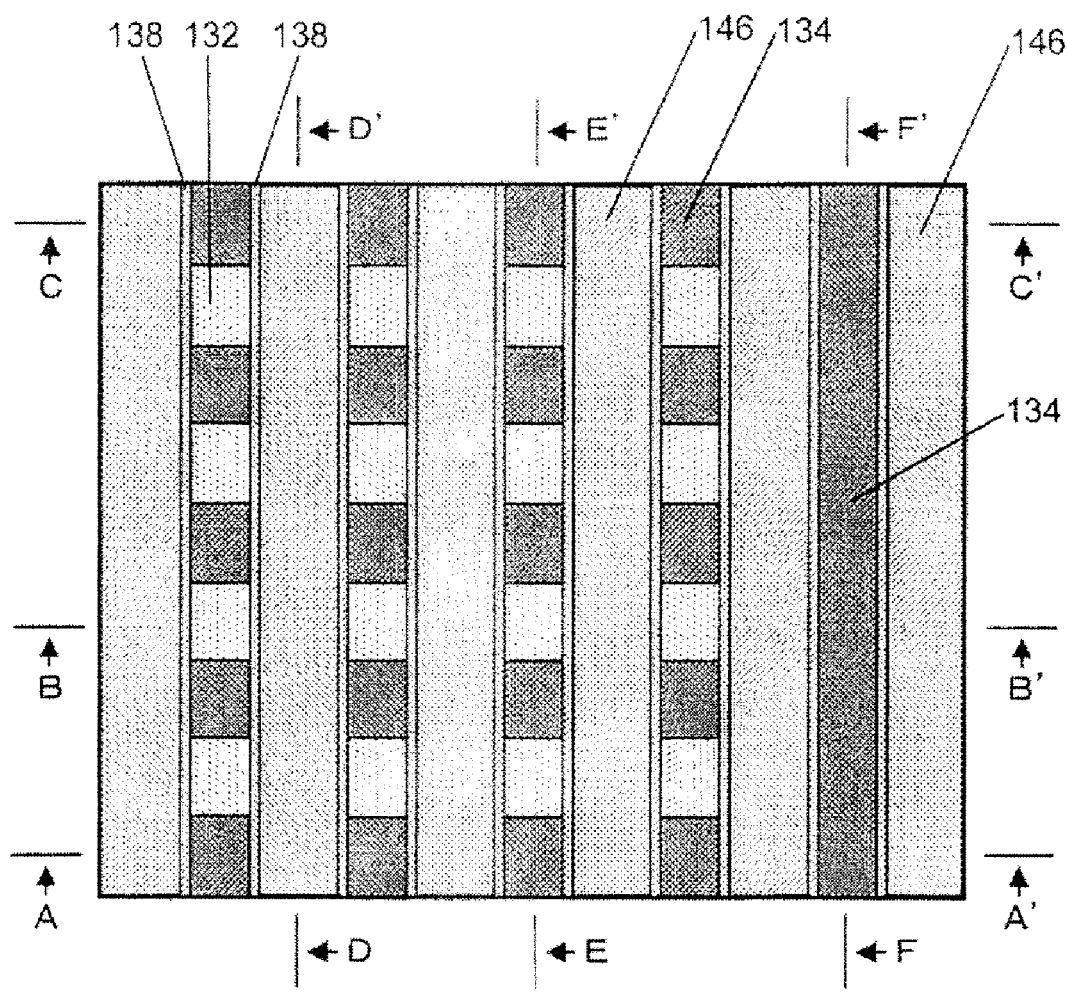
FIG. 19 is a top plan view showing the step of forming $Si_3N_4$ portions (side walls) on right and left side walls of each memory trench.
Figure 20:
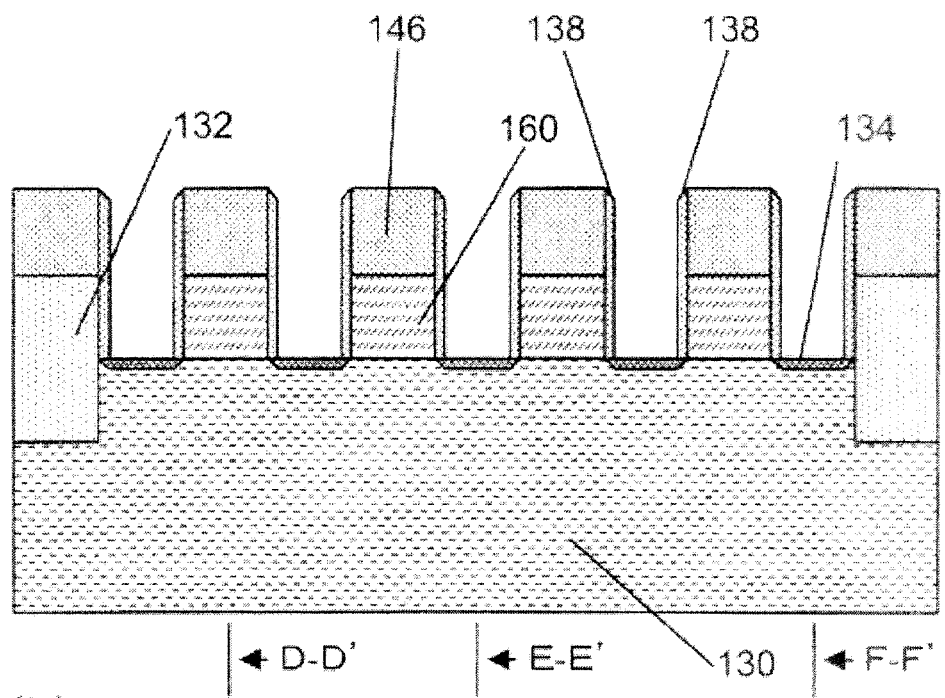
Figure 20:
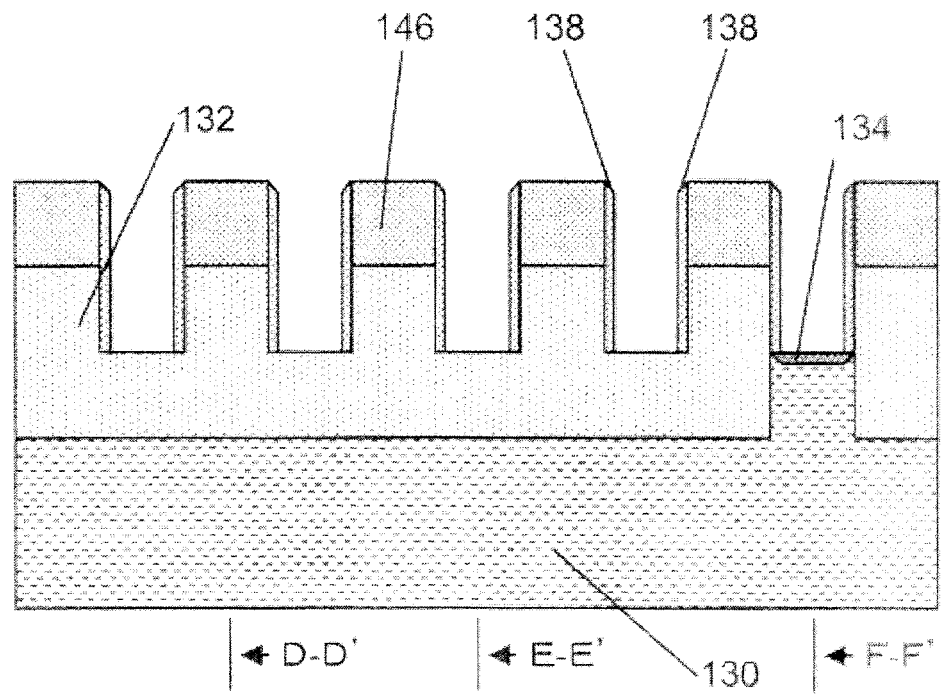
Figure 20:
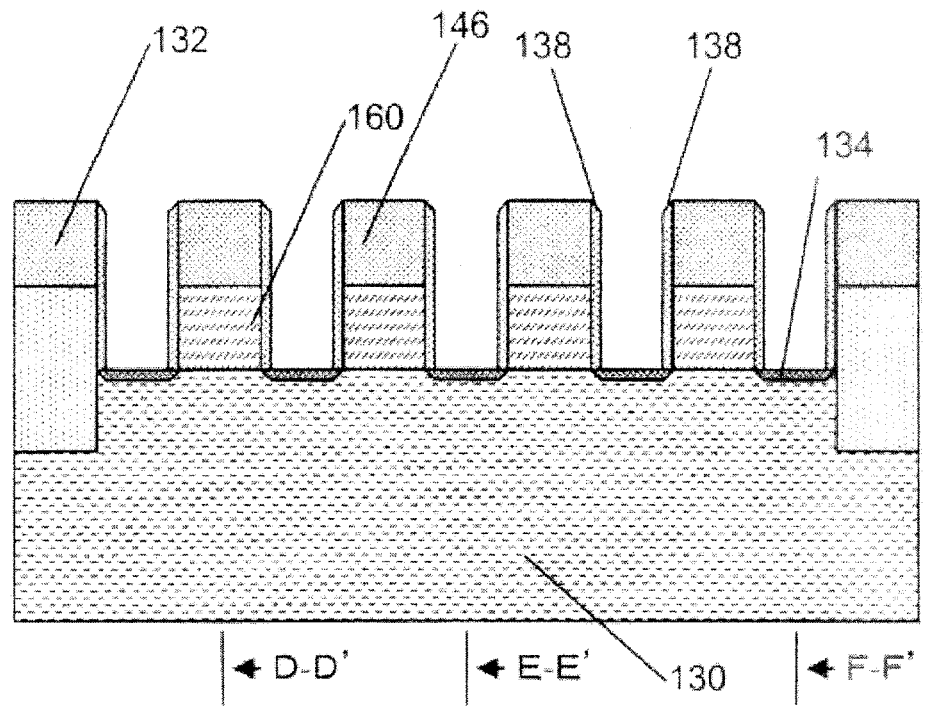
Figure 20:
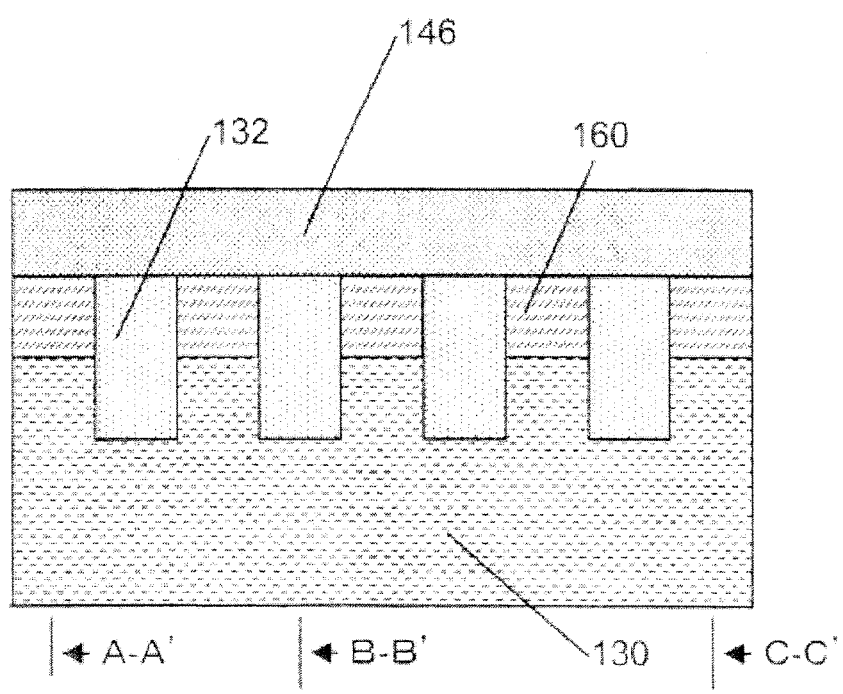
Figure 20:
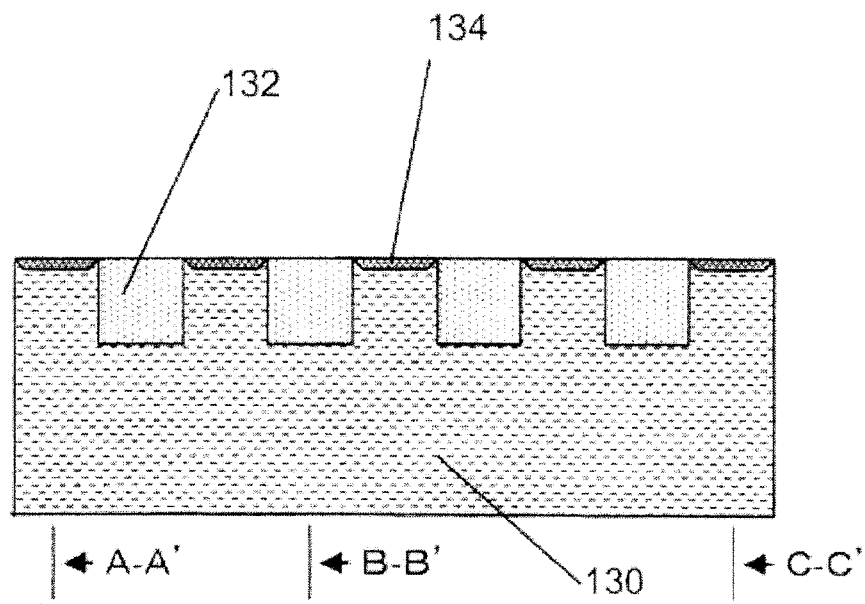
Figure 20:
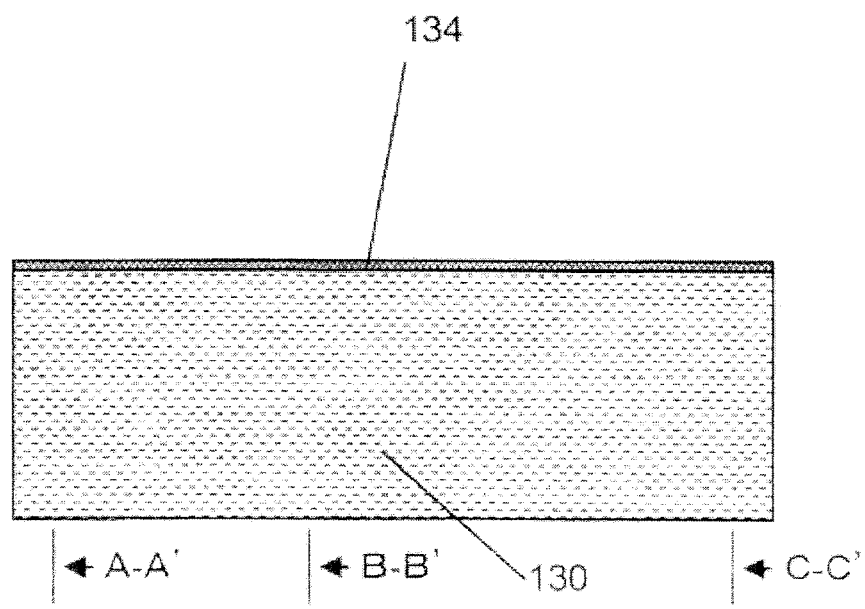

FIG. 19 and FIG. 20 are a top plan view and cross-sectional views, respectively, showing the step of forming $Si_3N_4$ portions (side walls) on right and left side walls of each memory trench. FIG. 20(a) is a cross-sectional view taken in the direction of arrows along A-A' of FIG. 19, FIG. 20(b) is a cross-sectional view taken in the direction of arrows along B-B' of FIG. 19, FIG. 20(c) is a cross-sectional view taken in the direction of arrows along C-C' of FIG. 19, FIG. 20(d) is a cross-sectional view taken in the direction of arrows along D-D' of FIG. 19, FIG. 20(e) is a cross-sectional view taken in the direction of arrows along E-E' of FIG. 19, and FIG. 20(f) is a cross-sectional view taken in the direction of arrows along F-F' of FIG. 19.

In a step (step S7) of forming $Si_3N_4$ portions (side walls) on the right and left side walls of each memory trench, $Si_3N_4$ is deposited in 70 nm thickness over the entire surface by CVD, and further, $Si_3N_4$ adhering to the region other than the side surfaces of the memory trench is removed by dry etching, thereby forming the $Si_3N_4$ portions 138.

Figure 21:
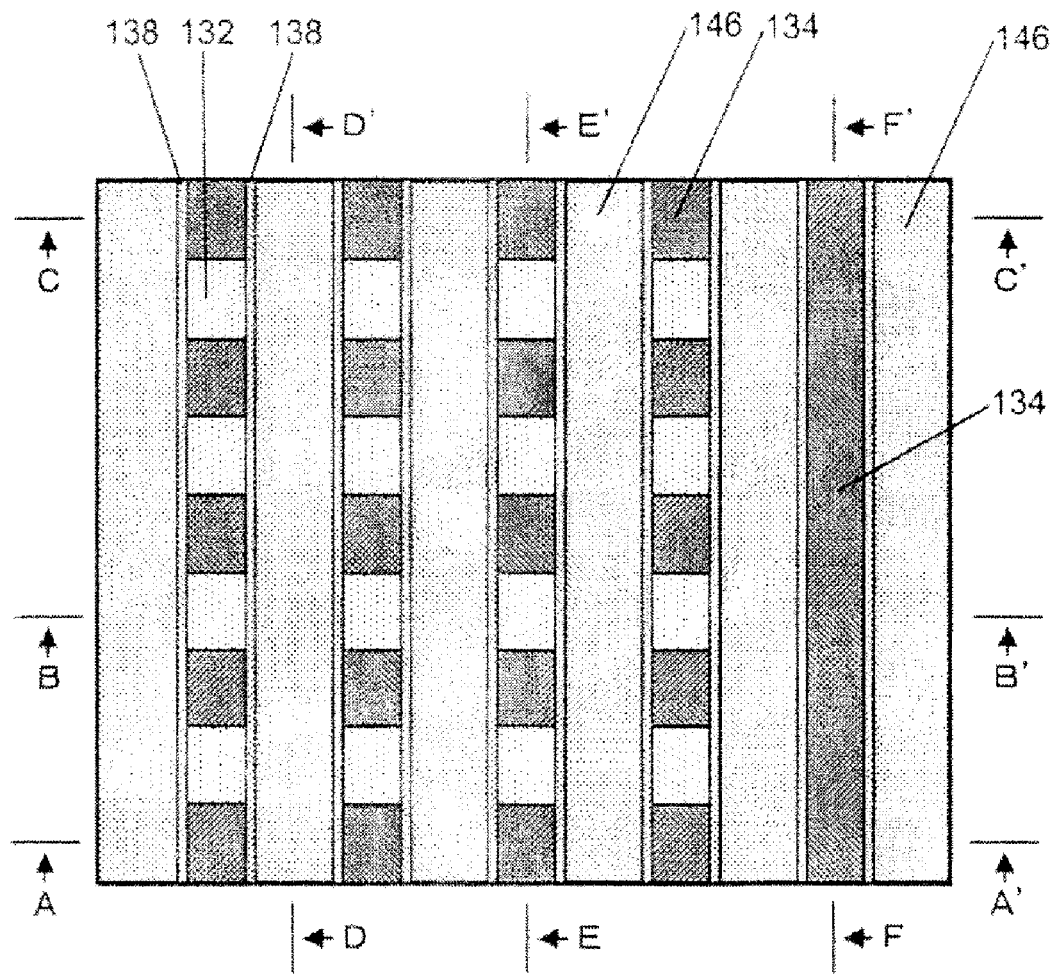
FIG. 21 is a top plan view showing the step of implanting phosphorous atoms (P) into a region between a pair of $Si_3N_4$ portions formed on each memory trench, where the P-type silicon substrate is exposed.
Figure 22:
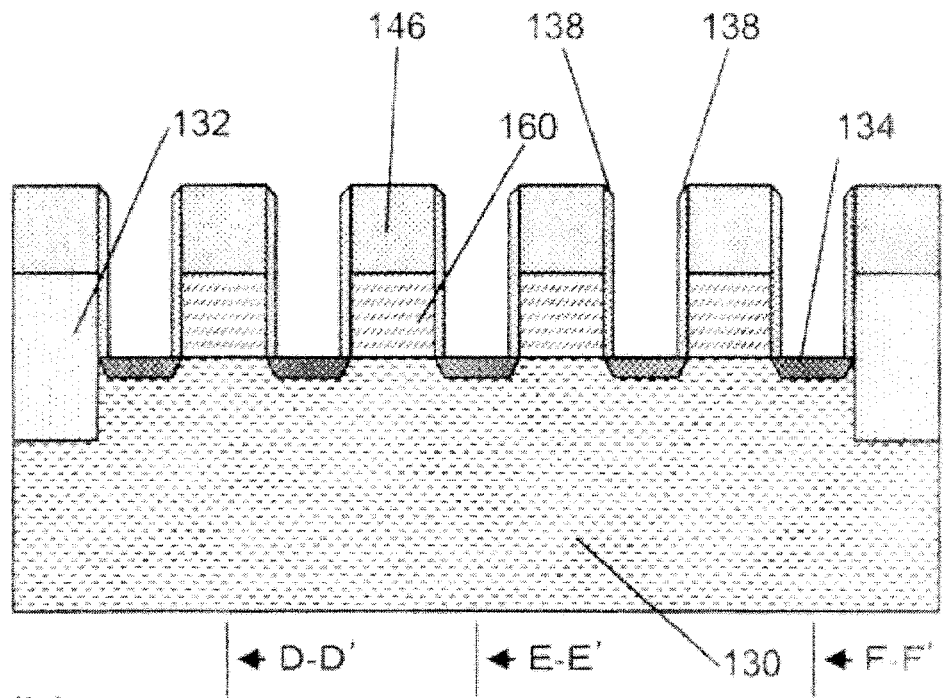
Figure 22:
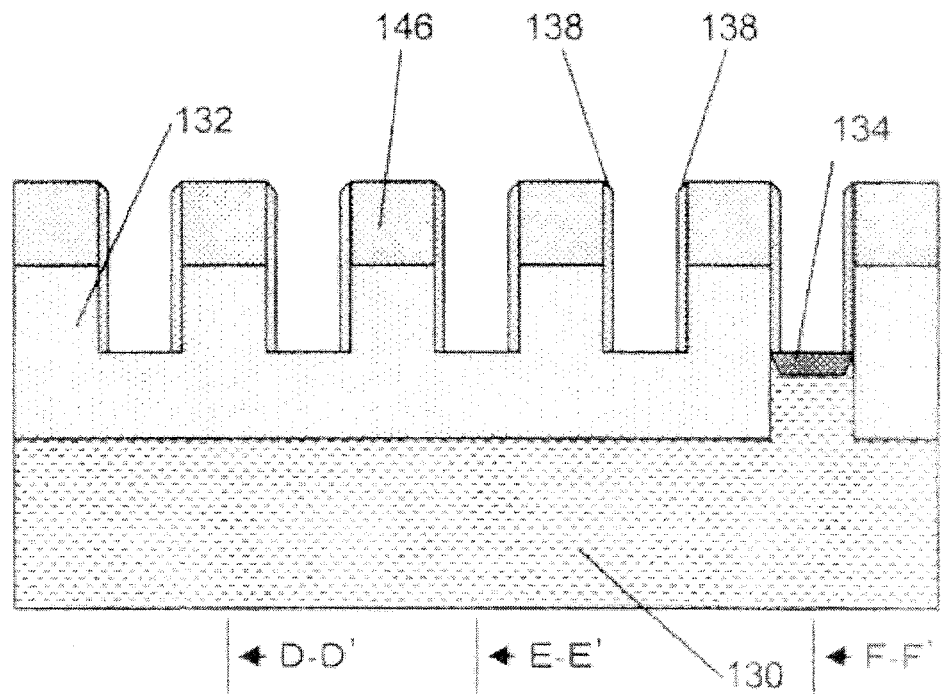
Figure 22:
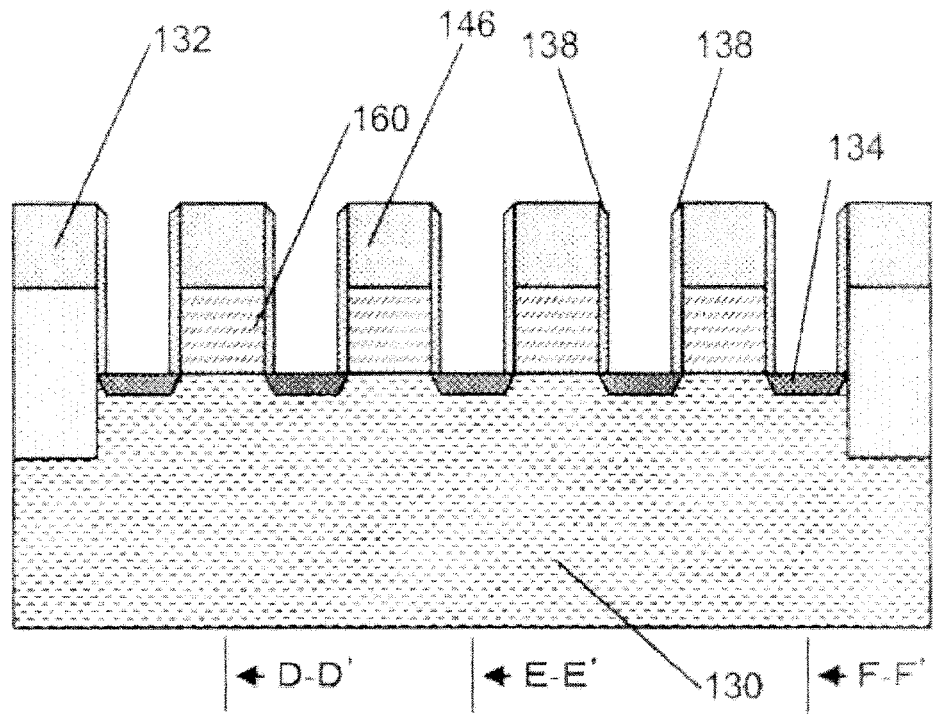
Figure 22:
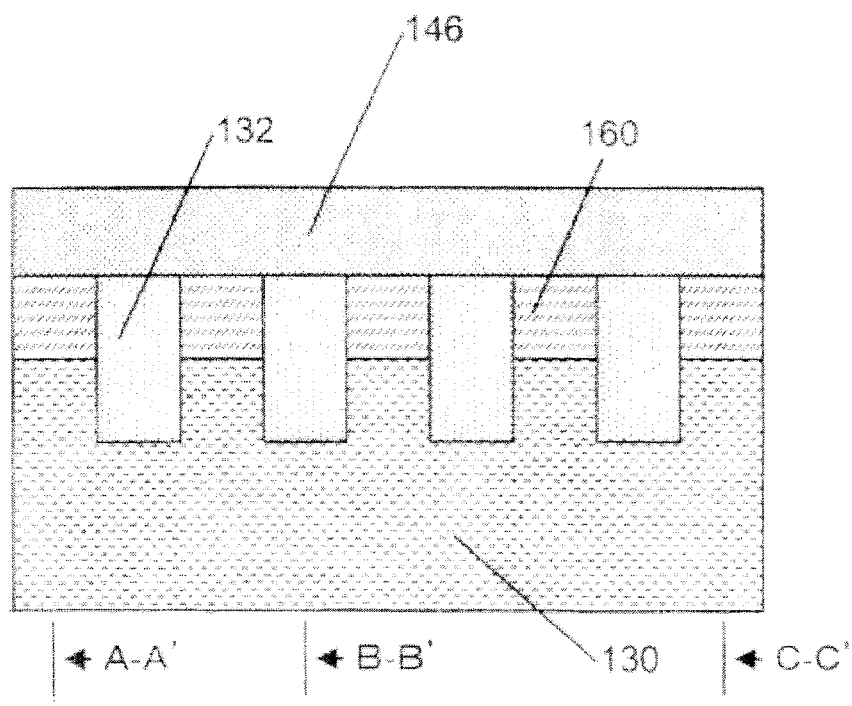
Figure 22:
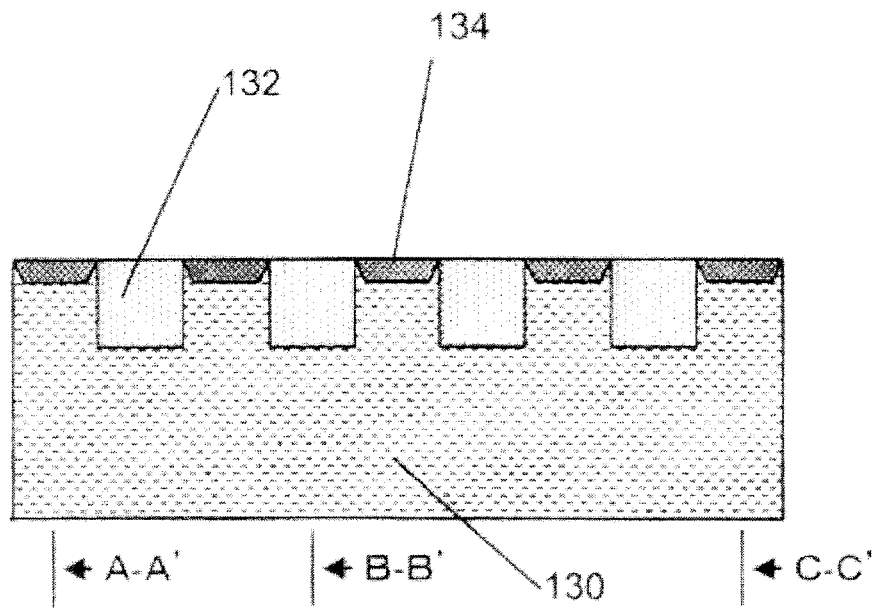
Figure 22:
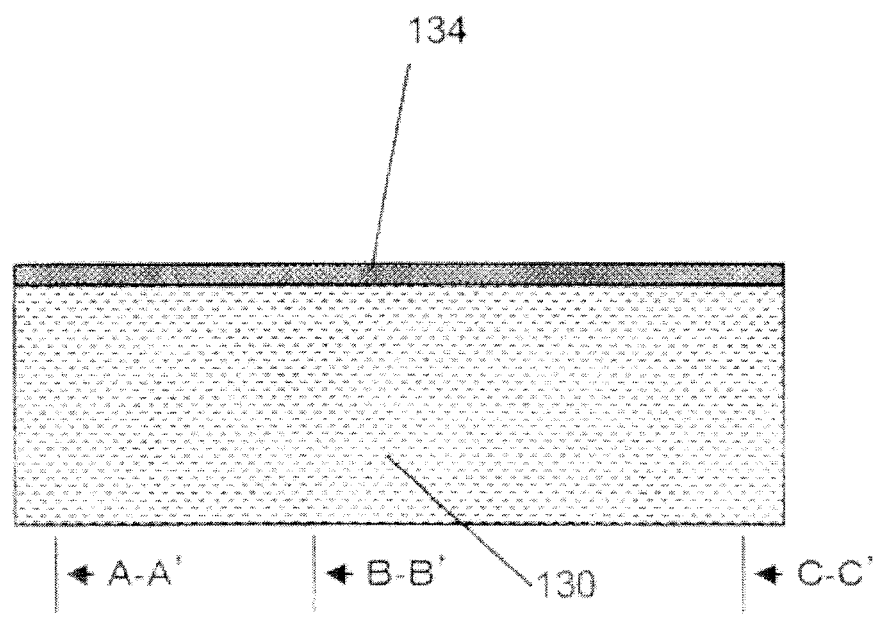

FIG. 21 and FIG. 22 are a top plan view and cross-sectional views, respectively, showing the step of implanting phosphorous atoms (P) into a region between a pair of $Si_3N_4$ portions formed on each memory trench, where the P-type silicon substrate is exposed. FIG. 22(a) is a cross-sectional view taken in the direction of arrows along A-A' of FIG. 21, FIG. 22(b) is a cross-sectional view taken in the direction of arrows along B-B' of FIG. 21, FIG. 22(c) is a cross-sectional view taken in the direction of arrows along C-C' of FIG. 21, FIG. 22(d) is a cross-sectional view taken in the direction of arrows along D-D' of FIG. 21, FIG. 22(e) is a cross-sectional view taken in the direction of arrows along E-E' of FIG. 21, and FIG. 22(f) is a cross-sectional view taken in the direction of arrows along F-F' of FIG. 21.

In a step (step S8) of implanting the phosphorous atoms (P) into the region between the pair of $Si_3N_4$ portions formed on each memory trench, where the P-type silicon substrate is exposed, the phosphorous atoms (P) are implanted at a low energy into the region between the $Si_3N_4$ portions (side walls) formed in step S7 by ion implantation and further the P-implanted region 134 is rendered deeper by high-speed annealing. Similarly to step S6, the phosphorous atoms are not implanted to a region of the bottom surface of the memory trench where the silicon dioxide layer 132 is exposed, and therefore the P-implanted region 134 is not formed there.

Figure 23:
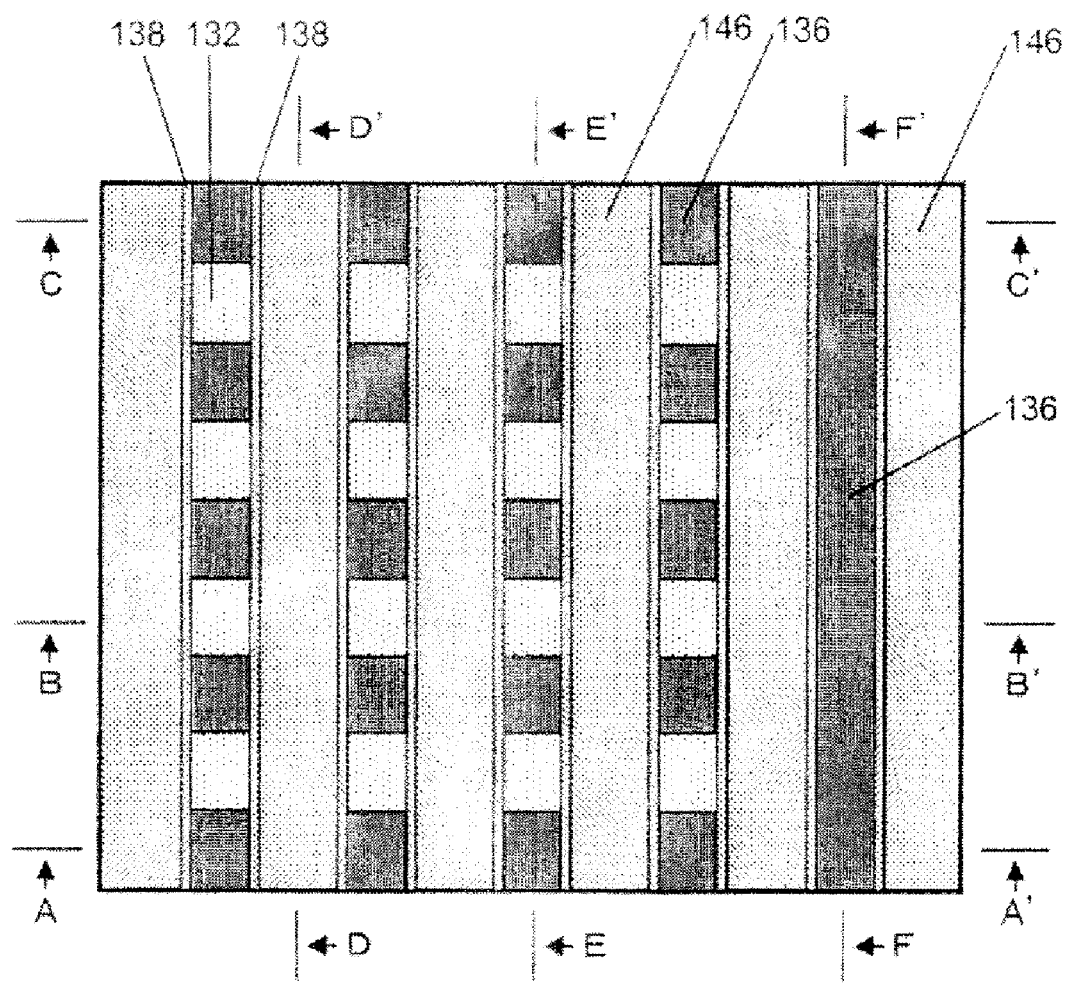
FIG. 23 is a top plan view showing the step of forming a platinum silicide layer into a region between the pair of $Si_3N_4$ portions formed on each memory trench, where the P-implanted region is exposed.
Figure 24:
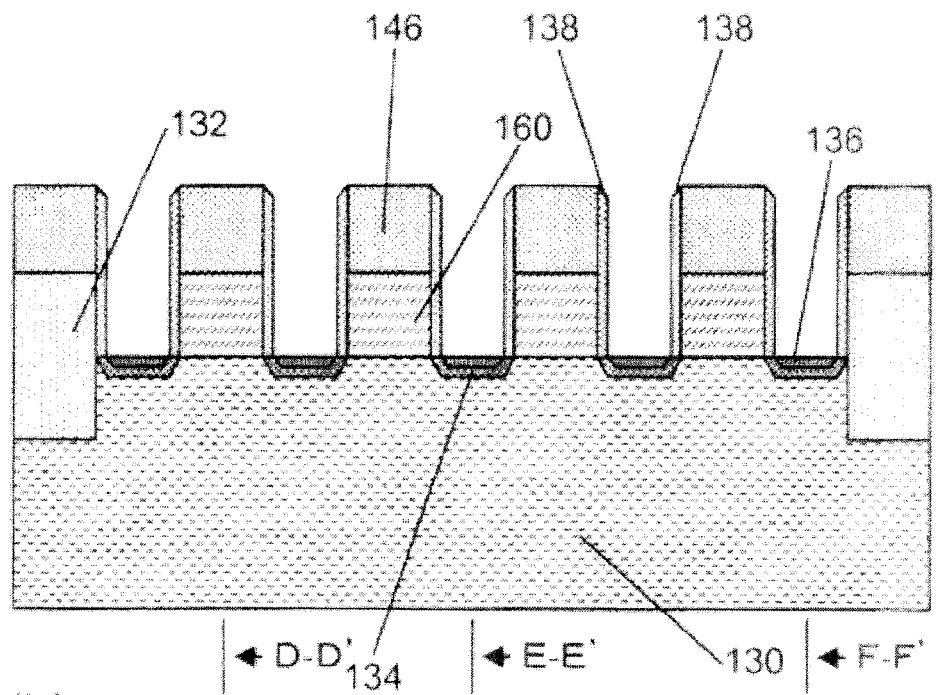
Figure 24:
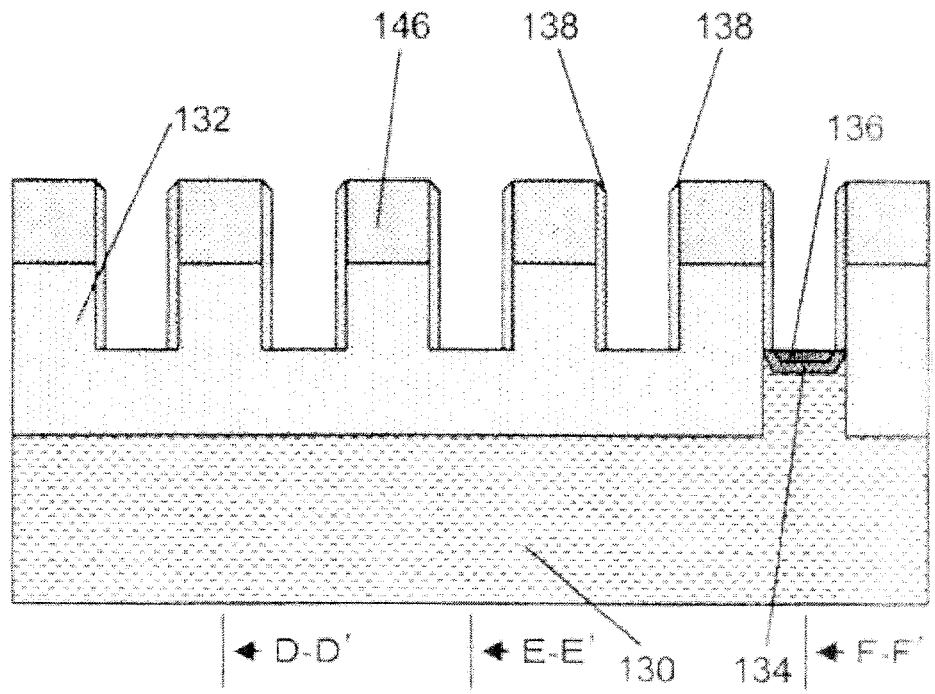
Figure 24:
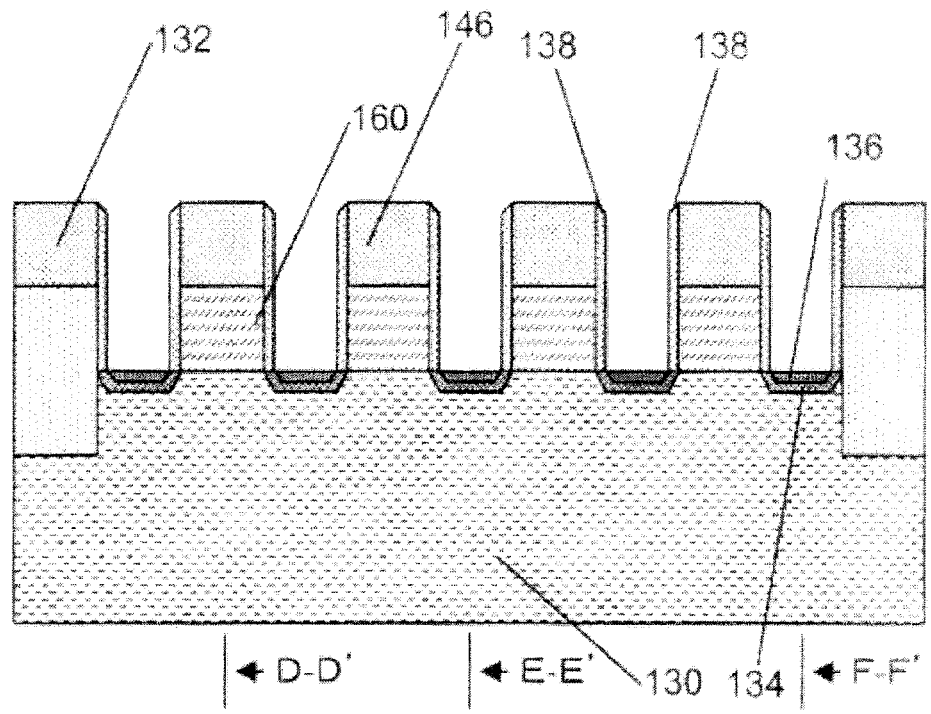
Figure 24:
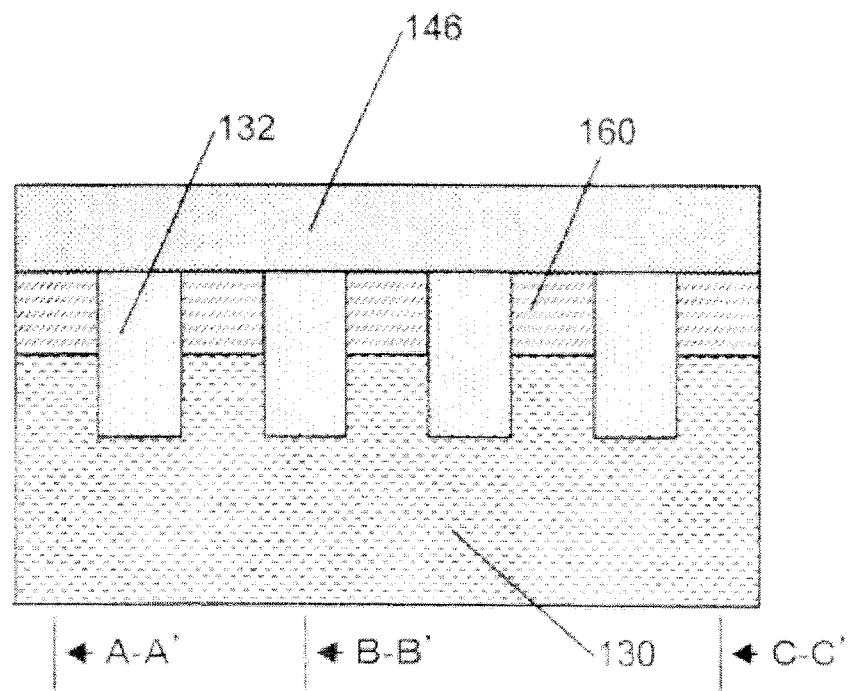
Figure 24:
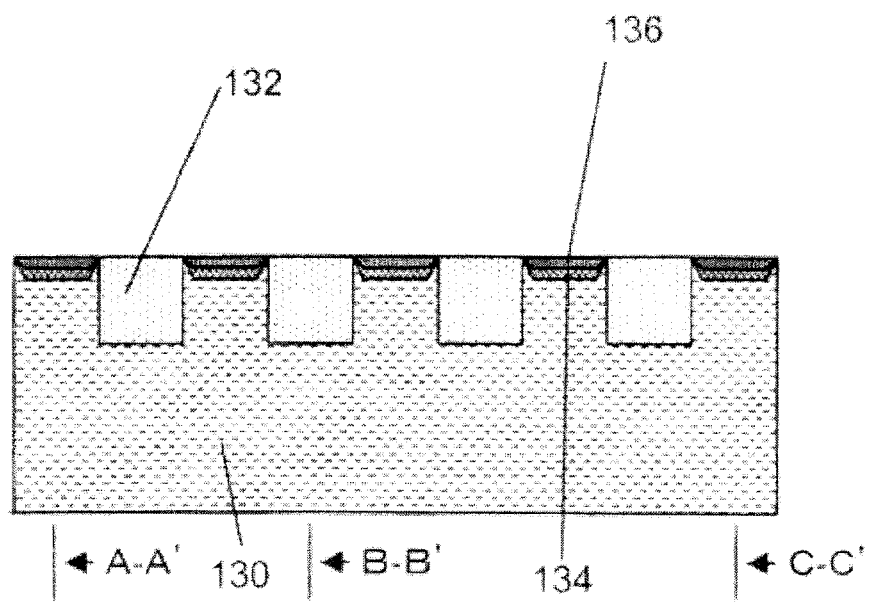
Figure 24:
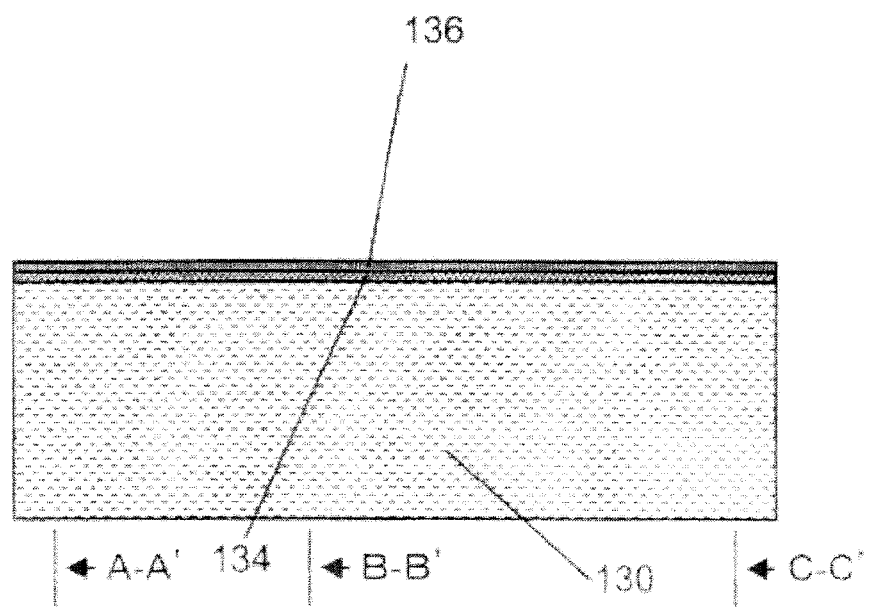

FIG. 23 and FIG. 24 are a top plan view and cross-sectional views, respectively, showing the step of forming a platinum silicide layer into a region between the pair of $Si_3N_4$ portions formed on each memory trench, where the P-implanted region is exposed. FIG. 24(a) is a cross-sectional view taken in the direction of arrows along A-A' of FIG. 23, FIG. 24(b) is a cross-sectional view taken in the direction of arrows along B-B' of FIG. 23, FIG. 24(c) is a cross-sectional view taken in the direction of arrows along C-C' of FIG. 23, FIG. 24(d) is a cross-sectional view taken in the direction of arrows along D-D' of FIG. 23, FIG. 24(e) is a cross-sectional view taken in the direction of arrows along E-E' of FIG. 23, and FIG. 24(f) is a cross-sectional view taken in the direction of arrows along F-F' of FIG. 23.

In a step (step S9) of forming a platinum silicide layer in a region between the pair of $Si_3N_4$ portions formed on each memory trench, where the P-implanted region is exposed, initially, platinum is deposited on the bottom surface of the memory trench by sputtering (condition: e.g., 5 nm). Then, platinum silicide is formed at a boundary region between the P-implanted region 134 and the deposited platinum layer by annealing (condition: e.g., 500 degrees C., 10 minutes). In this way, the platinum silicide layer 136 is formed. An unnecessary portion of the platinum layer is removed by a standard process.

Figure 25:
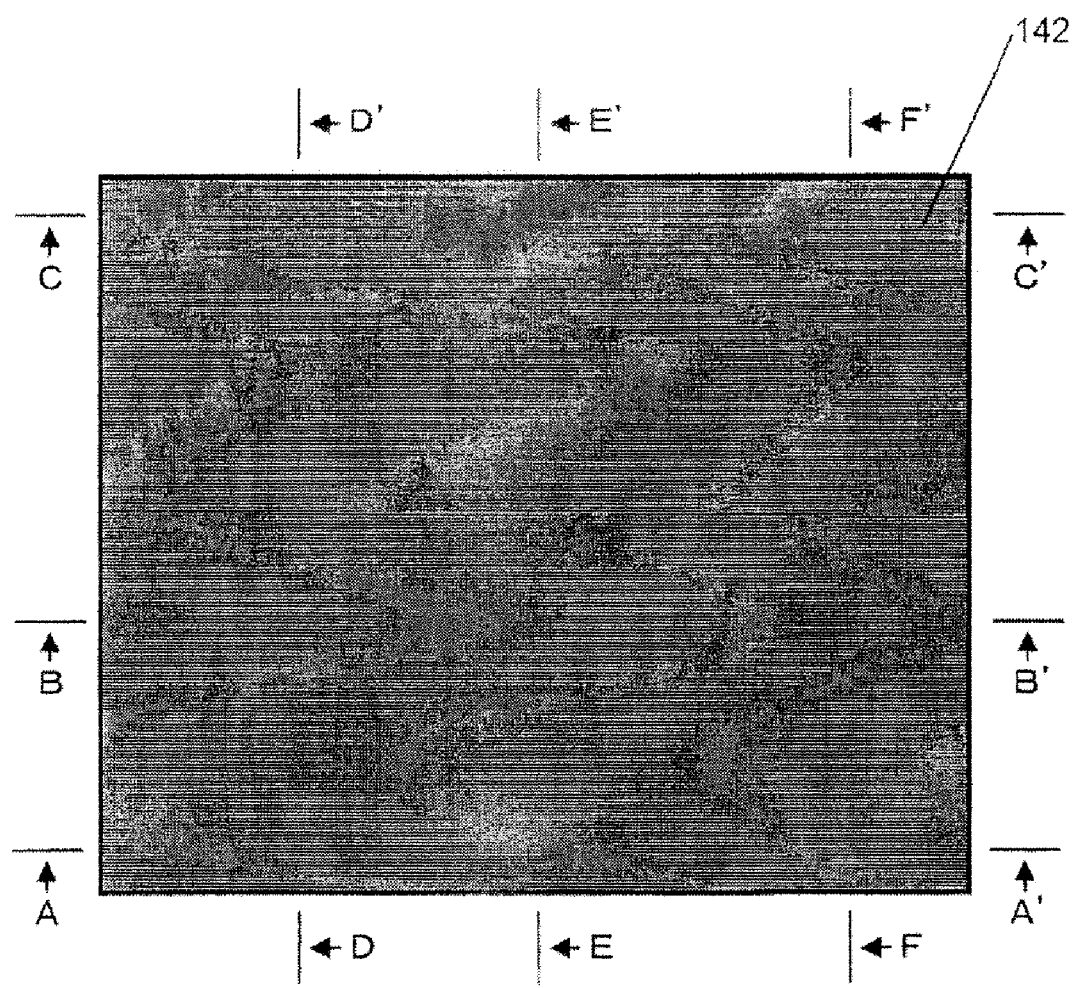
FIG. 25 is a top plan view showing the step of forming a tantalum oxide layer and a tantalum nitride layer over an entire surface including side surfaces and a bottom surface of each memory trench.
Figure 26:
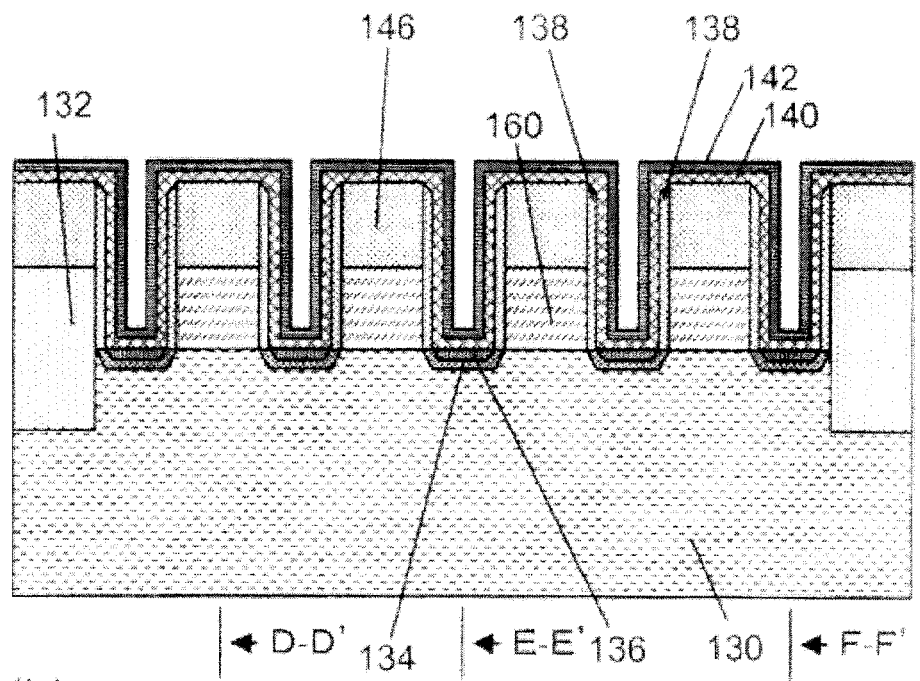
Figure 26:
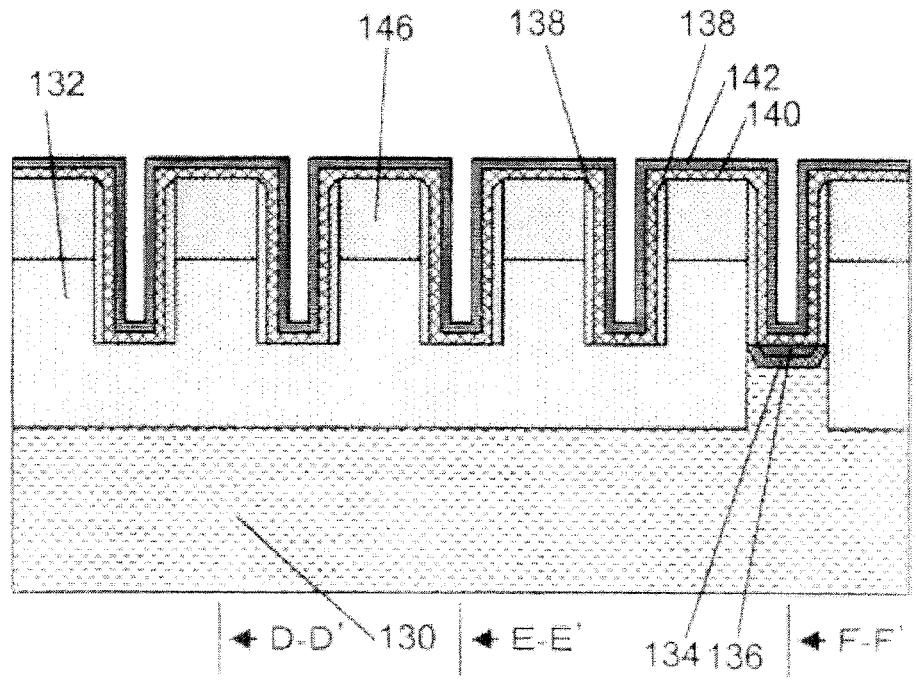
Figure 26C:
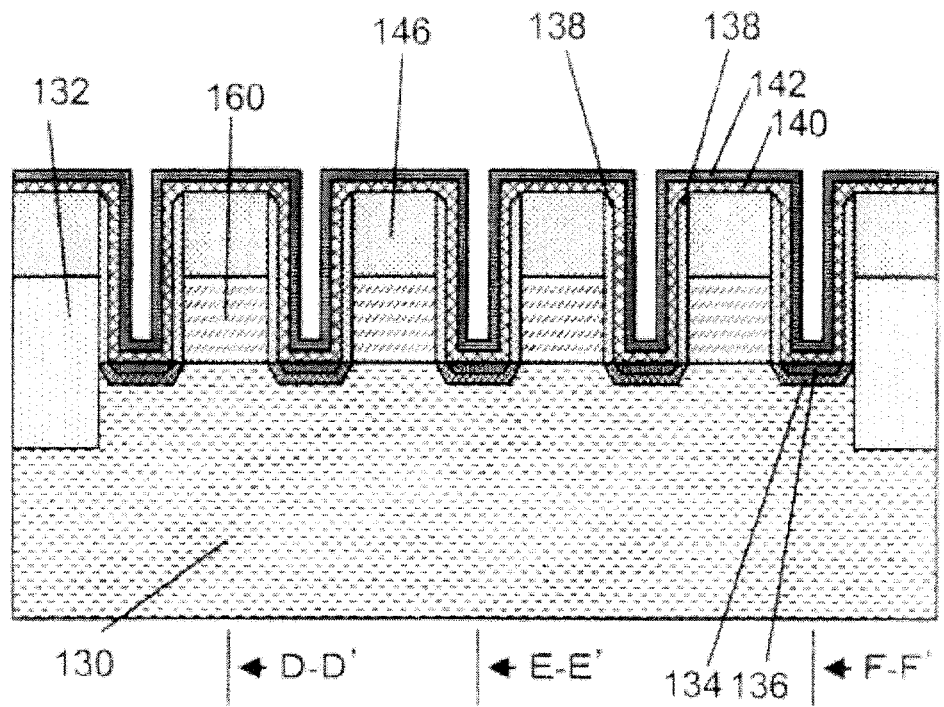
FIG. 26(c) is a cross-sectional view taken in the direction of arrows along C-C' of FIG. 25.
Figure 26D:
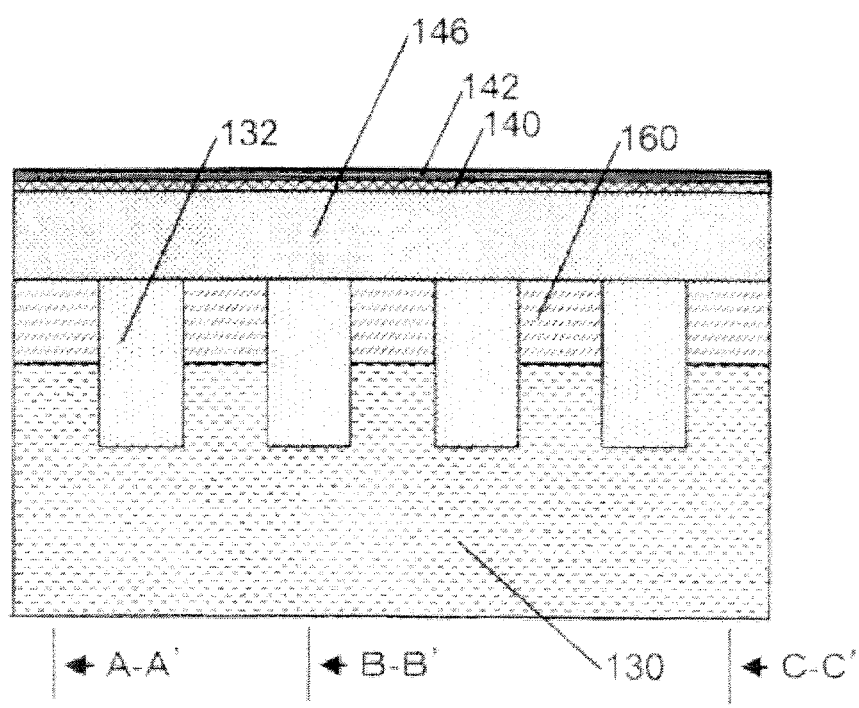
FIG. 26(d) is a cross-sectional view taken in the direction of arrows along D-D' of FIG. 25.
Figure 26:
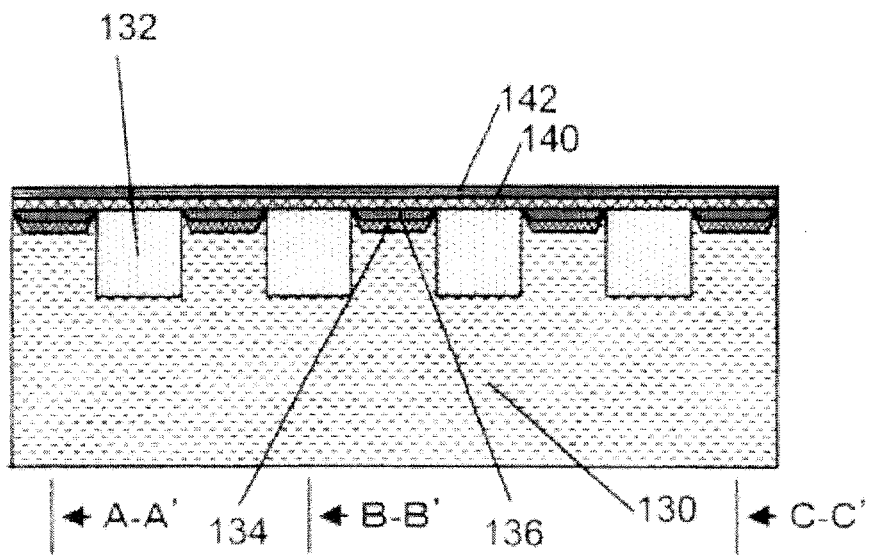
Figure 26:
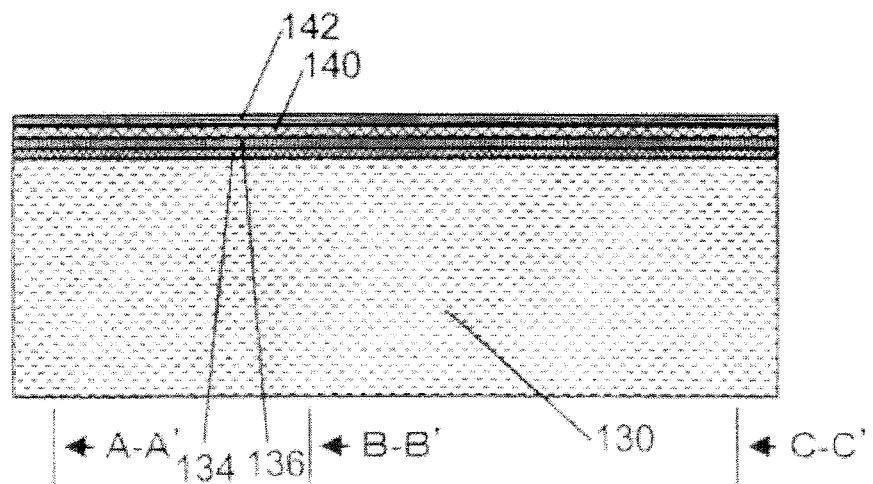

FIG. 25 and FIG. 26 are a top plan view and cross-sectional views, respectively, showing the step of forming a tantalum oxide layer and a tantalum nitride layer over an entire surface including side surfaces and a bottom surface of each memory trench. FIG. 26(a) is a cross-sectional view taken in the direction of arrows along A-A' of FIG. 25, FIG. 26(b) is a cross-sectional view taken in the direction of arrows along B-B' of FIG. 25, FIG. 26(c) is a cross-sectional view taken in the direction of arrows along C-C' of FIG. 25, FIG. 26(d) is a cross-sectional view taken in the direction of arrows along D-D' of FIG. 25, FIG. 26(e) is a cross-sectional view taken in the direction of arrows along E-E' of FIG. 25, and FIG. 26(f) is a cross-sectional view taken in the direction of arrows along F-F' of FIG. 25.

In a step (step S10) of forming the tantalum oxide layer and the tantalum nitride layer over the entire surface of each memory trench, including the side surfaces and the bottom surfaces, the tantalum oxide is deposited to form the tantalum oxide layer 140 by sputtering (e.g., in reactive sputtering, the oxygen content can be made higher by setting the oxygen flow rate higher during the deposition, in this embodiment, oxygen content is about 72 atm % under conditions of argon 34 sccm, oxygen 24 sccm, and power 1.6 kW). Then, by sputtering in argon and nitrogen gas atmosphere using a tantalum target, i.e., by reactive sputtering, tantalum nitride is deposited to form the tantalum nitride layer 142. In this case, the thickness of the tantalum oxide layer is determined so that the thickness of the side walls is properly ensured (e.g., 3 nm) in view of a level difference covering ratio (ratio of dimension between the side walls and the flat region). When the level difference covering ratio is, for example, 10%, the tantalum oxide is deposited so that the flat region (including the bottom surface of the memory trench) is 30 nm. In this case, the thickness of the tantalum oxide layer 140 on the side walls is about 3 nm.

Figure 27:
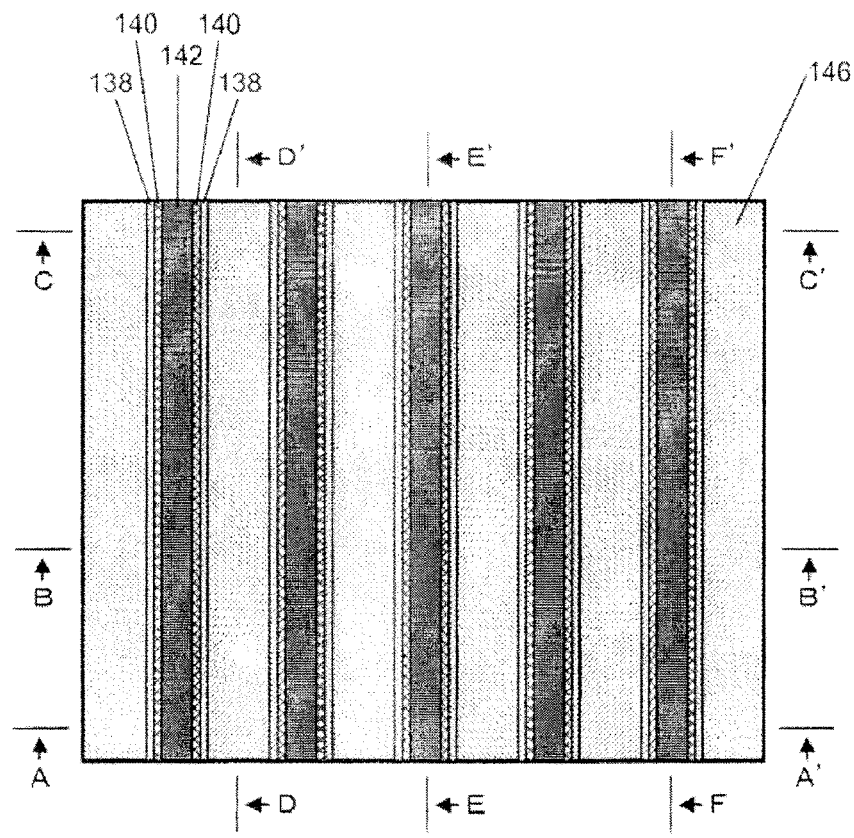
FIG. 27 is a top plan view showing the step of removing the tantalum oxide layer and the tantalum nitride layer except for the portion of the tantalum oxide layer and the portion of the tantalum nitride layer which are present inside the memory trench.
Figure 28:
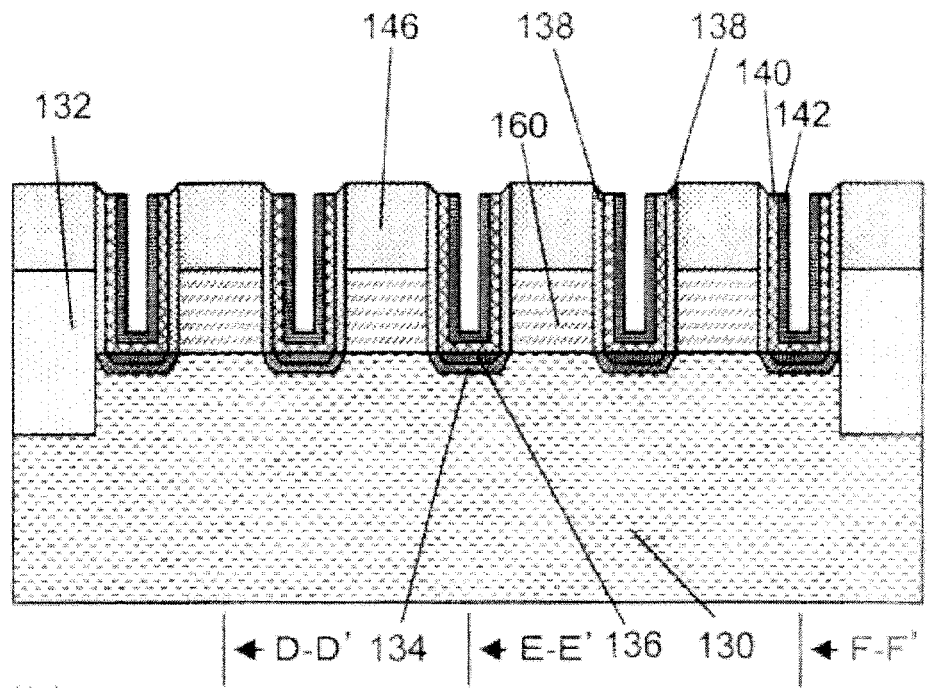
Figure 28:
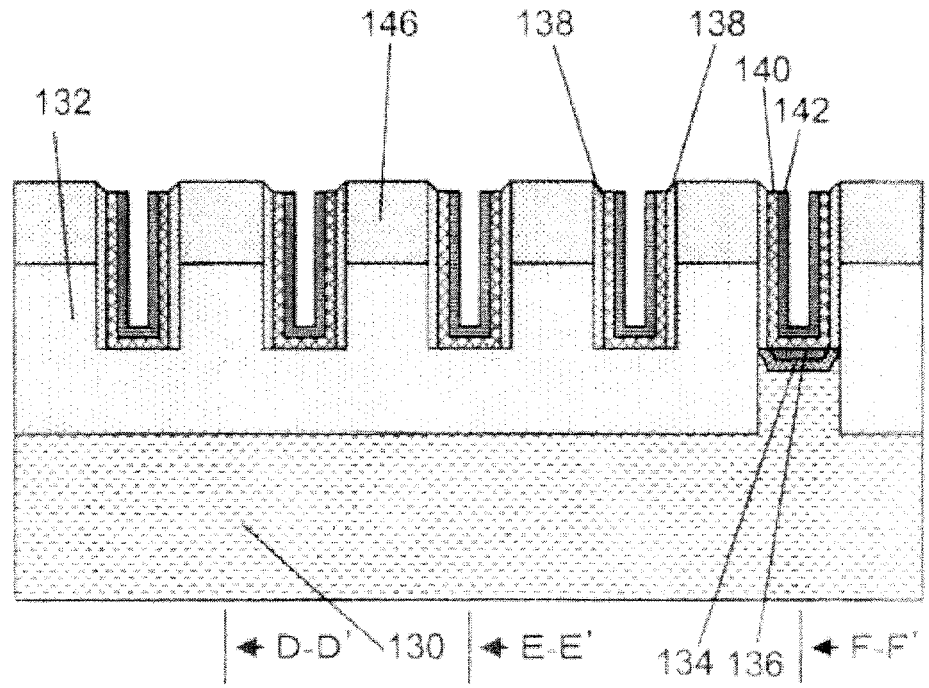
Figure 28:
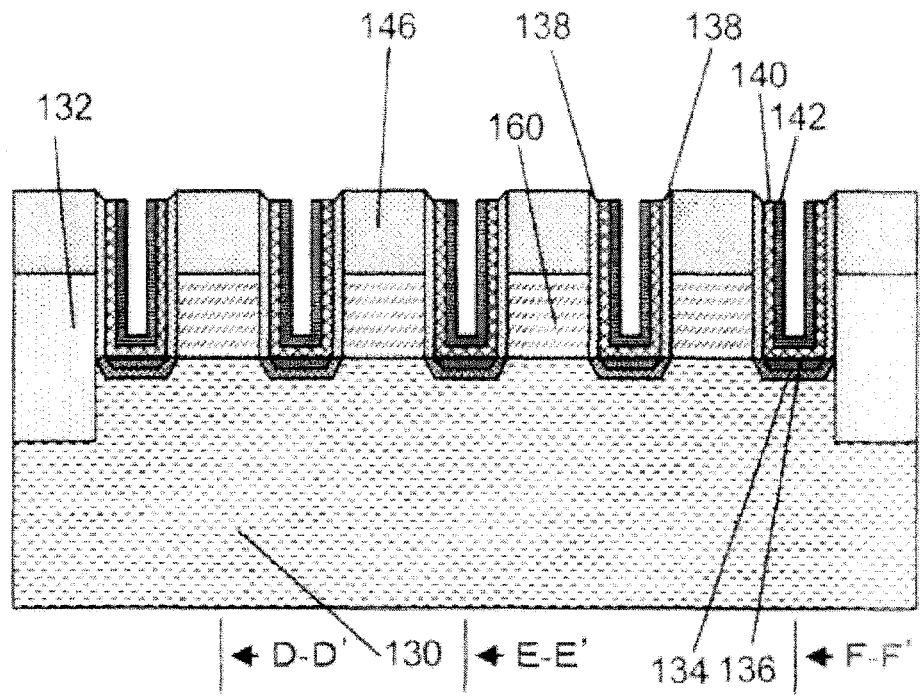
Figure 28:
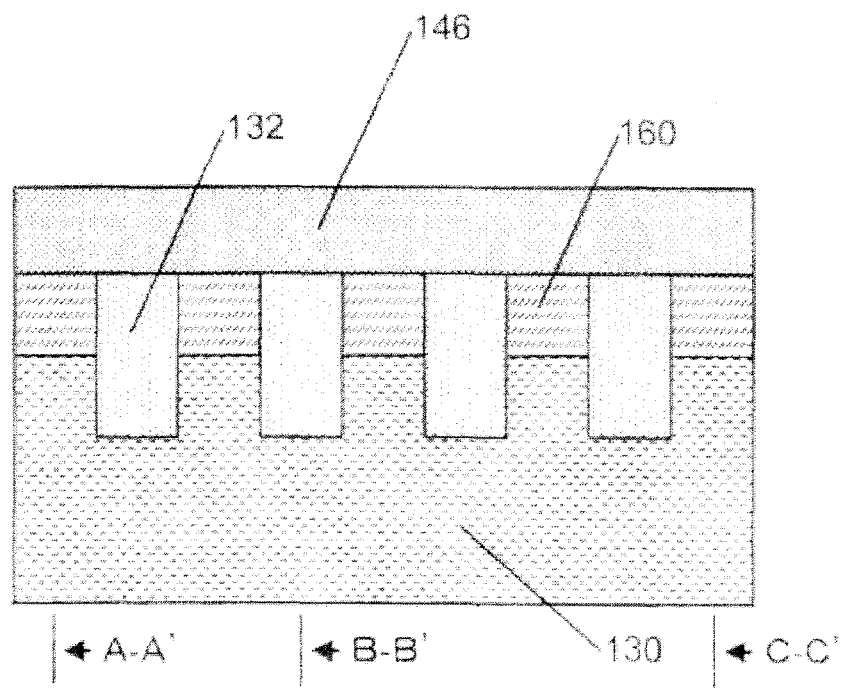
Figure 28:
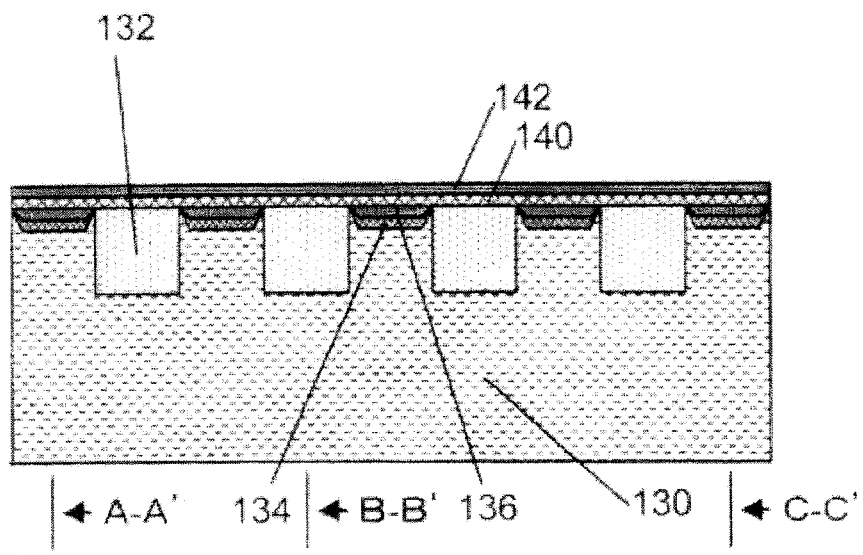
Figure 28:
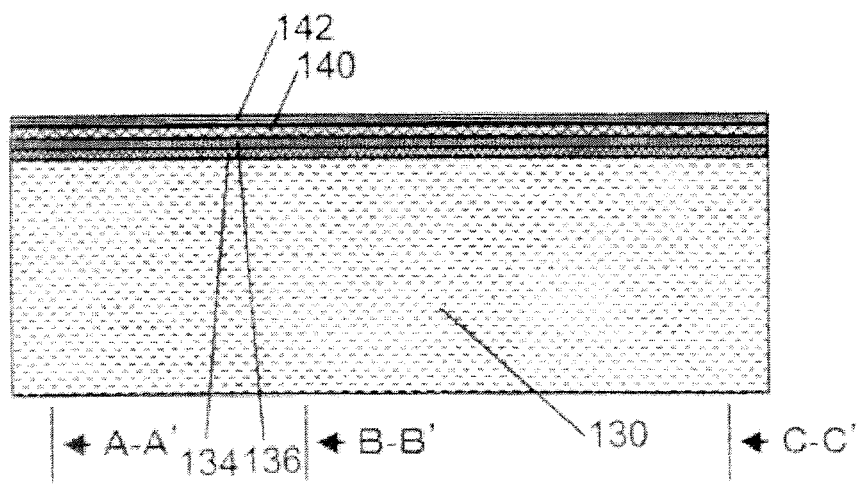

FIG. 27 and FIG. 28 are a top plan view and cross-sectional views, respectively, showing the step of removing the tantalum oxide layer and the tantalum nitride layer except for a portion of the tantalum oxide layer and a portion of the tantalum nitride layer which are present inside the memory trench. FIG. 28(a) is a cross-sectional view taken in the direction of arrows along A-A' of FIG. 27, FIG. 28(b) is a cross-sectional view taken in the direction of arrows along B-B' of FIG. 27, FIG. 28(c) is a cross-sectional view taken in the direction of arrows along C-C' of FIG. 27, FIG. 28(d) is a cross-sectional view taken in the direction of arrows along D-D' of FIG. 27, FIG. 28(e) is a cross-sectional view taken in the direction of arrows along E-E' of FIG. 27, and FIG. 28(f) is a cross-sectional view taken in the direction of arrows along F-F' of FIG. 27.

In a step (step S11) of removing the tantalum oxide layer and the tantalum nitride layer except for a portion of the tantalum oxide layer and a portion of the tantalum nitride layer which are present inside the memory trench, the tantalum oxide layer 140 and the tantalum nitride layer 142 except for a portion of the tantalum oxide layer 140 and a portion of the tantalum nitride layer 142 which are present inside the memory trench, are removed. In this case, the upper end surface of the tantalum oxide layer 140 and the upper end surface of the tantalum nitride layer 142 are controlled to be lower than the upper end surface of the Si$_3$N$_4$ layer 146 by increasing a polishing pressure or polishing time of CMP. This is achieved by etch back instead of adjusting the conditions of CMP.

Figure 29:
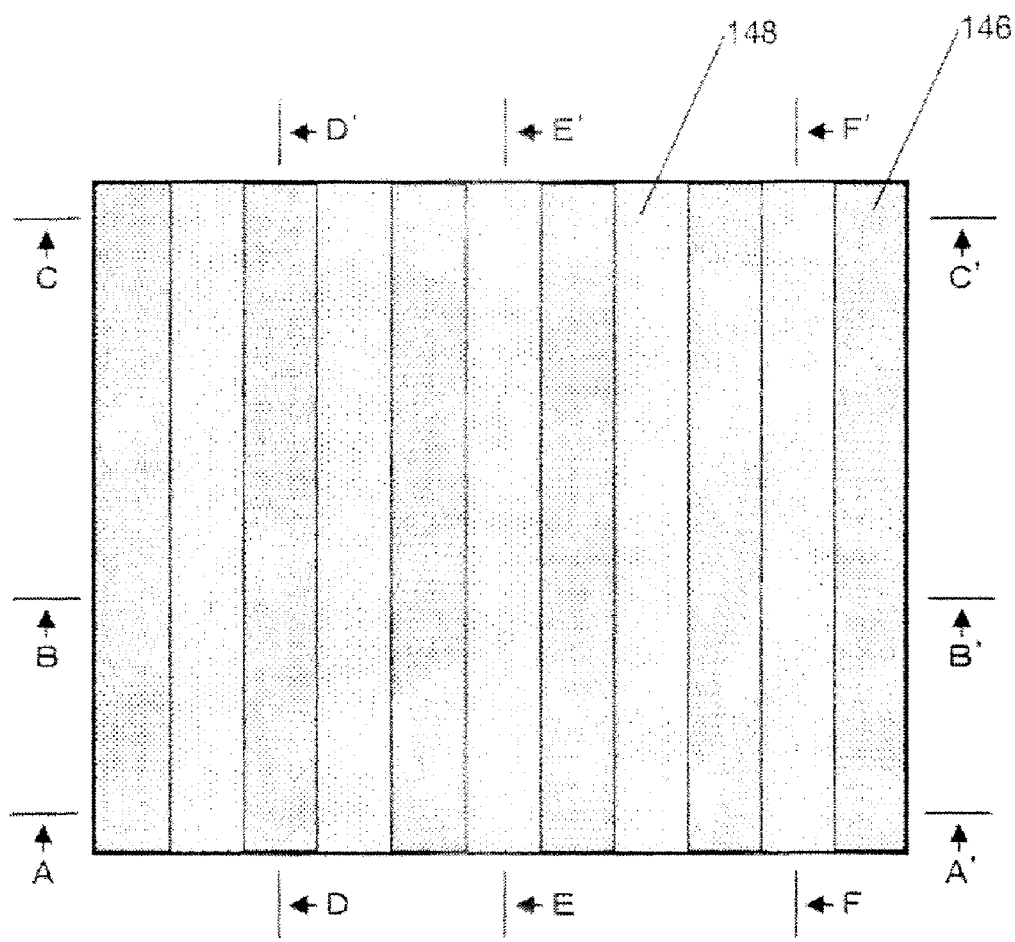
FIG. 29 is a top plan view showing the step of forming a tungsten layer into a trench formed inside the tantalum nitride layer and forming a silicon dioxide layer into a recess.
Figure 30A:
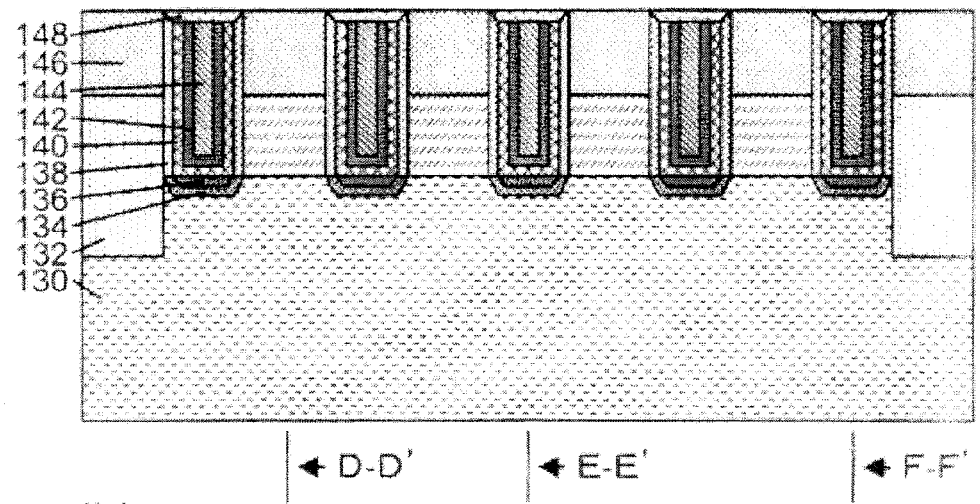
FIG. 30(a) is a cross-sectional view taken in the direction of arrows along A-A' of FIG. 29.
Figure 30B:
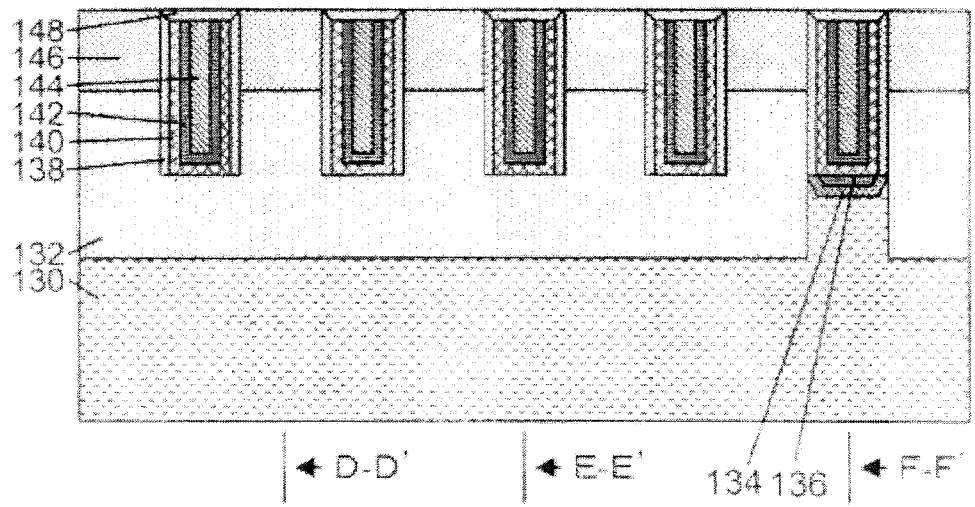
FIG. 30(b) is a cross-sectional view taken in the direction of arrows along B-B' of FIG. 29.
Figure 30:
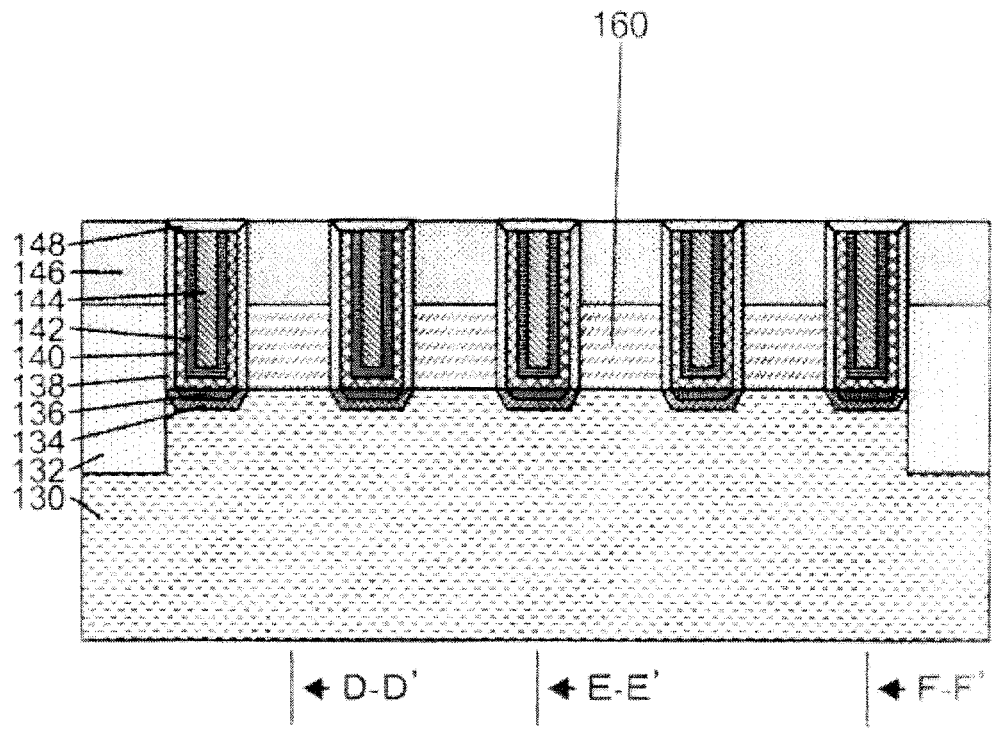
Figure 30:
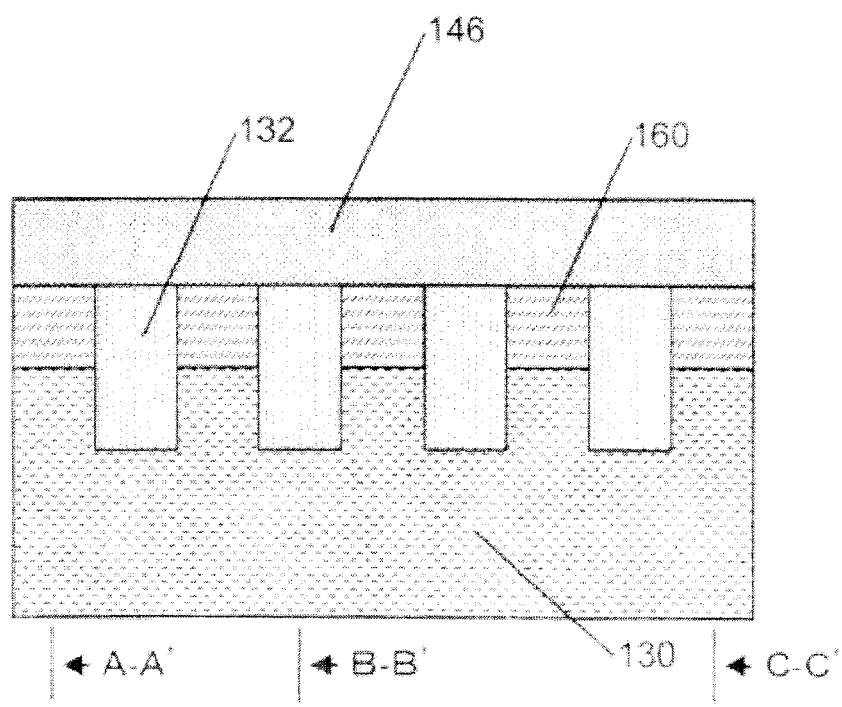
Figure 30:
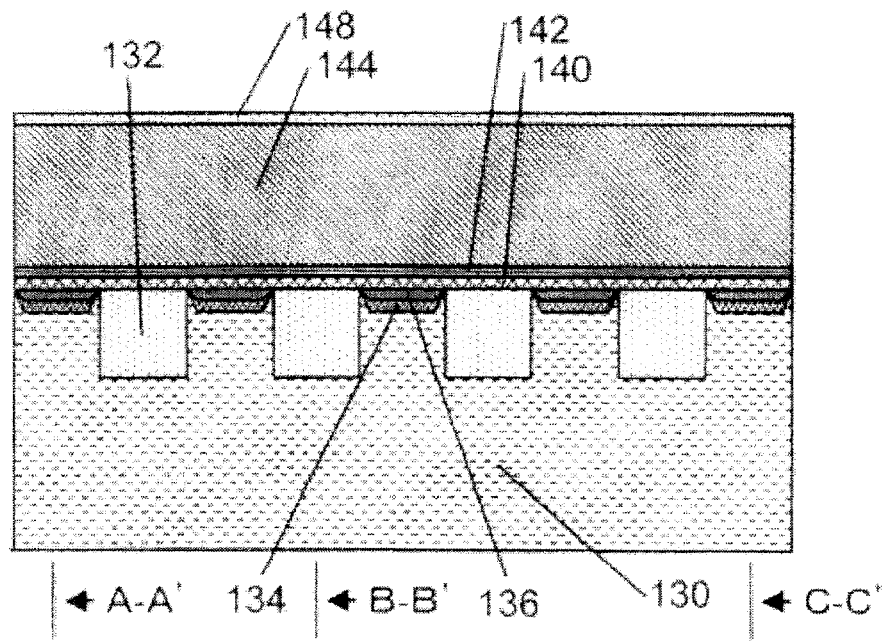
Figure 30:
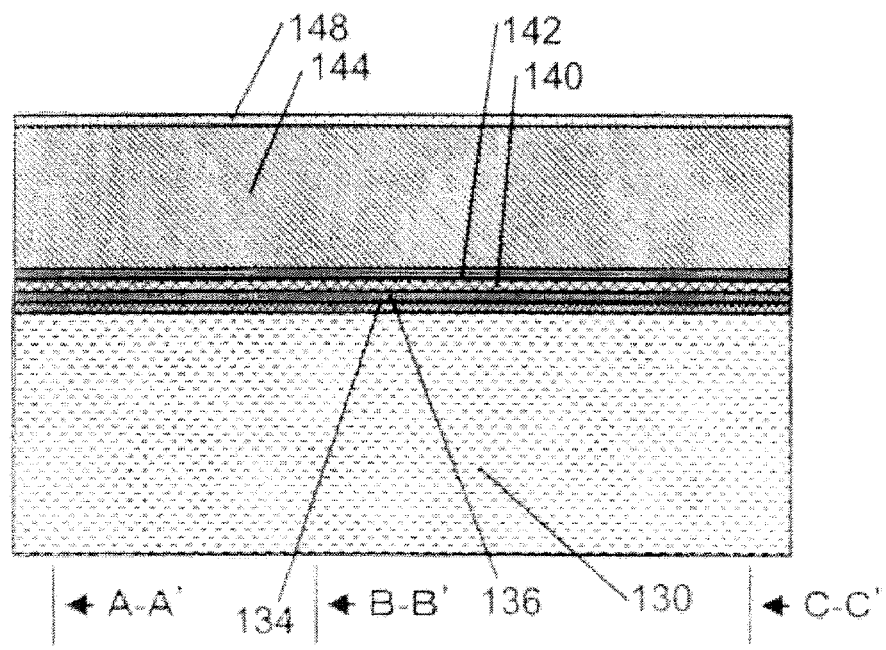

FIG. 29 and FIG. 30 are a top plan view and cross-sectional views, respectively showing the step of forming a tungsten layer into the trench formed inside the tantalum nitride layer and forming the silicon dioxide layer into a recess. FIG. 30(a) is a cross-sectional view taken in the direction of arrows along A-A' of FIG. 29, FIG. 30(b) is a cross-sectional view taken in the direction of arrows along B-B' of FIG. 29, FIG. 30(c) is a cross-sectional view taken in the direction of arrows along C-C' of FIG. 29, FIG. 30(d) is a cross-sectional view taken in the direction of arrows along D-D' of FIG. 29, FIG. 30(e) is a cross-sectional view taken in the direction of arrows along E-E' of FIG. 29, and FIG. 30(f) is a cross-sectional view taken in the direction of arrows along F-F' of FIG. 29.

In a step (step S12) of forming the tungsten layer into the trench formed inside the tantalum nitride layer and forming the silicon dioxide layer into the recess, a tungsten layer 144 is formed to fill the trench formed inside the tantalum nitride layer 142 to extend in the forward and rearward direction. This is performed by CVD and CMP. Then, silicon dioxide is filled into the recess defined by the Si$_3$N$_4$ portions 138 (side walls), the tantalum oxide layer 140, the tantalum nitride layer 142, and the tungsten layer 144, to form the silicon diode layer 148. This is accomplished by deposition of TEOS (about 50 nm) by CVD and by conducting CMP.

Figure 31:
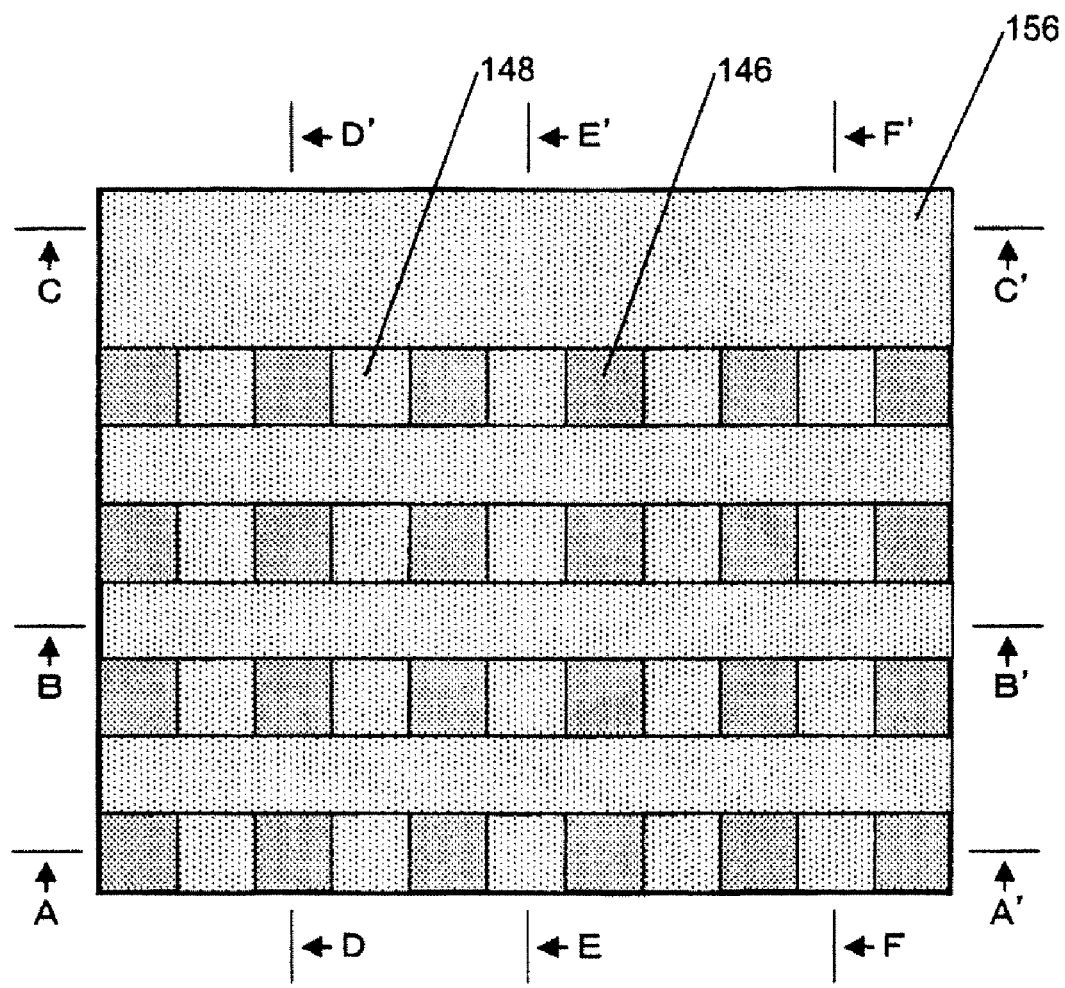
FIG. 31 is a top plan view showing the step of forming a silicon dioxide layer over the entire surface and forming a trench into which a word line is filled.
Figure 32:
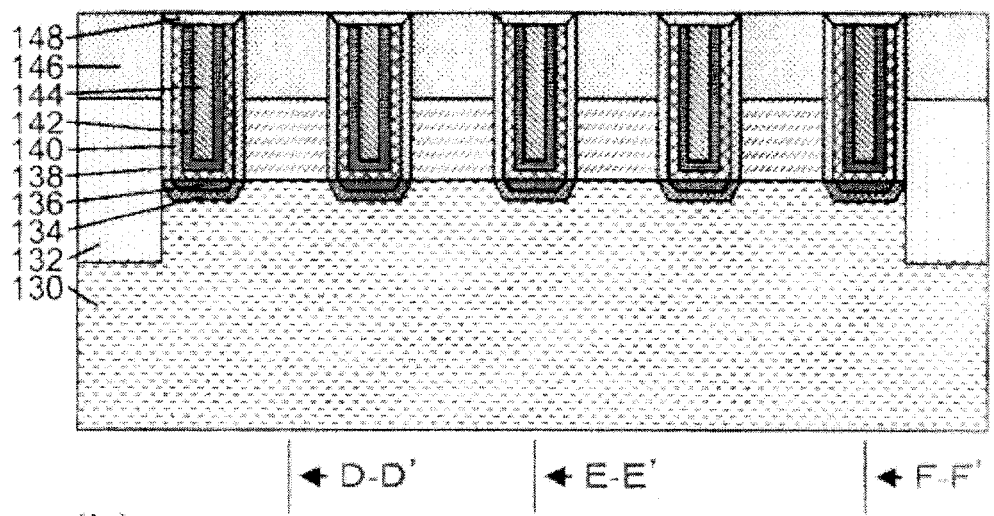
Figure 32:
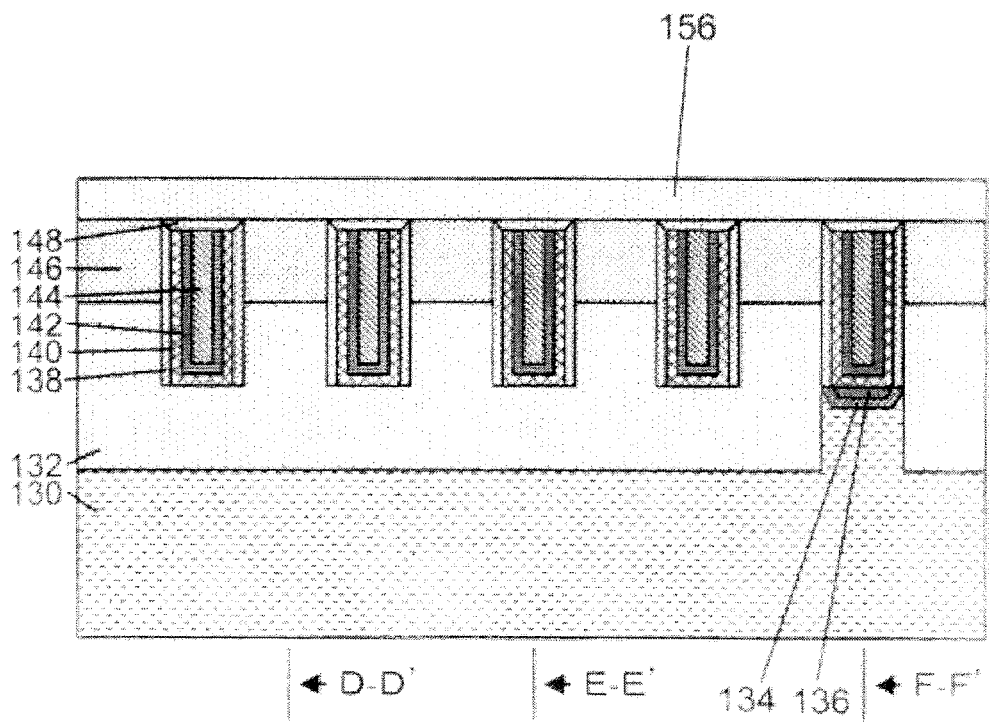
Figure 32:
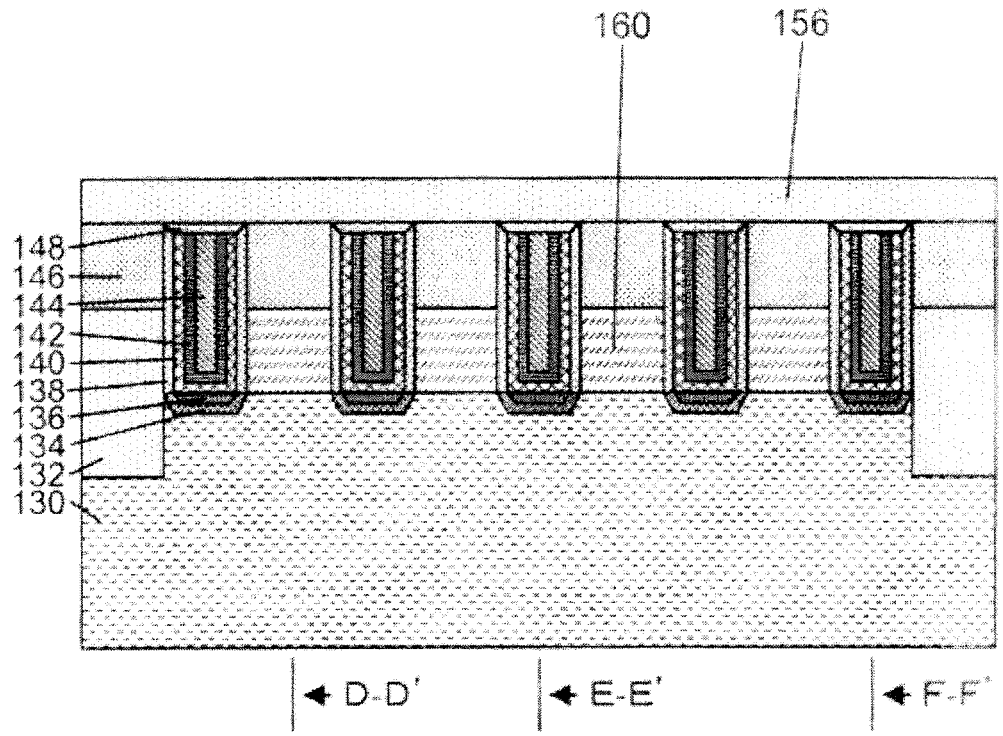
Figure 32:
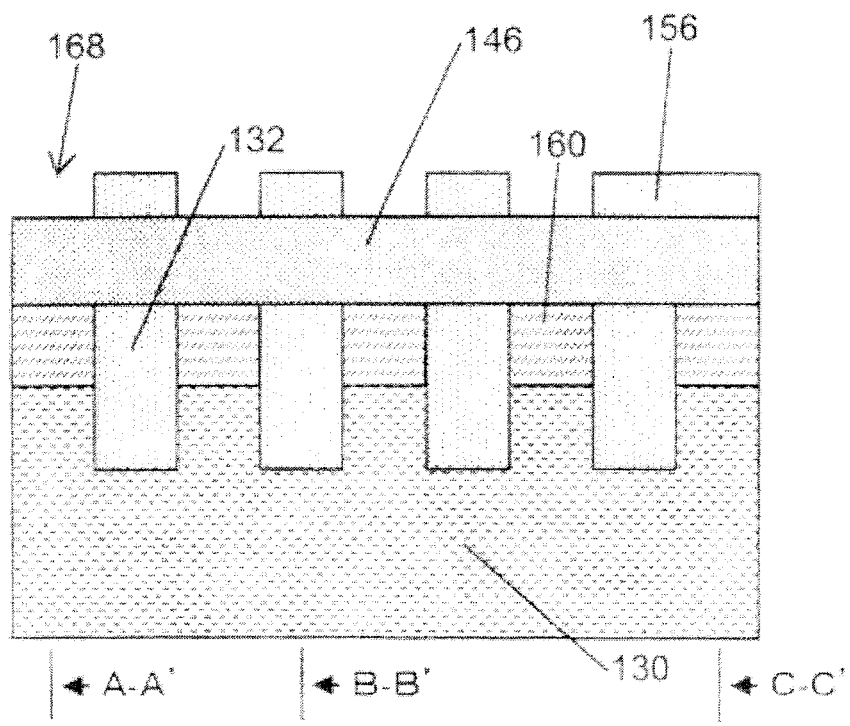
Figure 32:
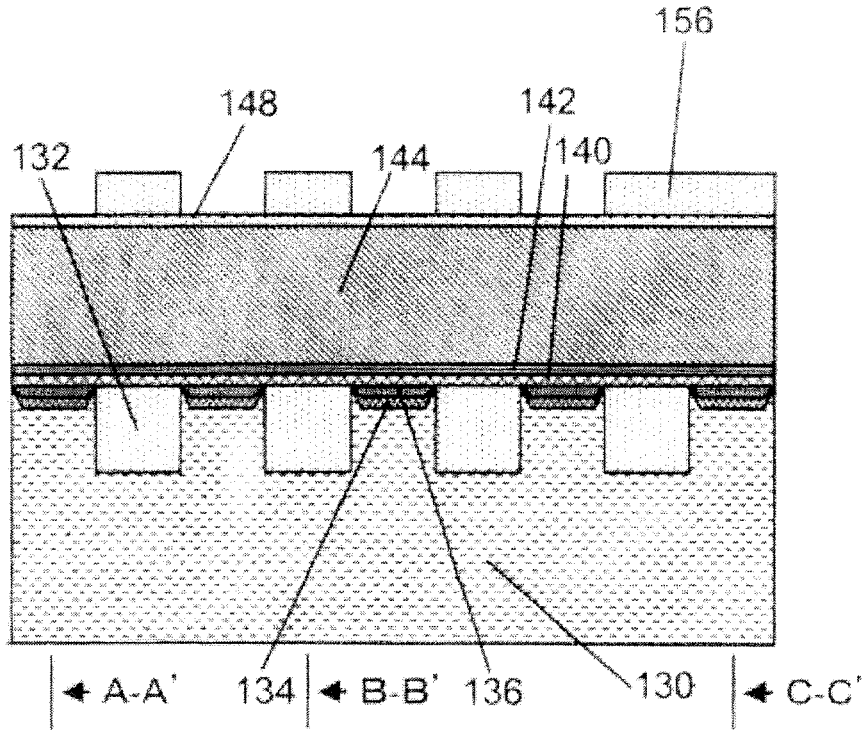
Figure 32:
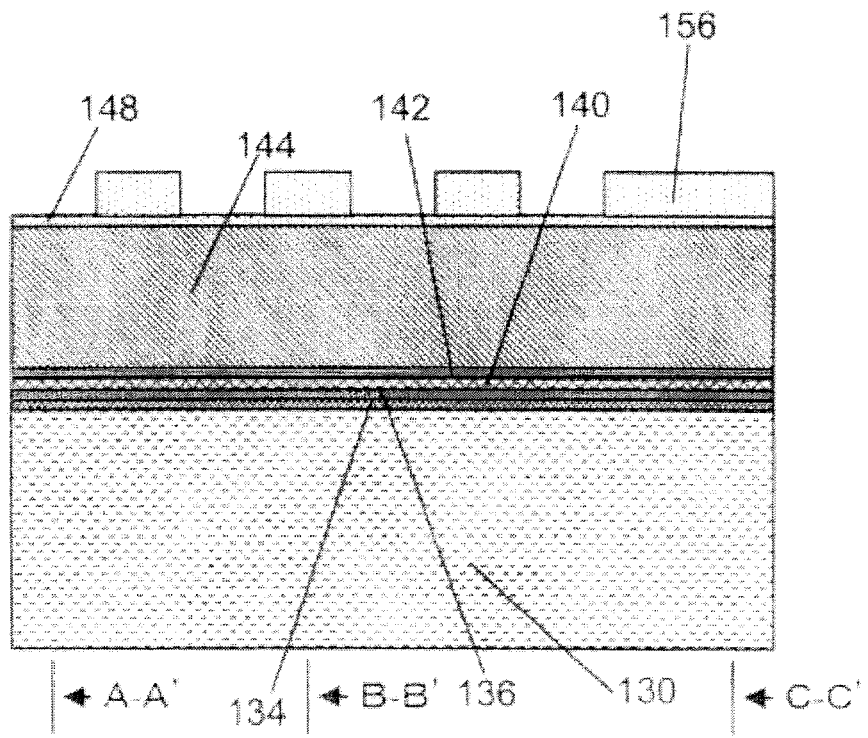

FIG. 31 and FIG. 32 are a top plan view and cross-sectional views, respectively, showing the step of forming the silicon dioxide layer over the entire surface and forming the trench into which the word line is filled. FIG. 32(a) is a cross-sectional view taken in the direction of arrows along A-A' of FIG. 31, FIG. 32(b) is a cross-sectional view taken in the direction of arrows along B-B' of FIG. 31, FIG. 32(c) is a cross-sectional view taken in the direction of arrows along C-C' of FIG. 31, FIG. 32(d) is a cross-sectional view taken in the direction of arrows along D-D' of FIG. 31, FIG. 32(e) is a cross-sectional view taken in the direction of arrows along E-E' of FIG. 31, and FIG. 32(f) is a cross-sectional view taken in the direction of arrows along F-F' of FIG. 31.

In a step (step S13) of forming the silicon dioxide layer over the entire surface and forming the trench into which the word wire WL is filled, TEOS oxide is deposited by CVD and a part of silicon dioxide is removed by etching using a mask to form the trench 168 into which the word line WL is filled, thereby exposing a portion of the Si$_3$N$_4$ layer 146 where the control electrode T3 (gate) of the transistor is formed (see FIG. 31).

Figure 33:
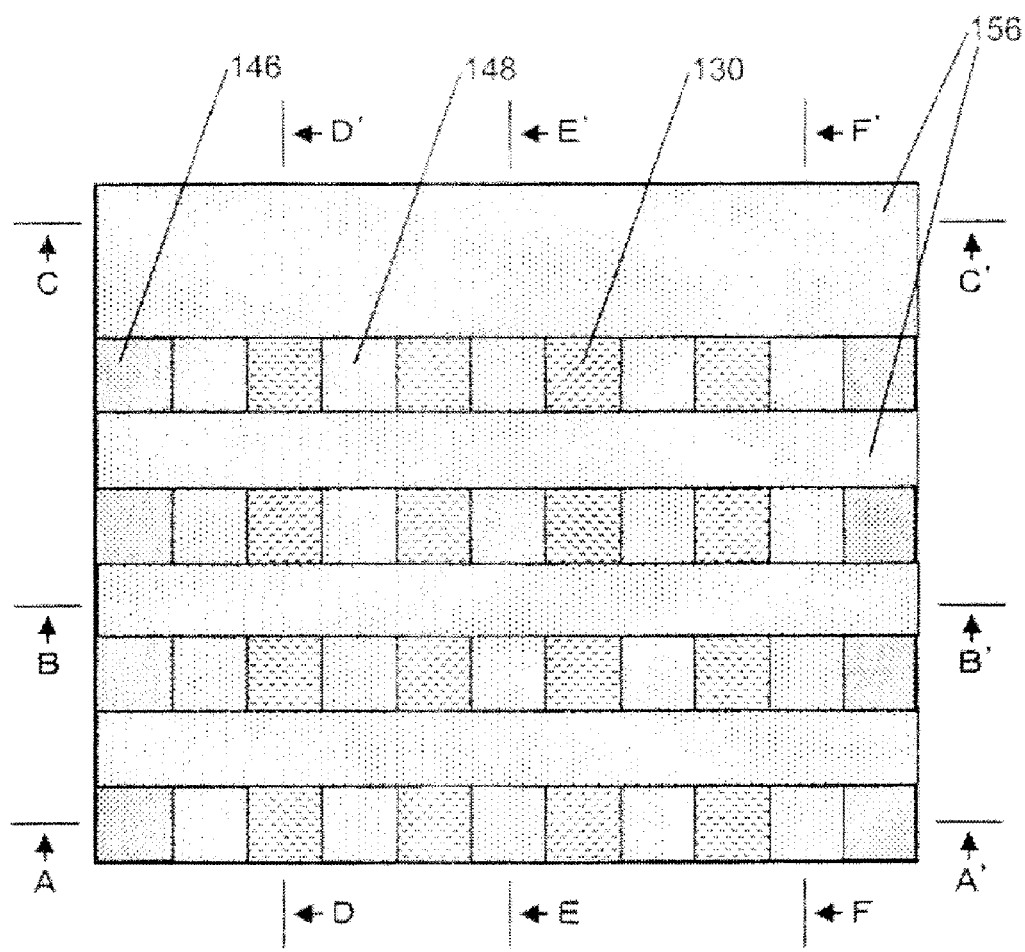
FIG. 33 is a top plan view showing the step of forming a hole into which a control electrode (gate) of a transistor is filled.
Figure 34:
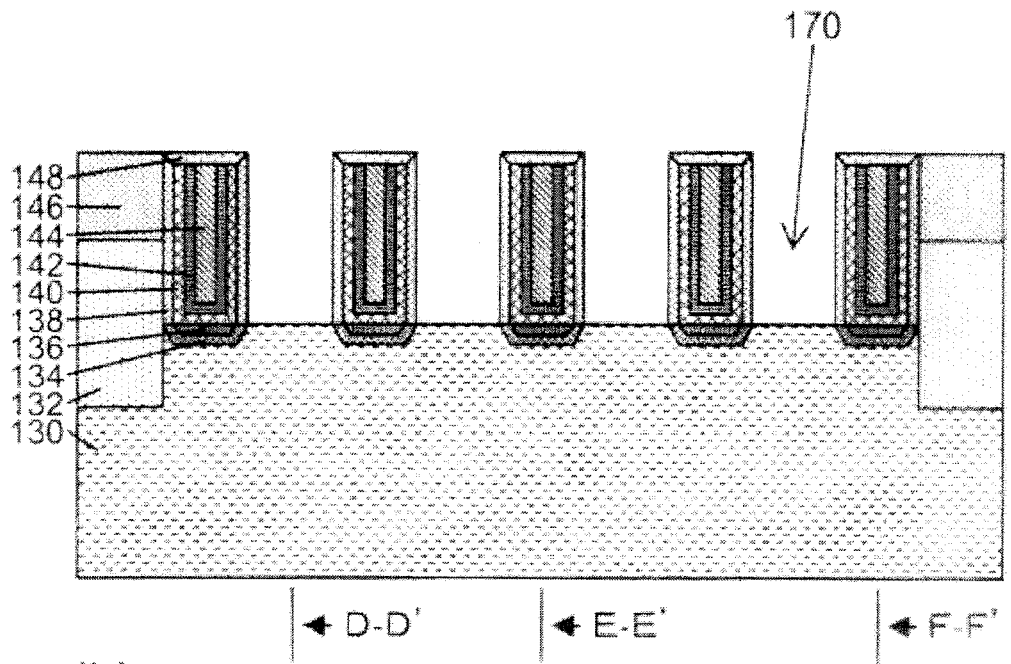
Figure 34:
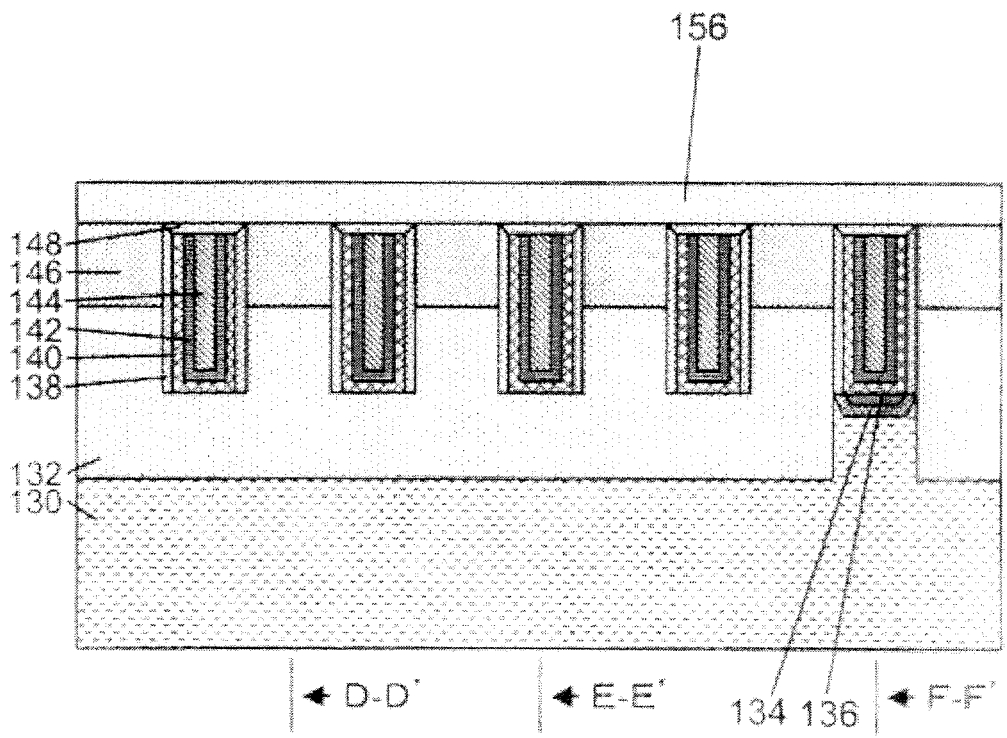
Figure 34:
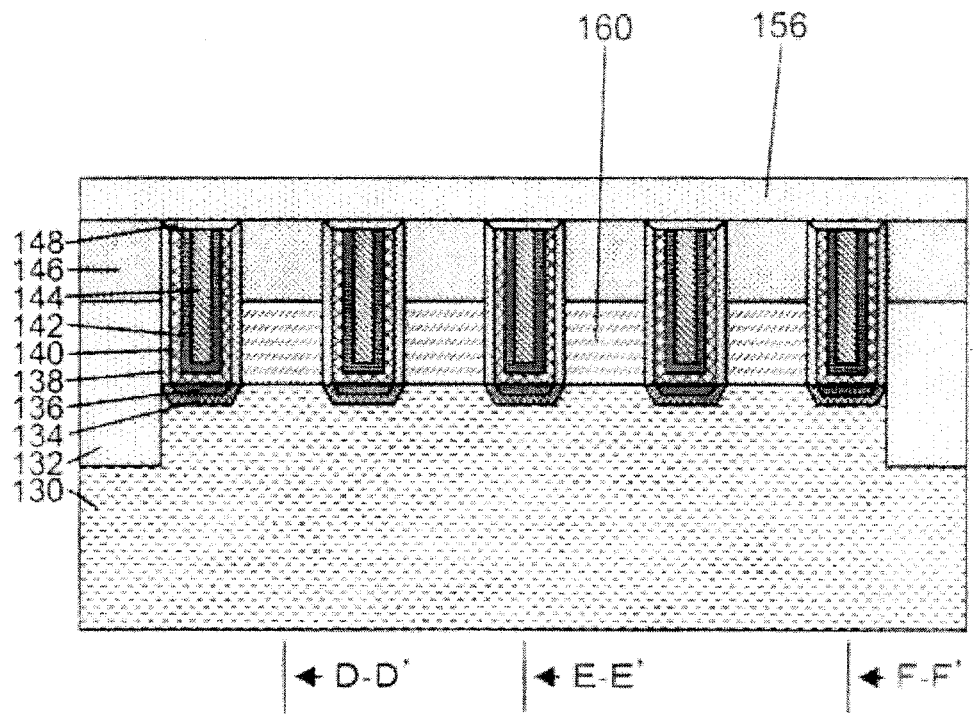
Figure 34:
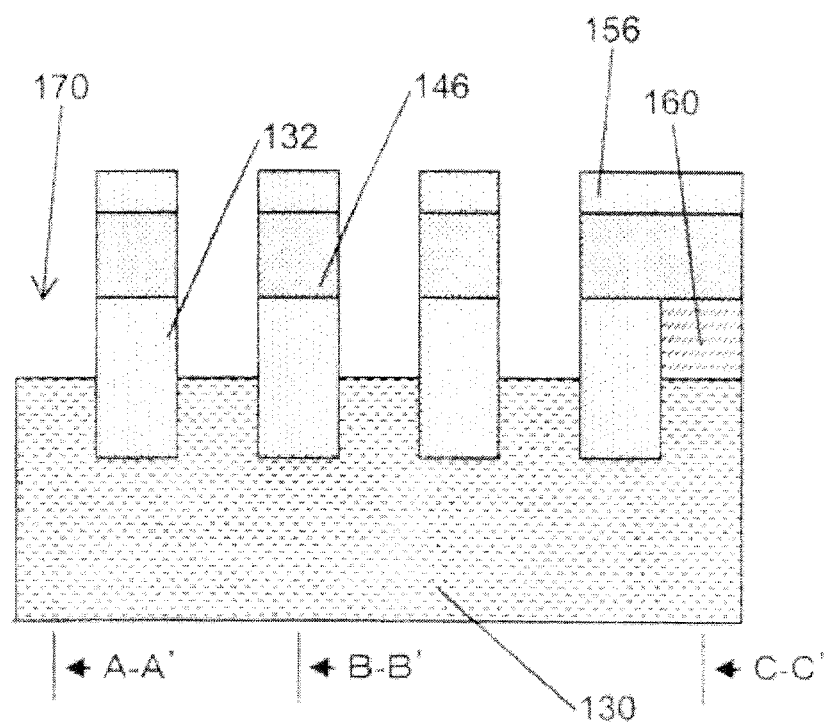
Figure 34:
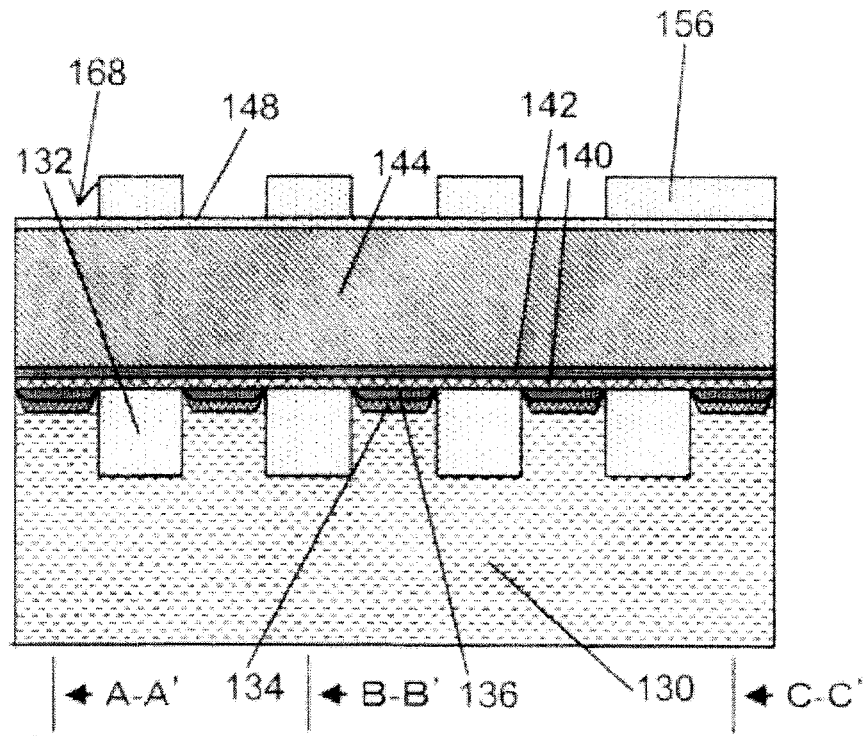
Figure 34:
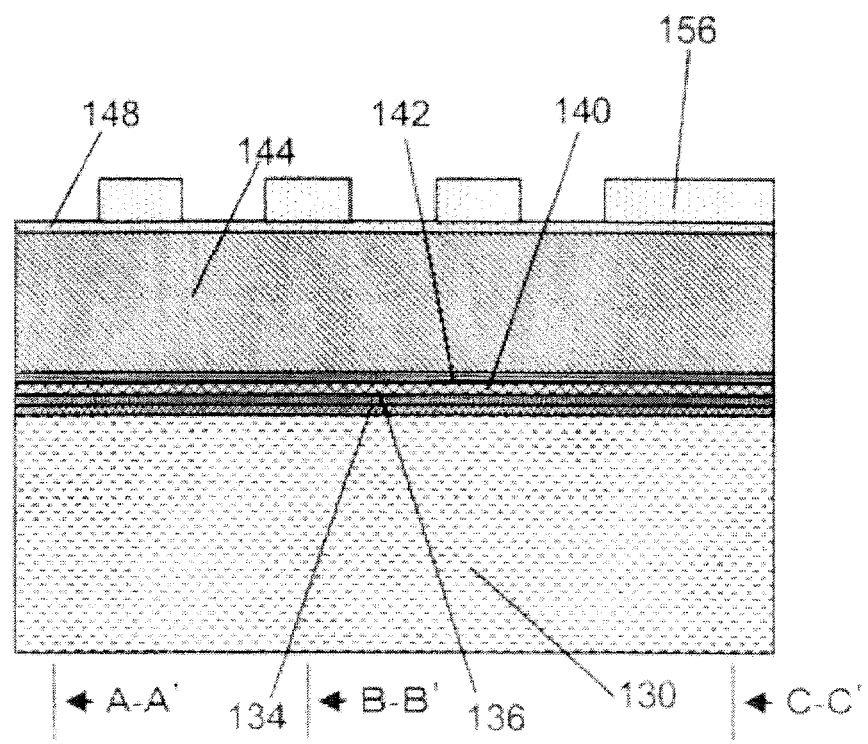

FIG. 33 and FIG. 34 are a top plan view and cross-sectional views, respectively, showing the step of forming a hole into which the control electrode (gate) of the transistor is filled. FIG. 34(a) is a cross-sectional view taken in the direction of arrows along A-A' of FIG. 33, FIG. 34(b) is a cross-sectional view taken in the direction of arrows along B-B' of FIG. 33, FIG. 34(c) is a cross-sectional view taken in the direction of arrows along C-C' of FIG. 33, FIG. 34(d) is a cross-sectional view taken in the direction of arrows along D-D' of FIG. 33, FIG. 34(e) is a cross-sectional view taken in the direction of arrows along E-E' of FIG. 33, and FIG. 34(f) is a cross-sectional view taken in the direction of arrows along F-F' of FIG. 33.

In a step (step S14) of forming the hole into which the control electrode (gate) of the transistor is filled, a portion of the Si$_3$N$_4$ layer 146 where the control electrode T3 (gate) of the transistor is formed is removed by dry etching using a mask. The polysilicon layer 160 is dissolvable in an alkaline solution such as TMAH. Alternatively, chemical dry etching using CF$_4$ and O$_2$ may be used. In this way, a hole 170 into which the control electrode (gate) of the transistor is filled is formed.

Figure 35:
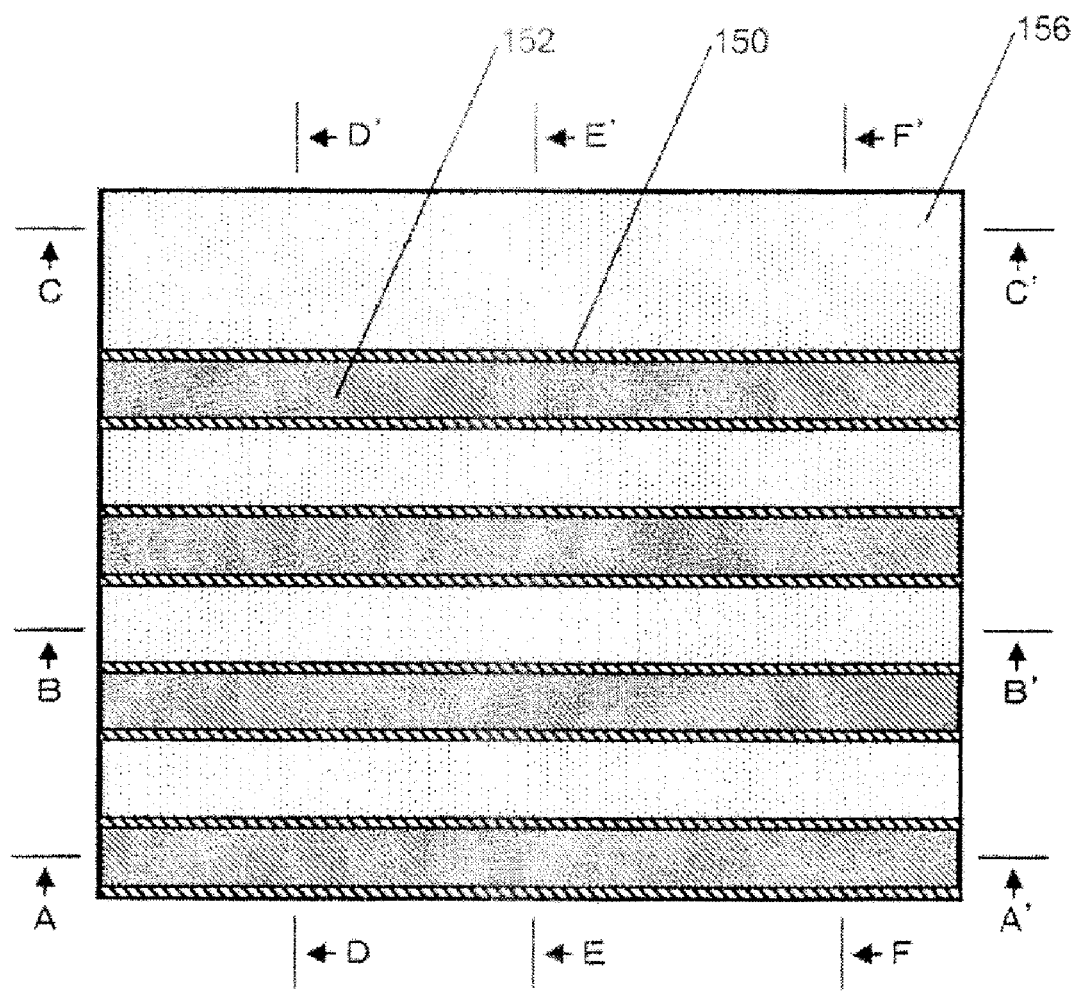
FIG. 35 is a top plan view showing the step of forming the word line and the control electrode (gate) of the transistor.
Figure 36:
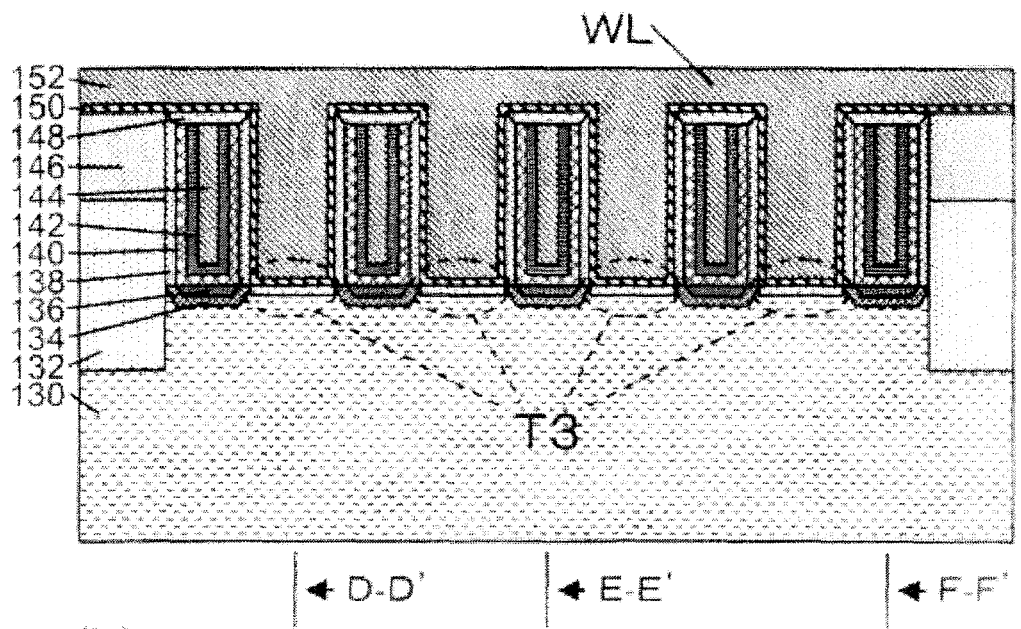
Figure 36:
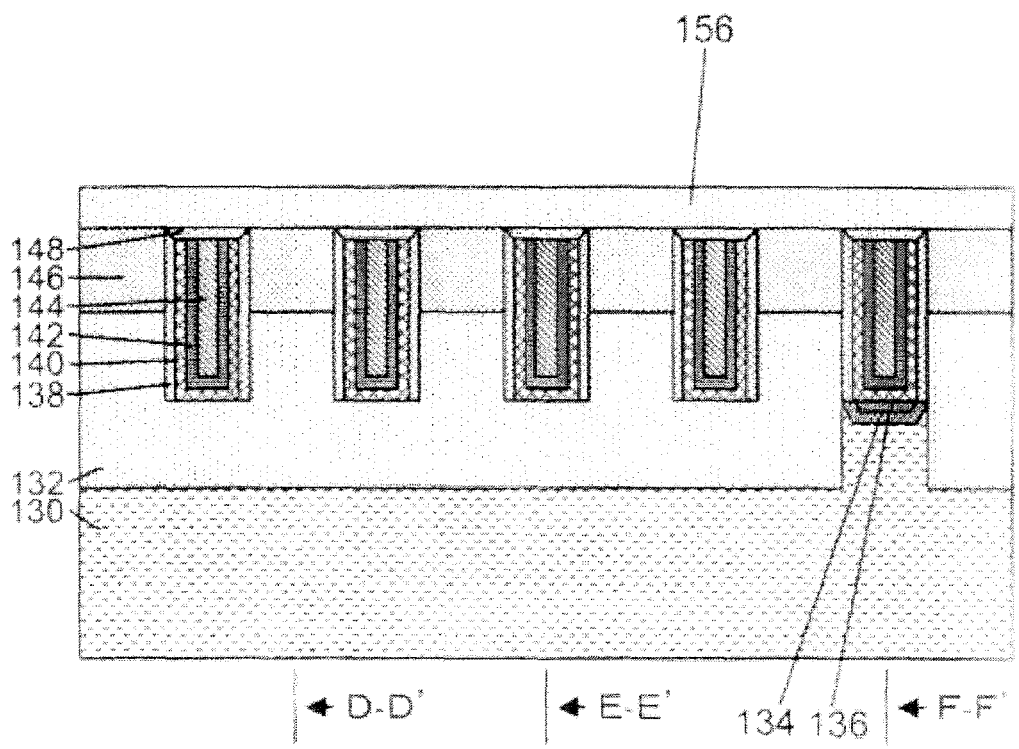
Figure 36:
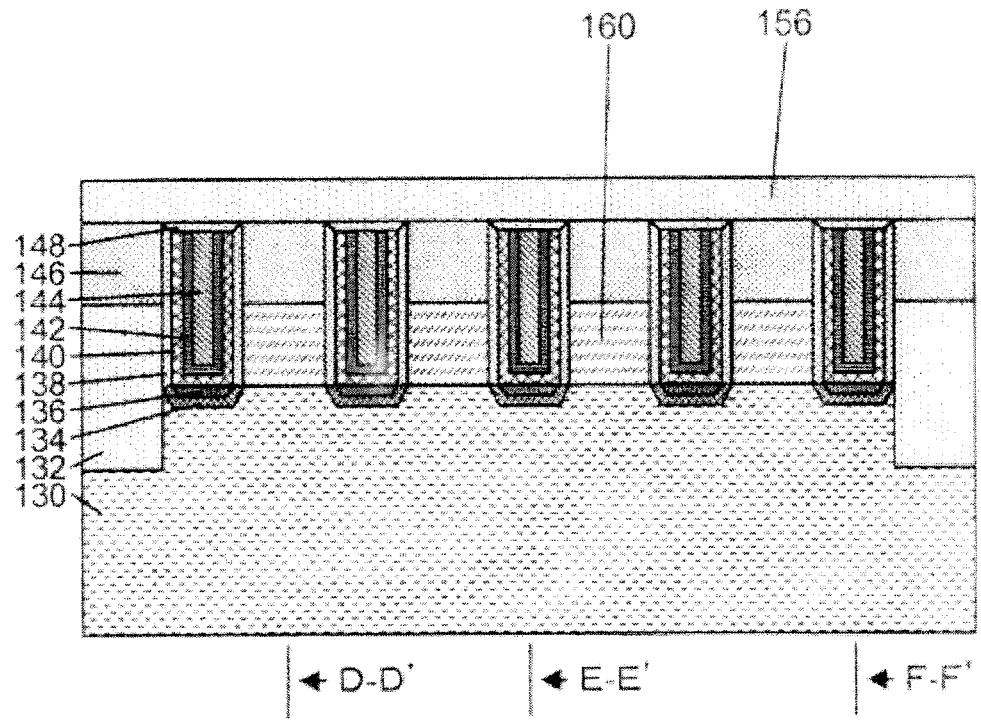
Figure 36:
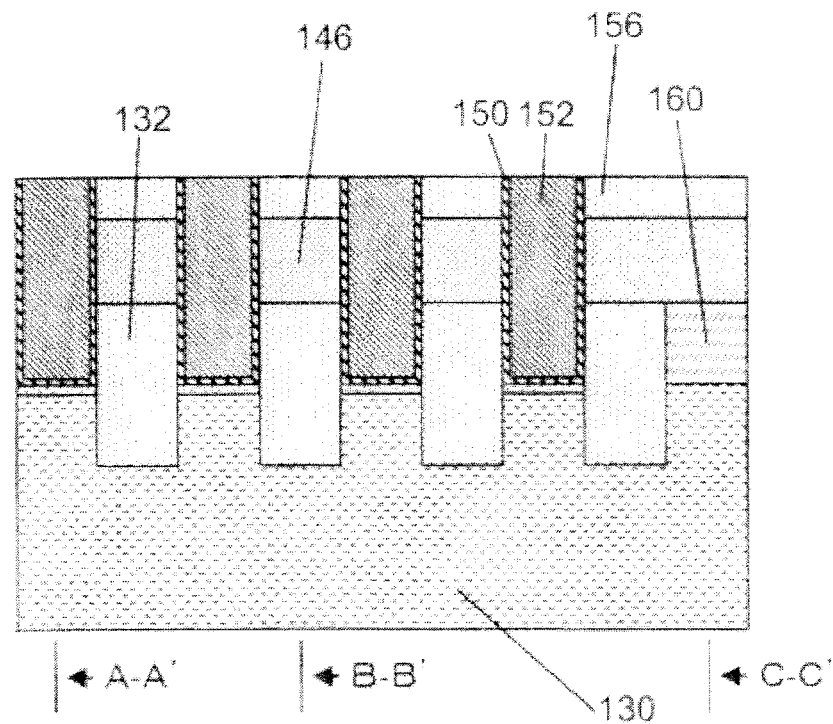
Figure 36:
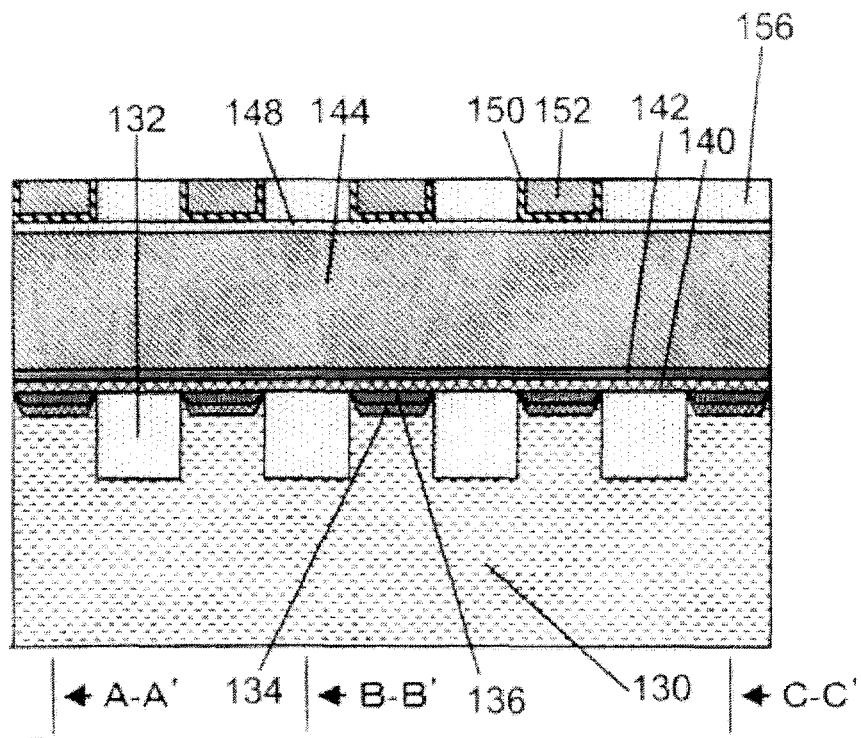
Figure 36:
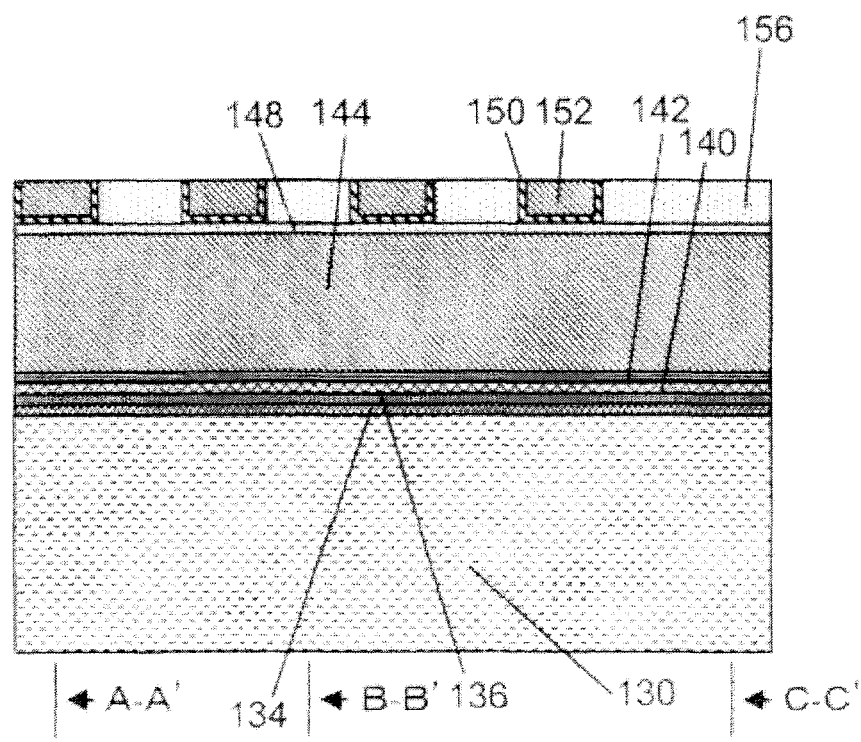

FIG. 35 and FIG. 36 are a top plan view and cross-sectional views, respectively showing the step of forming the word line and the control electrode (gate) of the transistor. FIG. 36(a) is a cross-sectional view taken in the direction of arrows along A-A' of FIG. 35, FIG. 36(b) is a cross-sectional view taken in the direction of arrows along B-B' of FIG. 35, FIG. 36(c) is a cross-sectional view taken in the direction of arrows along C-C' of FIG. 35, FIG. 36(d) is a cross-sectional view taken in the direction of arrows along D-D' of FIG. 35, FIG. 36(e) is a cross-sectional view taken in the direction of arrows along E-E' of FIG. 35, and FIG. 36(f) is a cross-sectional view taken in the direction of arrows along F-F' of FIG. 35.

In a step (step S15) of forming the word line and the control electrode T3 (gate) of the transistor, initially, a titanium/titanium nitride layer 150 (adhesive layer) is deposited by sputtering, and further the tungsten layer 152 (word line WL and control terminal T3) is formed by plating.

Figure 37:
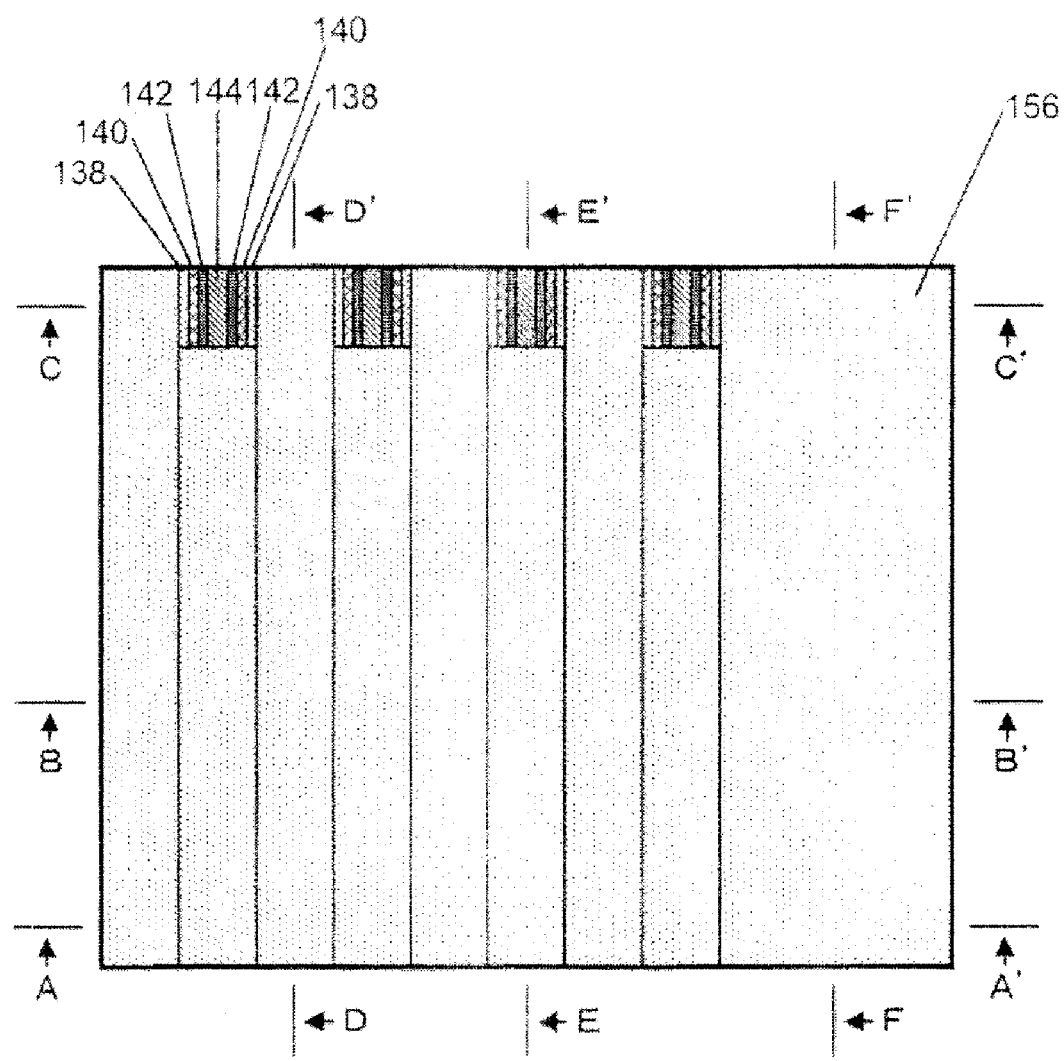
FIG. 37 is a top plan view showing the step of forming a trench into which the source line is filled and a hole into which a contact is filled.
Figure 38:
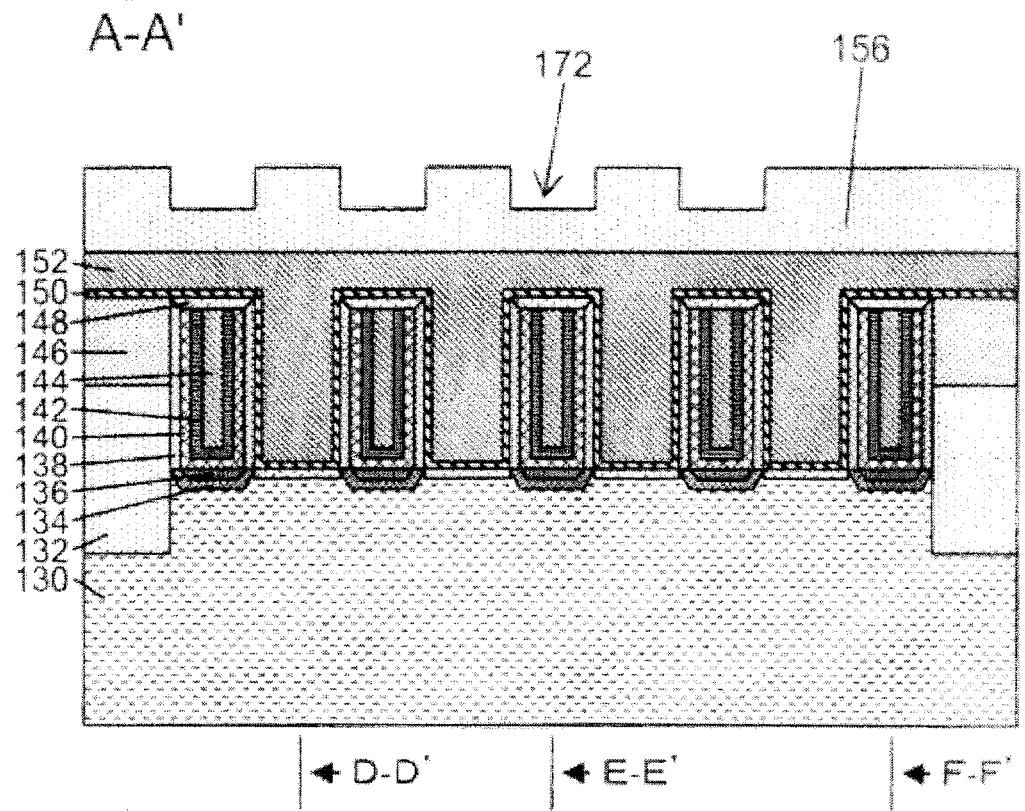
Figure 38:
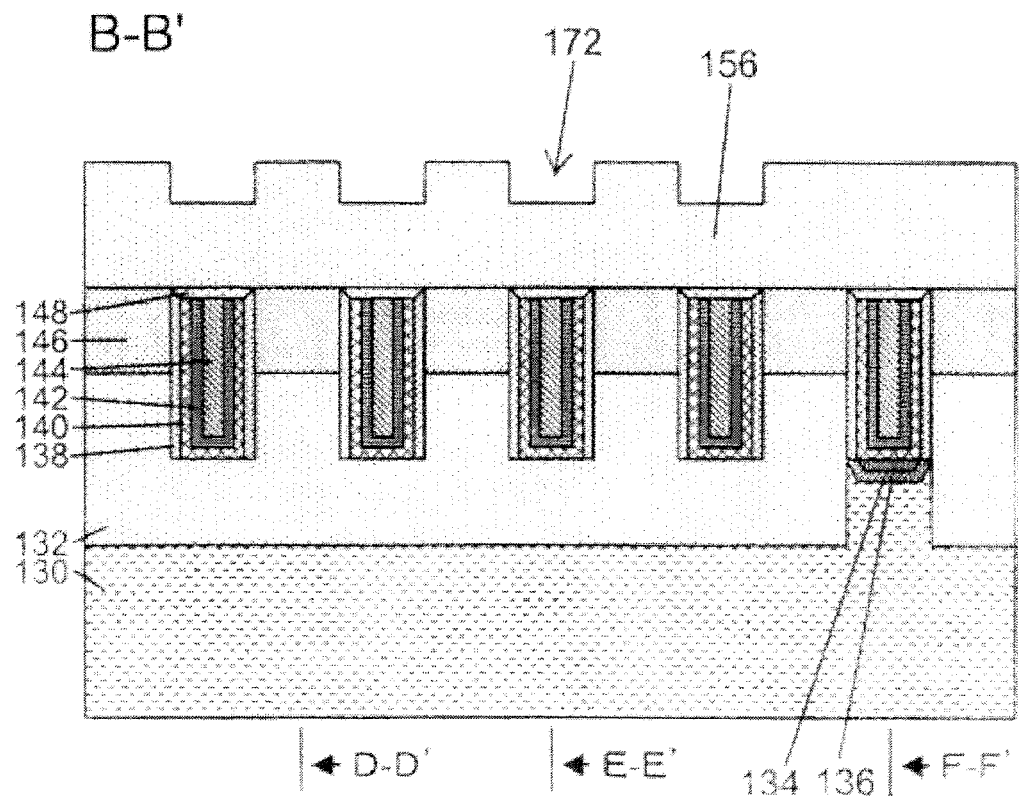
Figure 38:
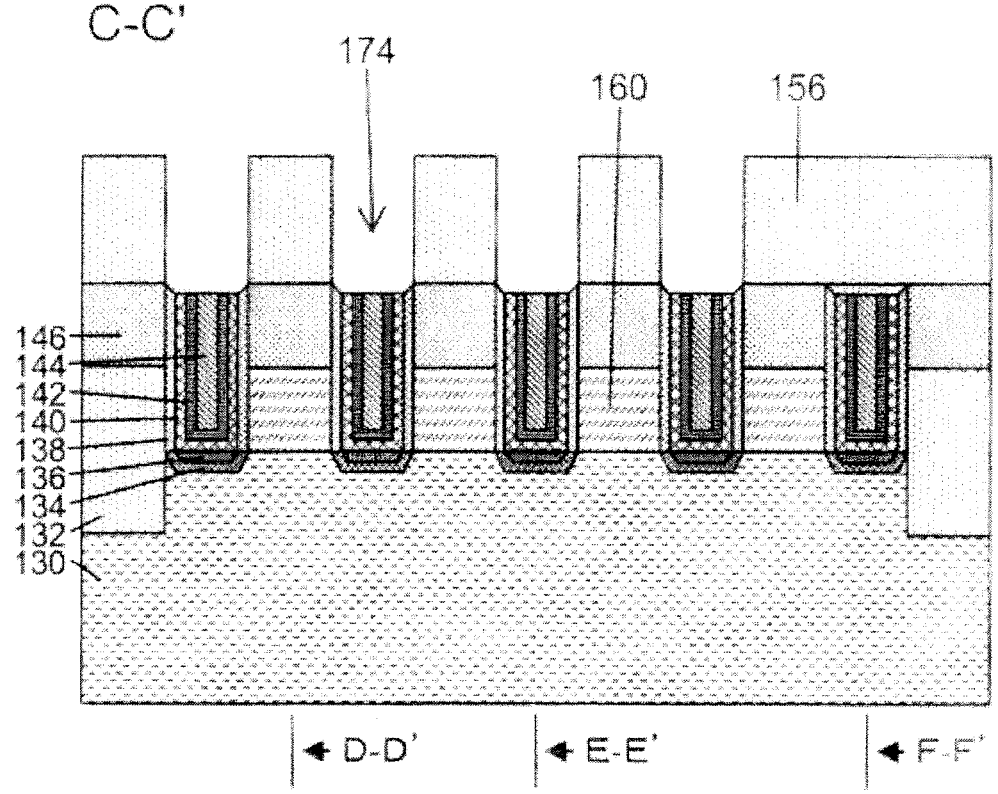
Figure 38:
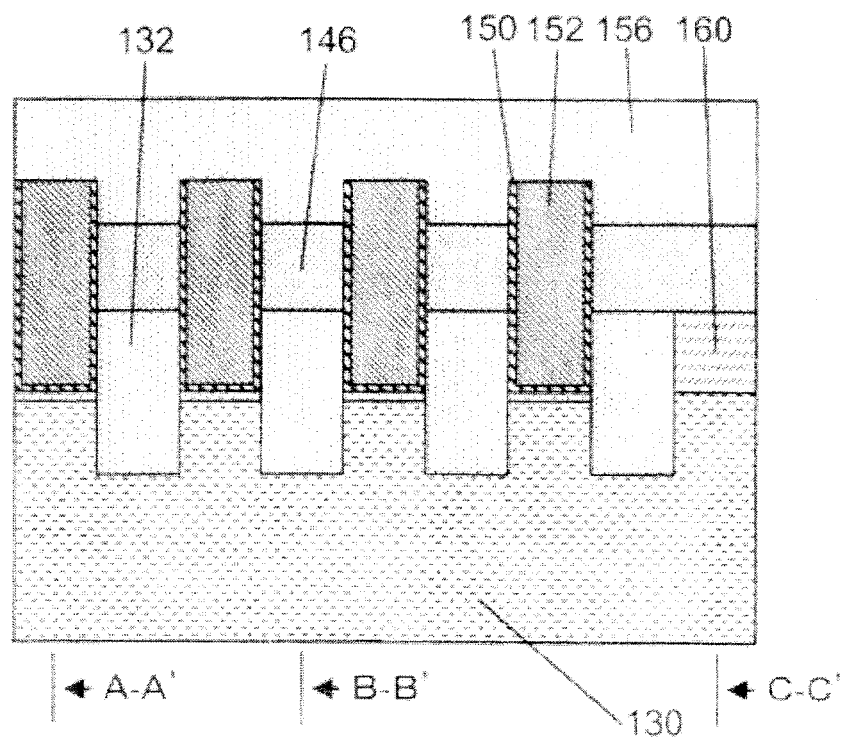
Figure 38:
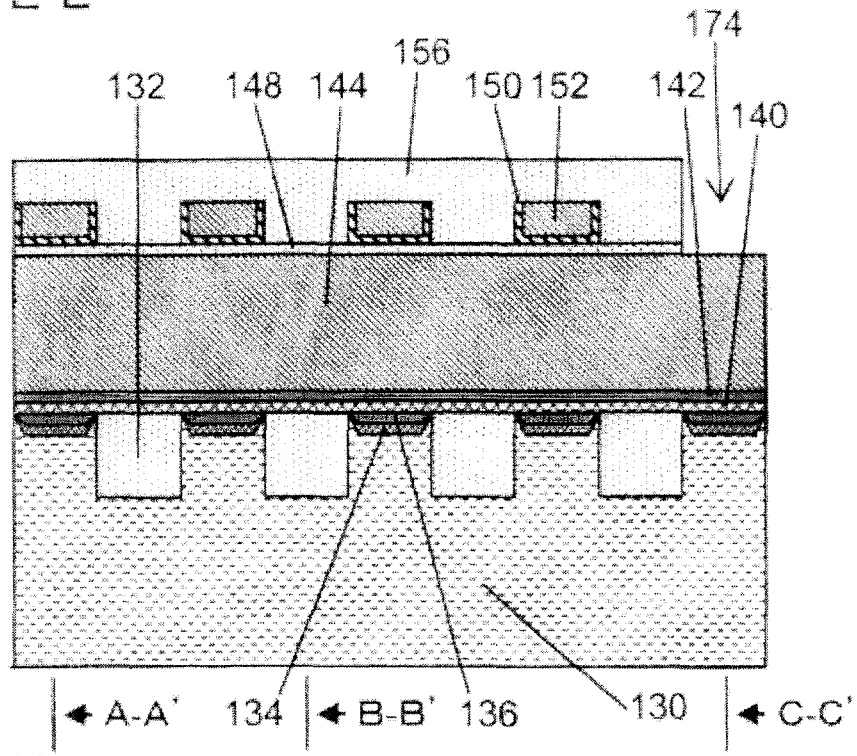
Figure 38:
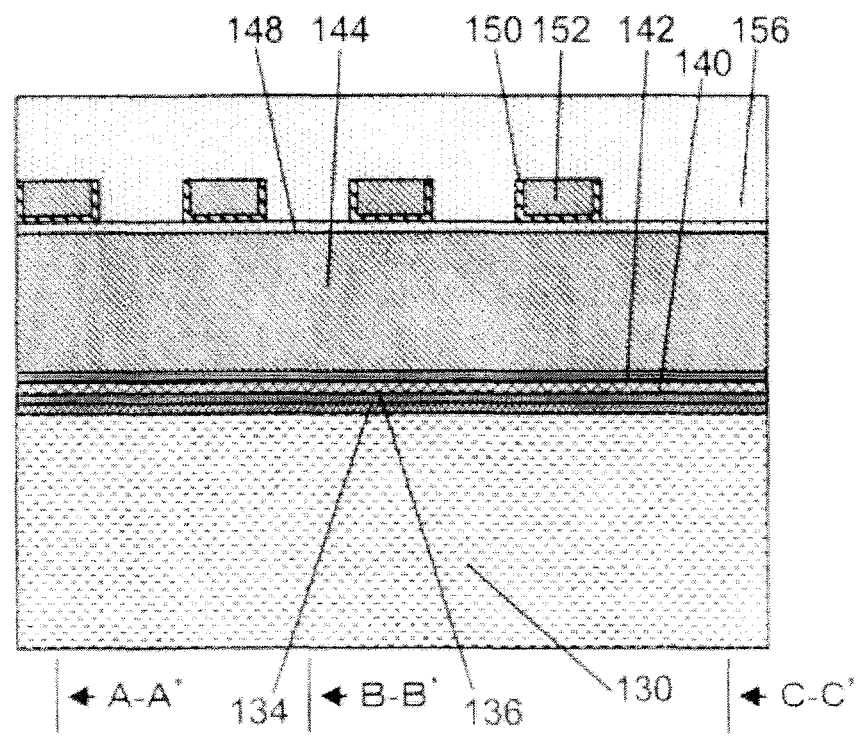

FIG. 37 and FIG. 38 are a top plan view and cross-sectional views, respectively, showing the step of forming a trench into which the source line is filled and a hole into which a contact is filled. FIG. 38(a) is a cross-sectional view taken in the direction of arrows along A-A' of FIG. 37, FIG. 38(b) is a cross-sectional view taken in the direction of arrows along B-B' of FIG. 37, FIG. 38(c) is a cross-sectional view taken in the direction of arrows along C-C' of FIG. 37, FIG. 38(d) is a cross-sectional view taken in the direction of arrows along D-D' of FIG. 37, FIG. 38(e) is a cross-sectional view taken in the direction of arrows along E-E' of FIG. 37, and FIG. 38(f) is a cross-sectional view taken in the direction of arrow along F-F' of FIG. 37.

In a step (step S16) of forming the trench into which the source line SL is filled and forming the hole into which the contact C1 is filled, silicon dioxide is deposited by thermal oxidation (condition: e.g., 10 nm), and then a part of the deposited silicon dioxide is removed by etching using a mask, thereby forming the trench 172 into which the source line SL is filled and forming the hole 174 into which the contact C1 is filled.

Figure 39:
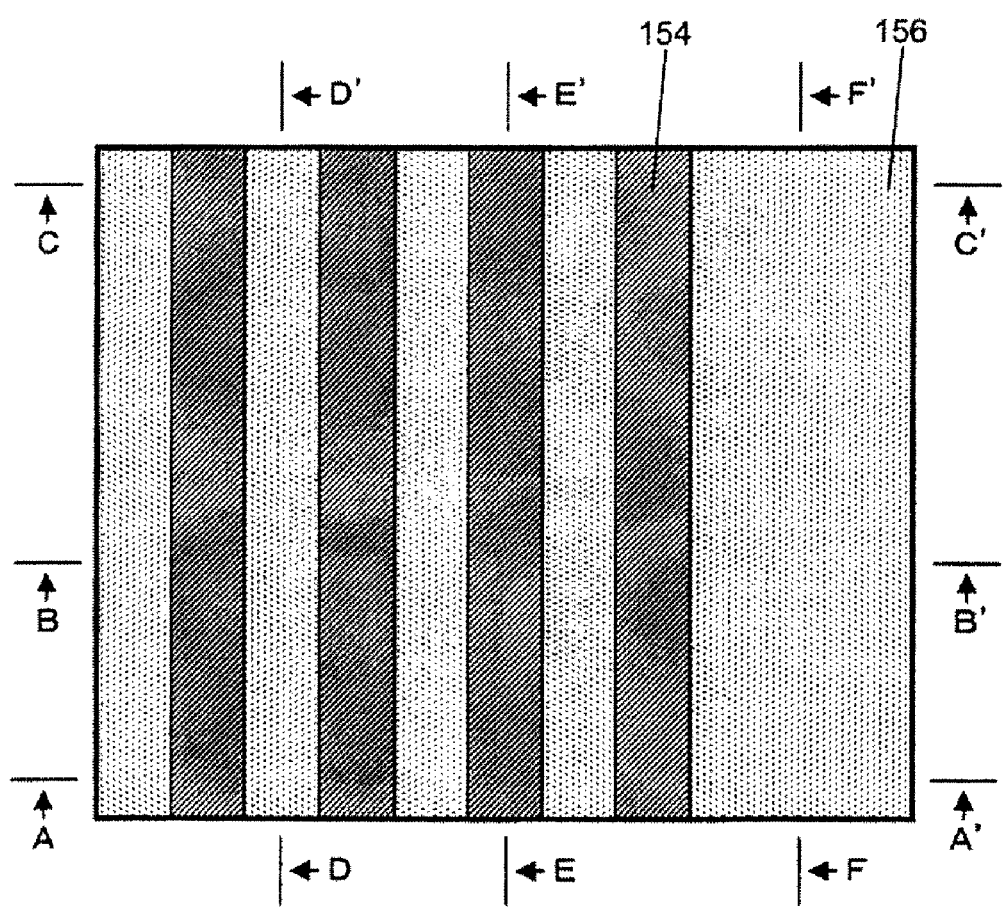
FIG. 39 is a top plan view showing the step of forming the source line and the contact.
Figure 40:
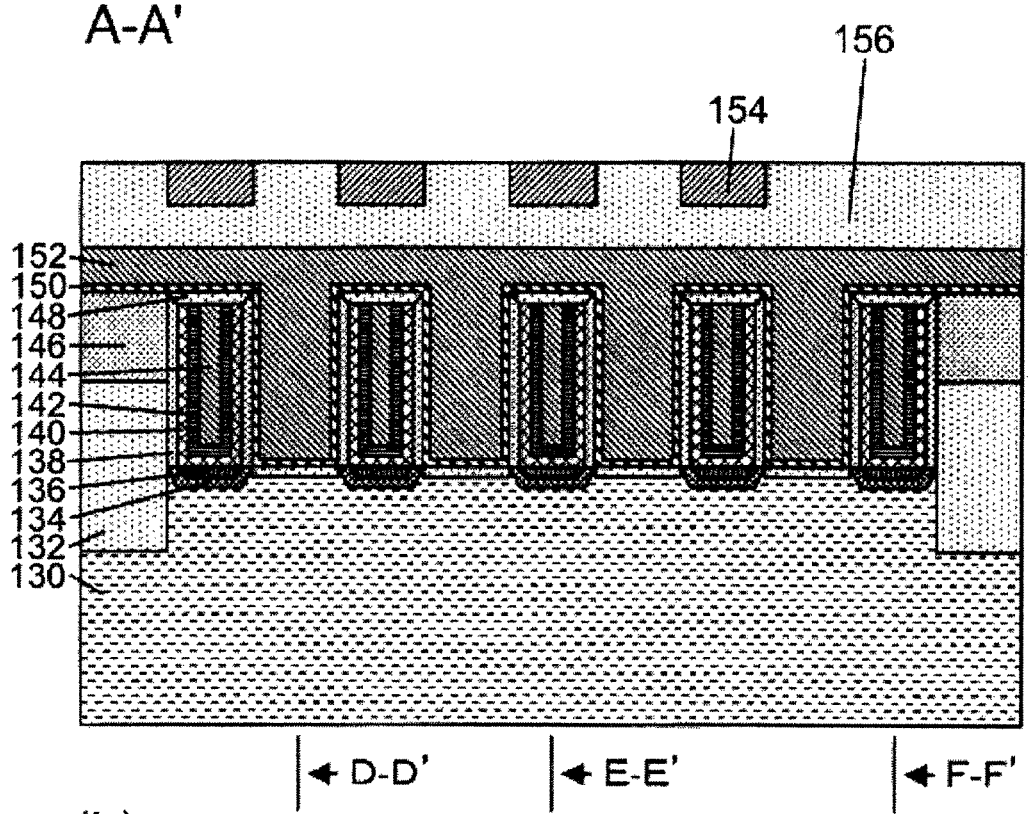
Figure 40:
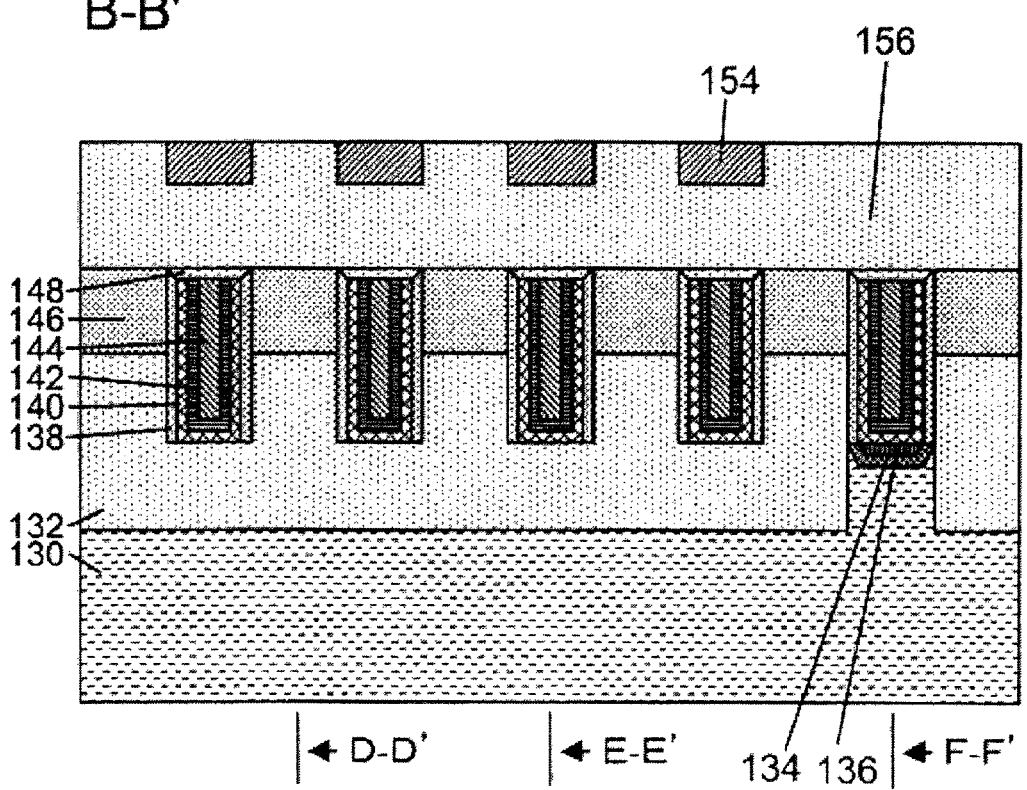
Figure 40:
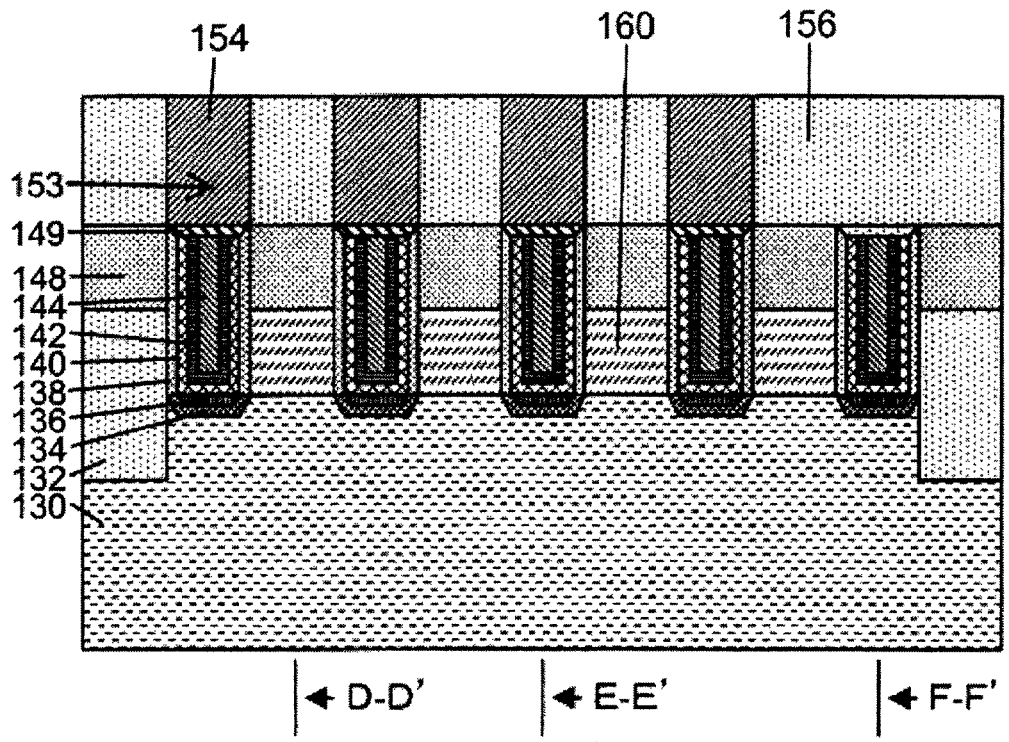
Figure 40:
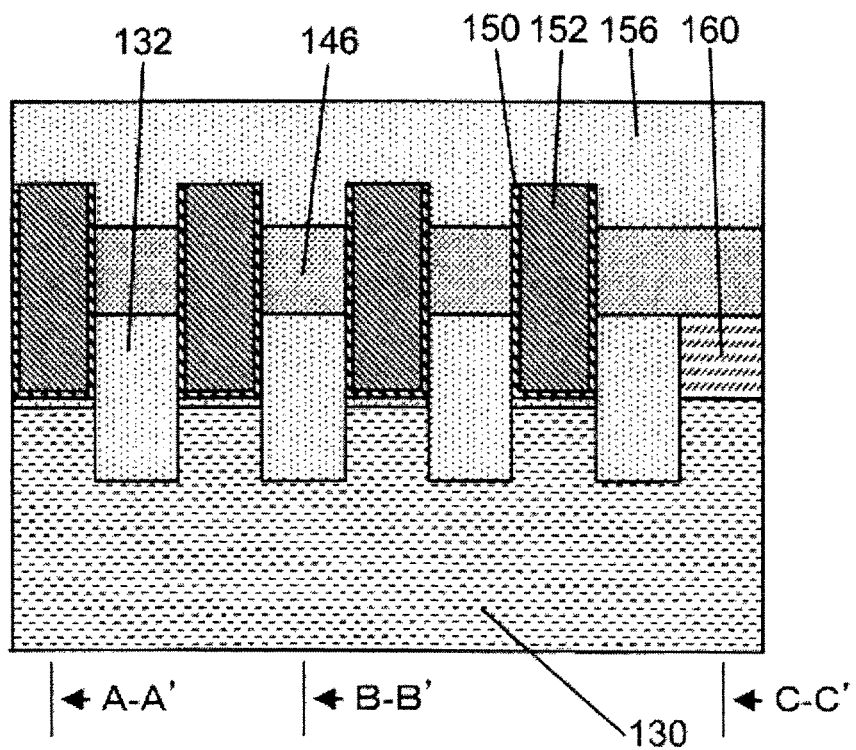
Figure 40:
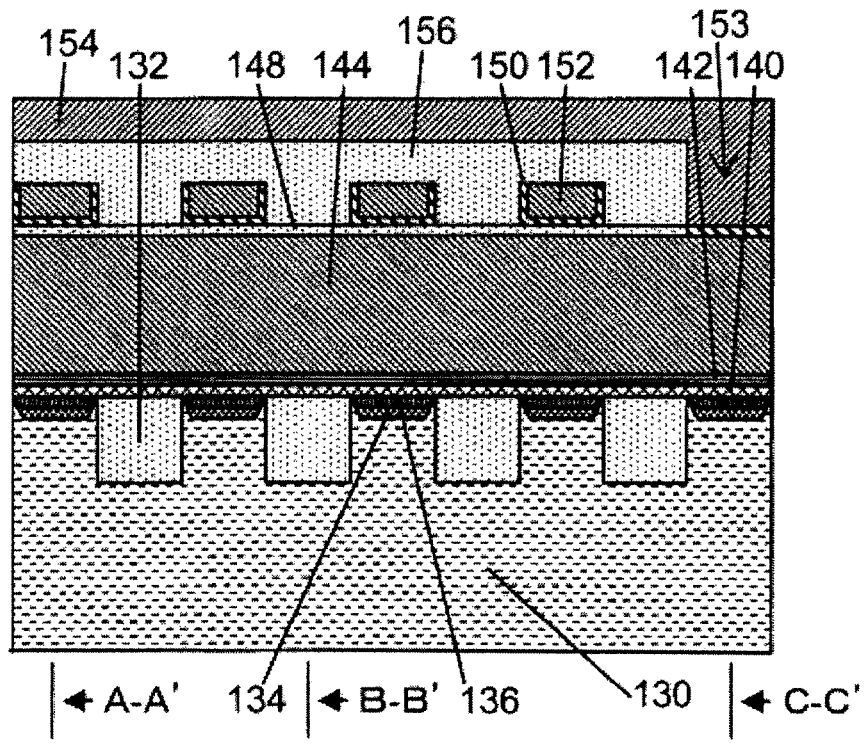
Figure 40:
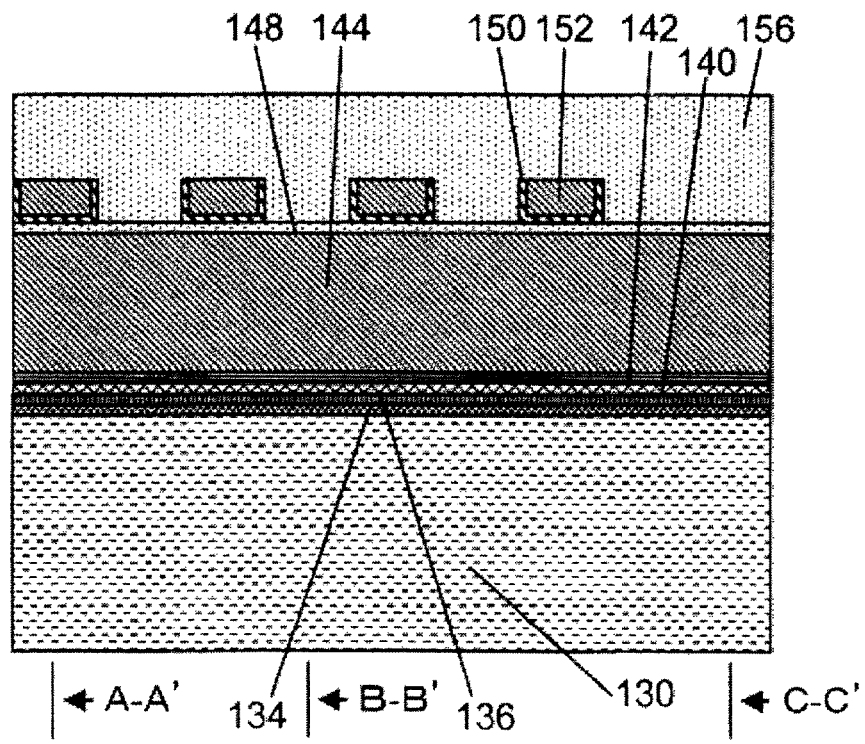

FIG. 39 and FIG. 40 are a top plan view and cross-sectional views, respectively, showing the step of forming the source line and the contact. FIG. 40(a) is a cross-sectional view taken in the direction of arrows along A-A' of FIG. 39, FIG. 40(b) is a cross-sectional view taken in the direction of arrows along B-B' of FIG. 39, FIG. 40(c) is a cross-sectional view taken in the direction of arrows along C-C' of FIG. 39, FIG. 40(d) is a cross-sectional view taken in the direction of arrows along D-D' of FIG. 39, FIG. 40(e) is a cross-sectional view taken in the direction of arrows along E-E' of FIG. 39, and FIG. 40(f) is a cross-sectional view taken in the direction of arrows along F-F' of FIG. 39.

In a step (step S17) of forming the source line and the contact, copper is filled into the trench 172 and the hole 174 formed in step S16 by damascene process and an unnecessary portion of copper is removed by CMP. As a result, the copper layer 154 and the contact 153 (contact C1 in FIG. 3) are formed.

Figure 41:
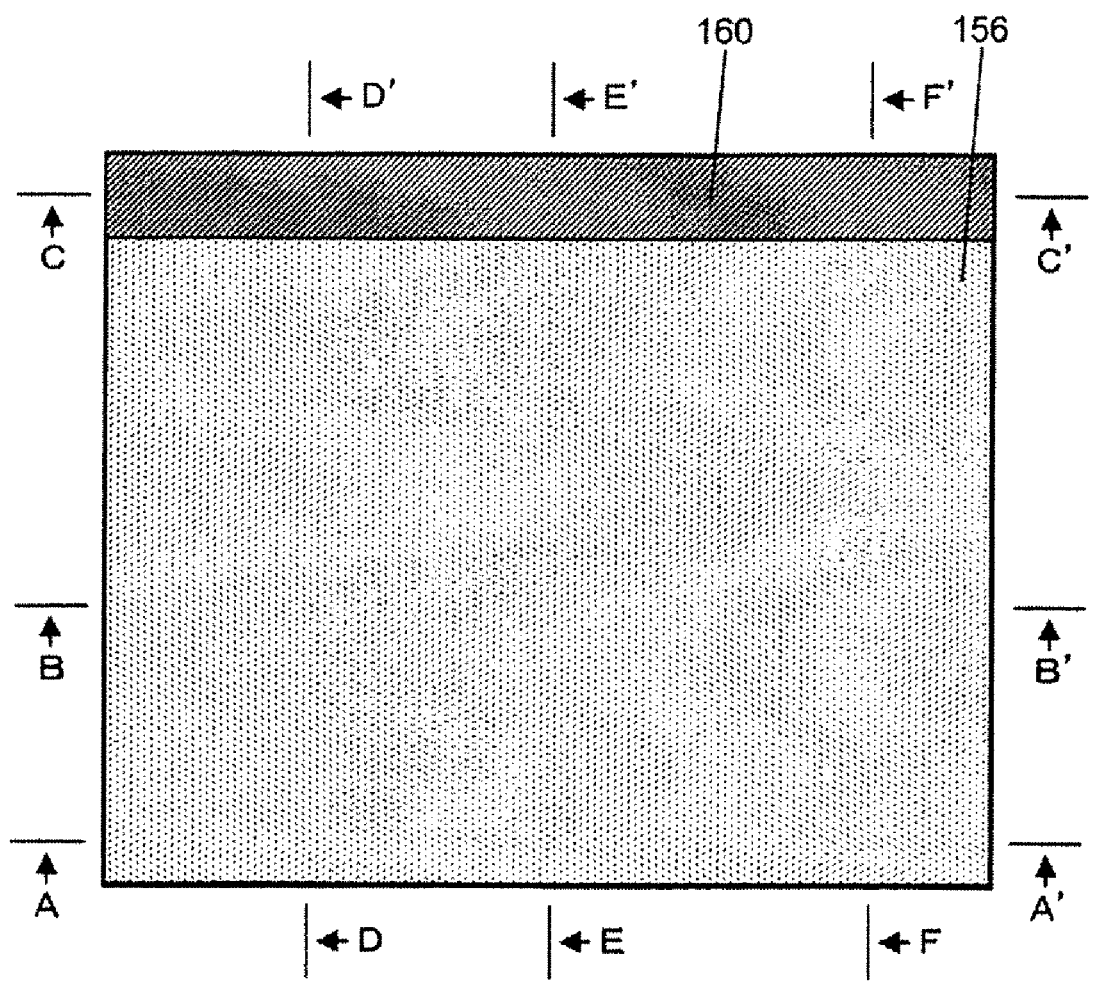
FIG. 41 is a top plan view showing the step of forming the bit line and a contact.
Figure 42:
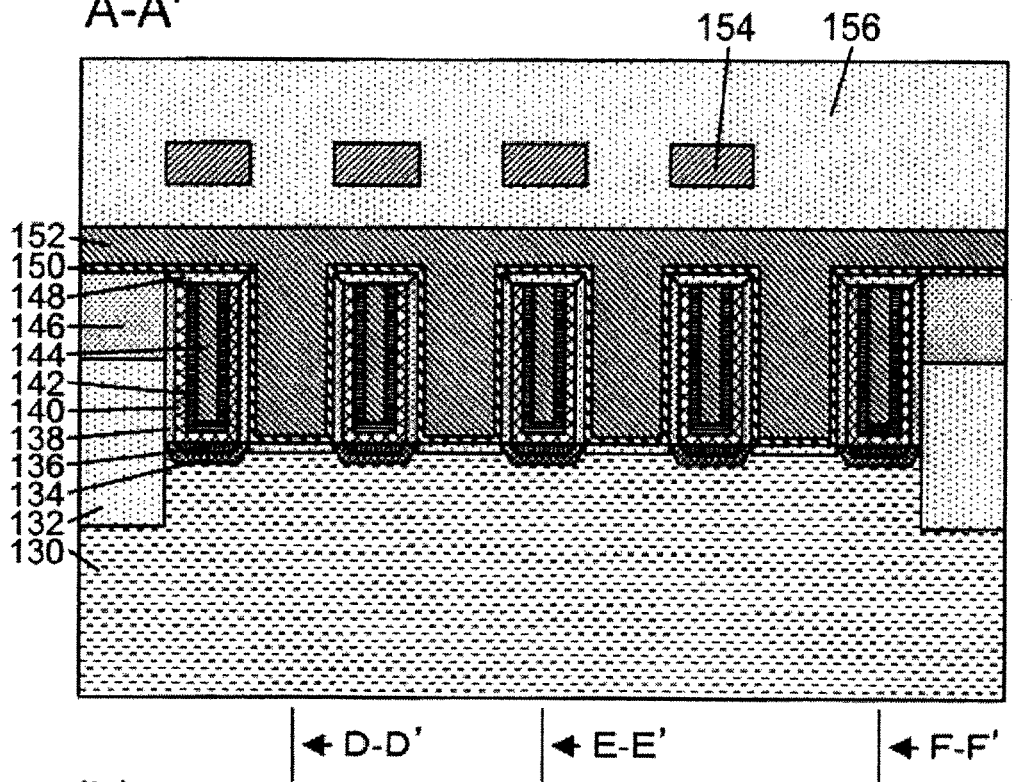
Figure 42:
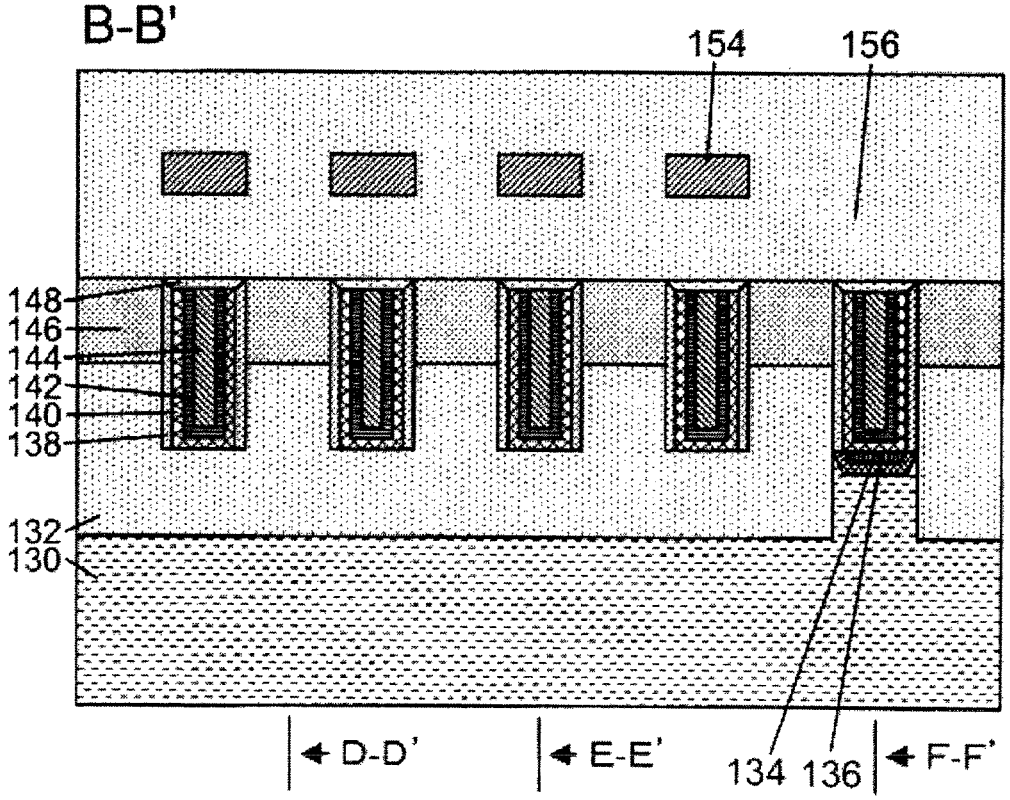
Figure 42:
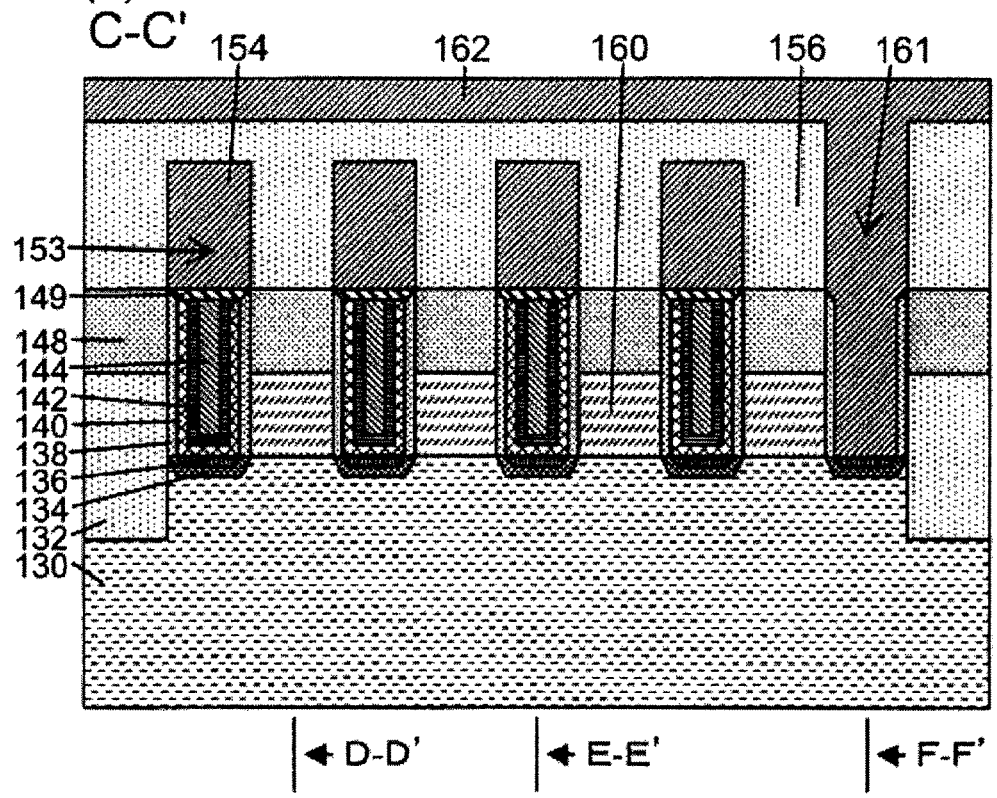
Figure 42:
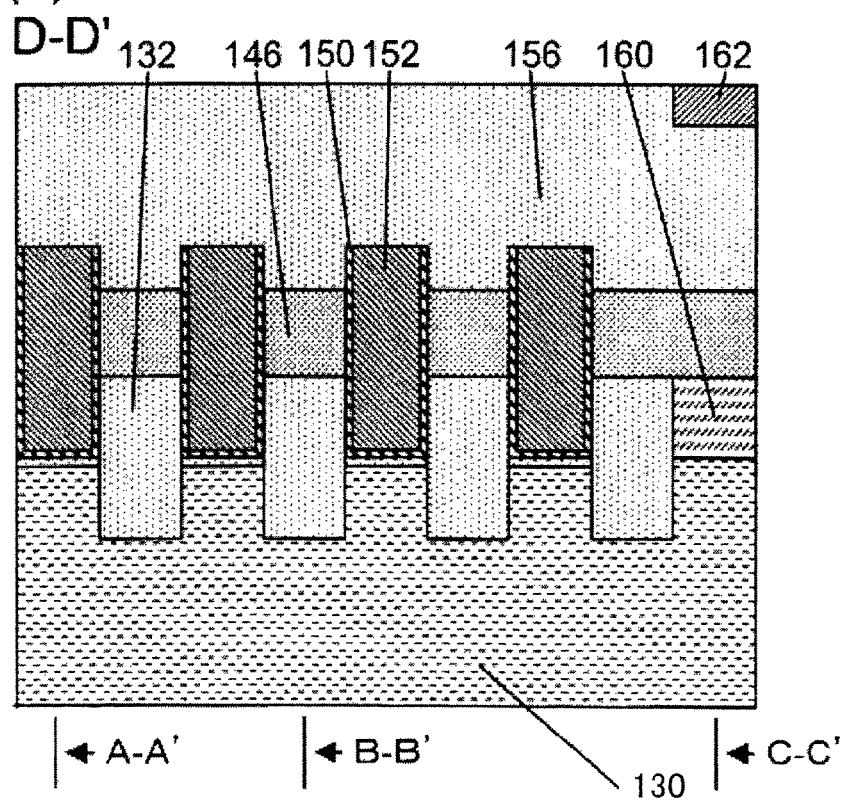
Figure 42:
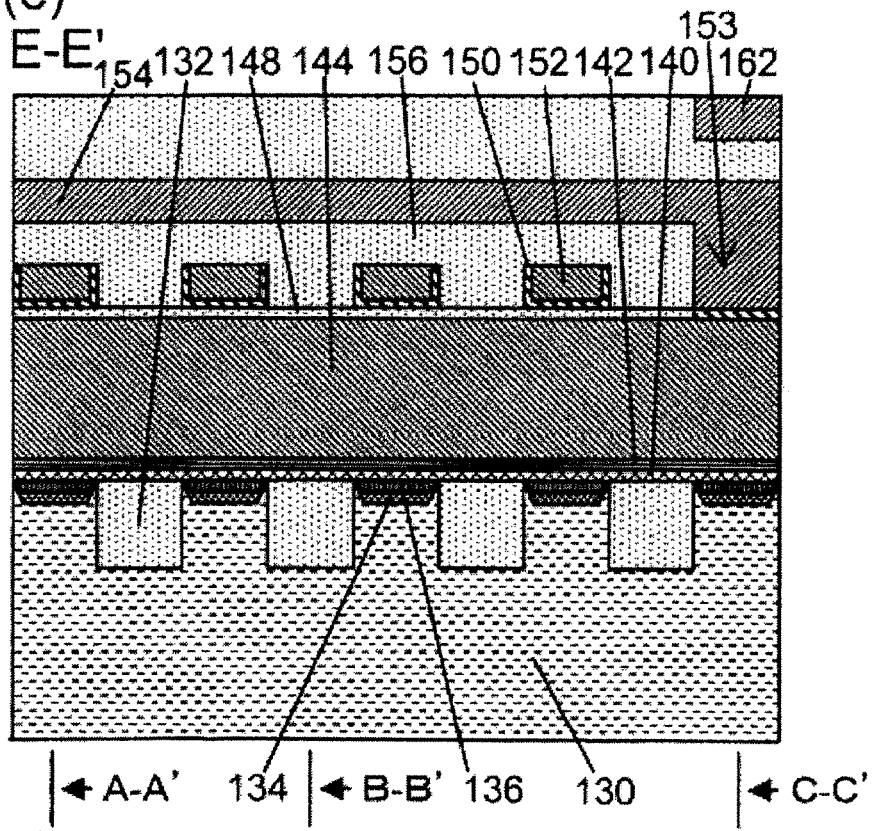
Figure 42:
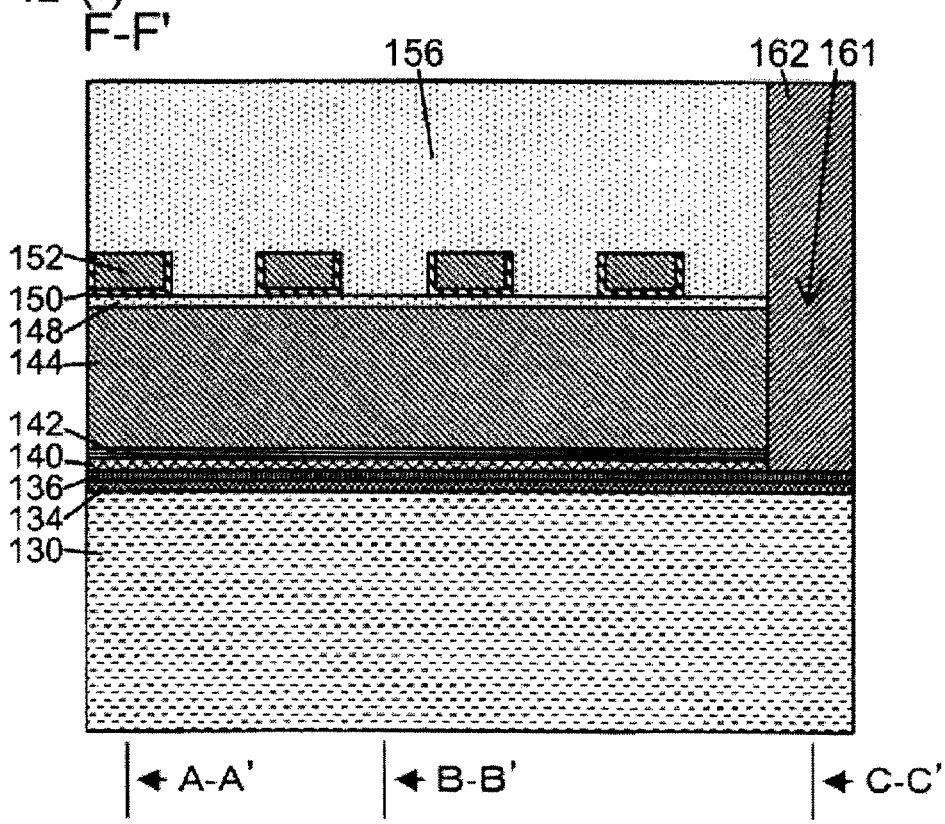

FIG. 41 and FIG. 42 are a top plan view and cross-sectional views, respectively showing the step of forming the bit line and a contact. FIG. 42(a) is a cross-sectional view taken in the direction of arrows along A-A' of FIG. 41, FIG. 42(b) is a cross-sectional view taken in the direction of arrows along B-B' of FIG. 41, FIG. 42(c) is a cross-sectional view taken in the direction of arrows along C-C' of FIG. 41, FIG. 42(d) is a cross-sectional view taken in the direction of arrows along D-D' of FIG. 41, FIG. 42(e) is a cross-sectional view taken in the direction of arrows along E-E' of FIG. 41, and FIG. 42(f) is a cross-sectional view taken in the direction of arrows along F-F' of FIG. 41.

In a step (step S18) of forming the bit line and the contact, TEOS is deposited over the entire surface by CVD to cover the copper layer 154 and the contact 153 and a part of silicon dioxide is removed by etching using a mask, thereby forming the trench into which the bit line BL is filled and the hole into which the contact C2 is filled. Copper is filled into the trench and the hole by damascene process and an unnecessary portion of copper is removed by CMP. In this way, the copper layer 162 and the contact 161 (contact C2 in FIG. 3) are formed.

Through the above steps, the memory block shown in FIGS. 3 and 4 is manufactured. (FIG. 42 is identical to FIG. 4).

[Modification Example]

Figure 43:
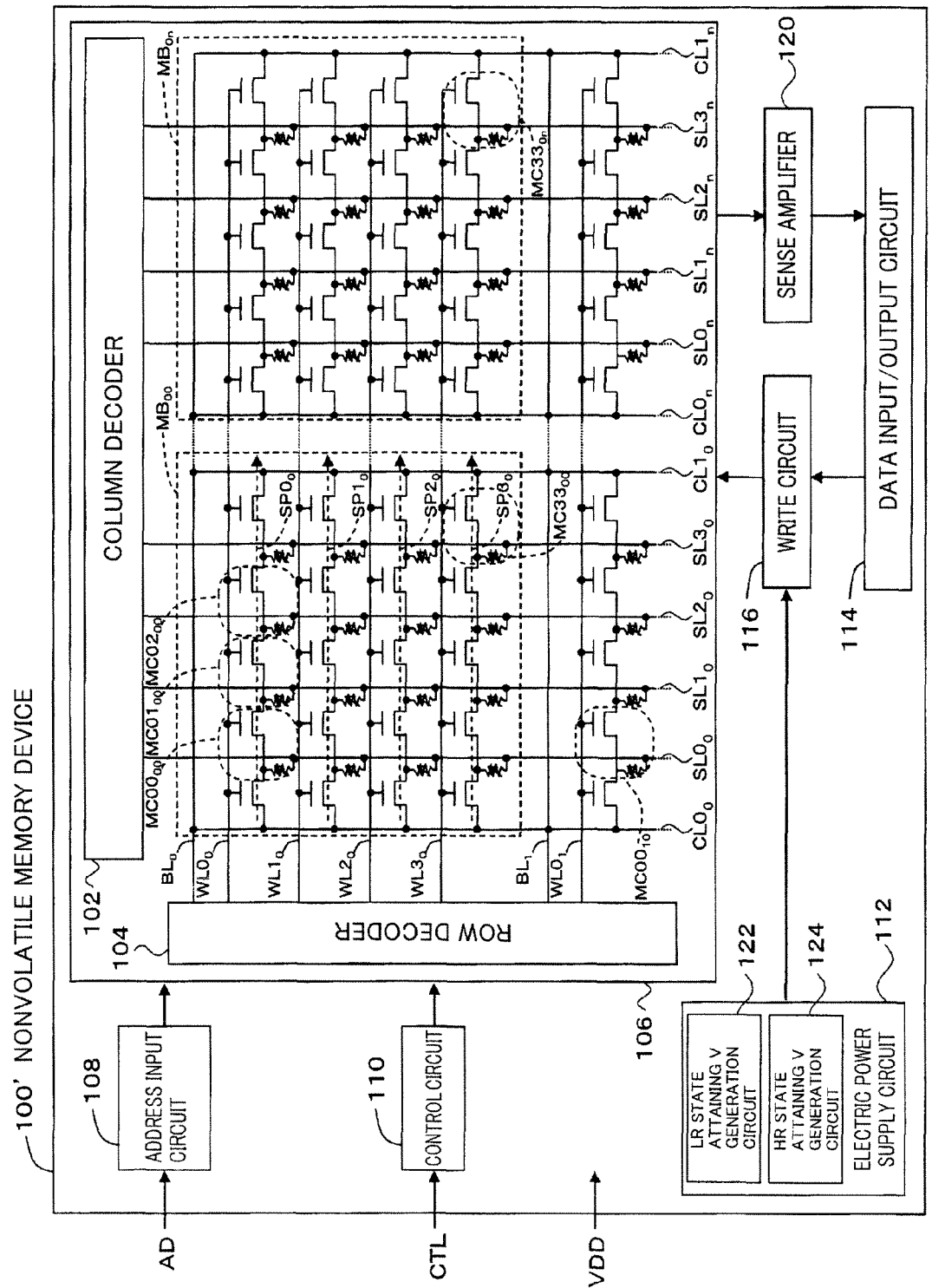
FIG. 43 is a block diagram showing an exemplary circuit configuration of a nonvolatile memory device 100' according to Modification Example of Embodiment 1 of the present invention.

FIG. 43 is a block diagram showing an exemplary circuit configuration of a nonvolatile memory device 100' according to Modification Example of Embodiment 1 of the present invention. As shown in FIG. 43, the both ends of each series path may be connected to the bit line (third wire) for each memory block.

Such a configuration is attained by adding one contact wire CL at the left of $SL0_0$ and by connecting the contact wire CL to the bit line BL0 via a contact C2, in the configuration of FIGS. 3 and 4. The contact wire to be added may be configured similarly to the contact wire of Embodiment 1. The specific configuration and details of the manufacturing method are obvious to persons skilled in the art and will not be described.

In such a configuration, since an electric potential propagates from the both sides of the series path, wire delay can be suppressed more effectively.

In this modification example, the configuration other than the connecting relation between the series path SP and the bit line BL is similar to that described in the embodiment shown in FIG. 1. Therefore, in FIG. 43, the same constituents as those in FIG. 1 are designated by the same reference numerals and names and these constituents will not be described repetitively.

(Embodiment 2)

Figure 44:
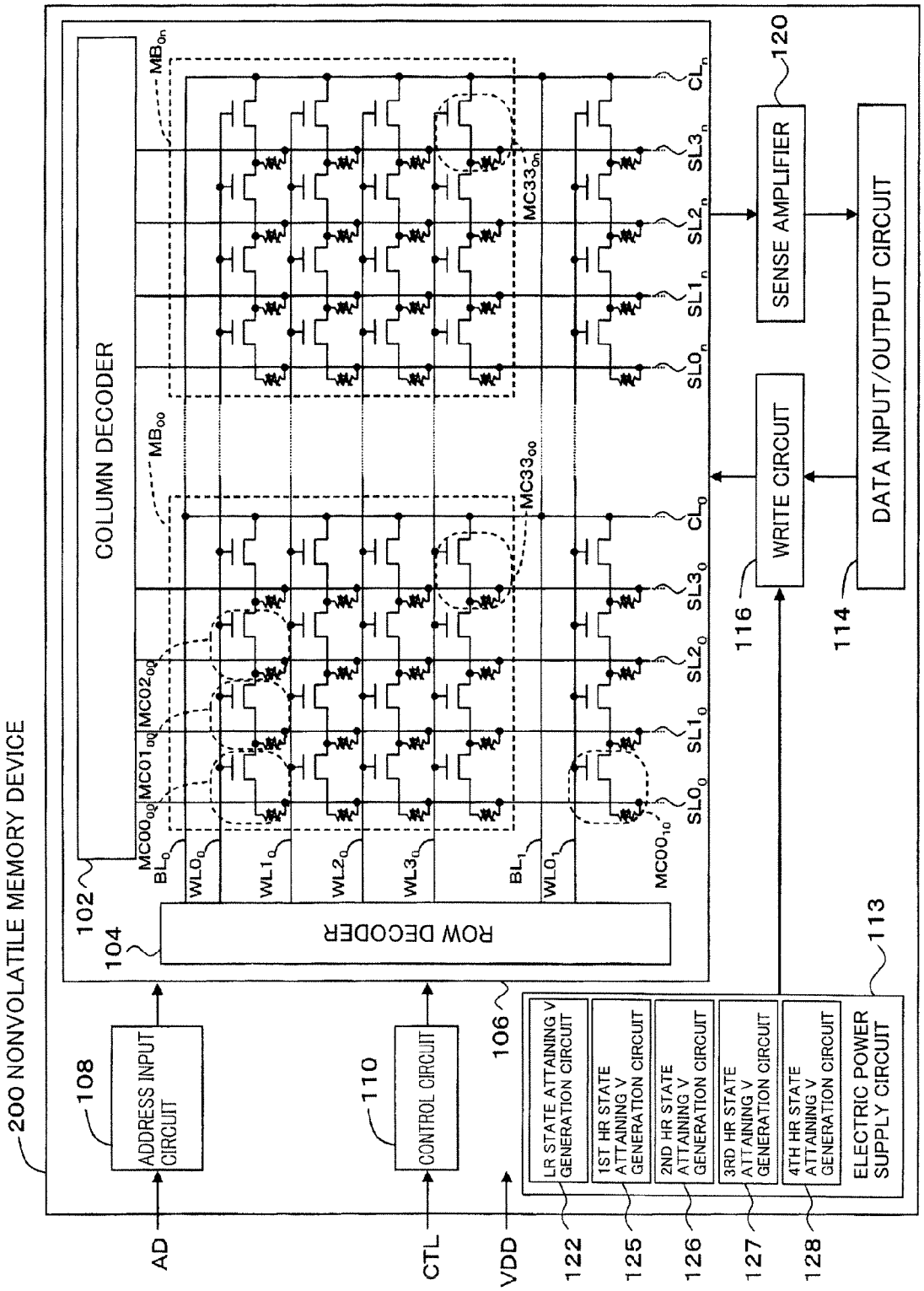
FIG. 44 is a block diagram showing an exemplary circuit configuration of a nonvolatile memory device 200 according to Embodiment 2 of the present invention.

FIG. 44 is a block diagram showing an exemplary circuit configuration of a nonvolatile memory device according to Embodiment 2 of the present invention.

A nonvolatile memory device 200 of Embodiment 2 includes an electric power supply circuit 113 for applying voltages to the resistance variable element included in each memory cell. The electric power supply circuit 113 is configured to change output voltages, according to the number of transistors TR included in a portion of the series path SP associated with a selected memory cell MC, from the connecting point of the associated series path SP and the associated bit line (third wire) to the first electrode E1 of the selected memory cell MC.

To be more specific, the nonvolatile memory device 200 includes an electric power supply circuit 113 replacing the electric power supply circuit 112 in the nonvolatile memory device 100 of FIG. 1, and a first high-resistance state attaining voltage generating circuit 125, a second high-resistance state attaining voltage generating circuit 126, a third high-resistance state attaining voltage generating circuit 127 and a fourth high-resistance state attaining voltage generating circuit 128, which replace the high-resistance state attaining voltage circuit 124 in the nonvolatile memory device 100 of FIG. 1. The other constituents are identical to those of the nonvolatile memory device 100 of FIG. 1. Therefore, in FIG. 44, the same constituents as those in FIG. 1 are designated by the same reference numerals and names and will not be described repetitively.

The first high-resistance state attaining voltage generating circuit 125 outputs a voltage $V2_0$ (first high-resistance state attaining voltage) applied to a selected bit line BL to change a memory cell MC belonging to the first column from the left in the memory block to a high-resistance state. Transistors included in a portion of the series path SP, connecting the first electrode E1 of the resistance variable element RR included in the memory cell to the bit line BL is four in number.

The second high-resistance state attaining voltage generating circuit 126 outputs a voltage $V2_1$ (second high-resistance state attaining voltage) applied to a selected bit line BL to change a memory cell MC belonging to the second column from the left in the memory block to a high-resistance state. Transistors included in a portion of the series path SP, connecting the first electrode E1 of the resistance variable element RR included in the memory cell to the bit line BL is three in number.

The third high-resistance state attaining voltage generating circuit 127 outputs a voltage $V2_2$ (third high-resistance state attaining voltage) applied to a selected bit line BL to change a memory cell MC belonging to the third column from the left in the memory block to a high-resistance state. Transistors included in a portion of the series path SP, connecting the first electrode E1 of the resistance variable element RR included in the memory cell to the bit line BL is two in number.

The fourth high-resistance state attaining voltage generating circuit 128 outputs a voltage $V2_3$ (fourth high-resistance state attaining voltage) applied to a selected bit line BL to change a memory cell MC belonging to the fourth column from the left in the memory block to a high-resistance state. Transistors included in a portion of the series path SP, connecting the first electrode E1 of the resistance variable element RR included in the memory cell to the bit line BL is one in number.

The voltage $V2_0$, the voltage $V2_1$, the voltage $V2_2$ and the voltage $V2_3$ are set so that the voltage applied between the electrodes of the resistance variable element RR is equal irrespective of the location of the resistance variable element RR within the memory block in view of a substrate bias effect and according to the path length (the number of transistors included in the shortest series path connecting the resistance variable element to the bit line) of the shortest series path connecting the first electrode E1 of the memory cell belonging to each column, to the bit line BL.

A substrate bias effect is not substantially occurred in a selected transistor in a case where a selected source line SL is placed at a high electric potential and a selected bit line BL is placed at a low electric potential (e.g., ground potential) (in the example of Embodiment 1, the memory cell is changed to the low-resistance state as shown in FIG. 6(a)), and therefore substantially whole amount of the fed voltage is applied to the both electrodes of the resistance variable element RR in the memory cell. On the other hand, a reverse bias because of a substrate bias effect is substantially occurred in a selected transistor in a case where a selected source line SL is placed at a low electric potential and a selected bit line BL is placed at a high electric potential (in the example of Embodiment 1, the memory cell is changed to the high-resistance state as shown in FIG. 6(b)), and therefore the voltage actually applied between the both electrodes of the resistance variable element RR in the memory cell is smaller in magnitude than the voltage fed between the selected source line SL and the selected bit line BL.

Figure 45:
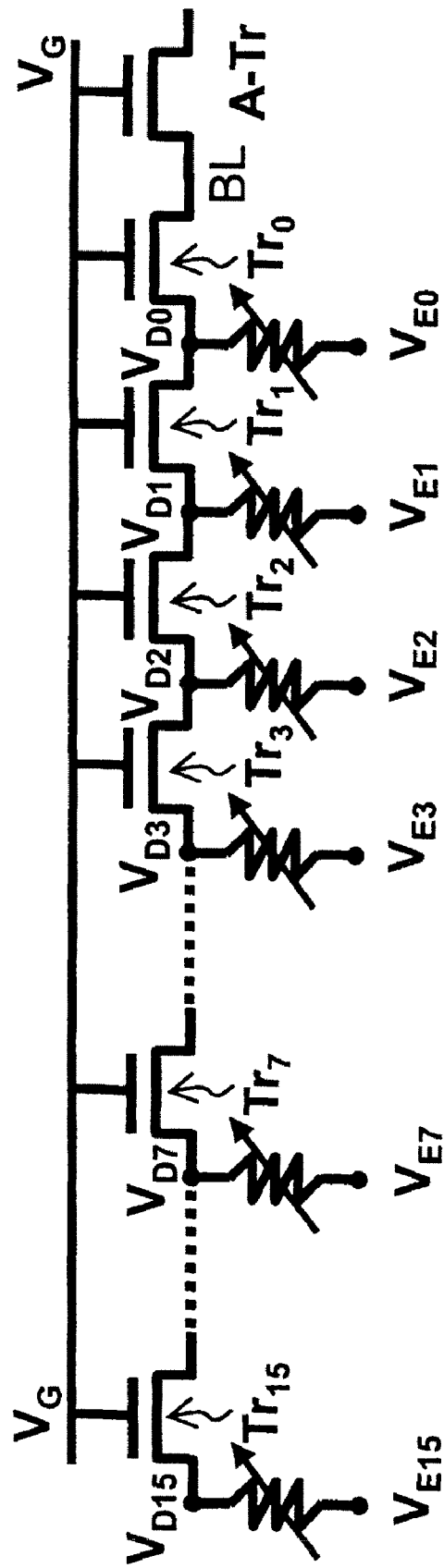
FIG. 45 is a conceptual view for simulating an electric potential drop because of a substrate bias effect.
Figure 46:
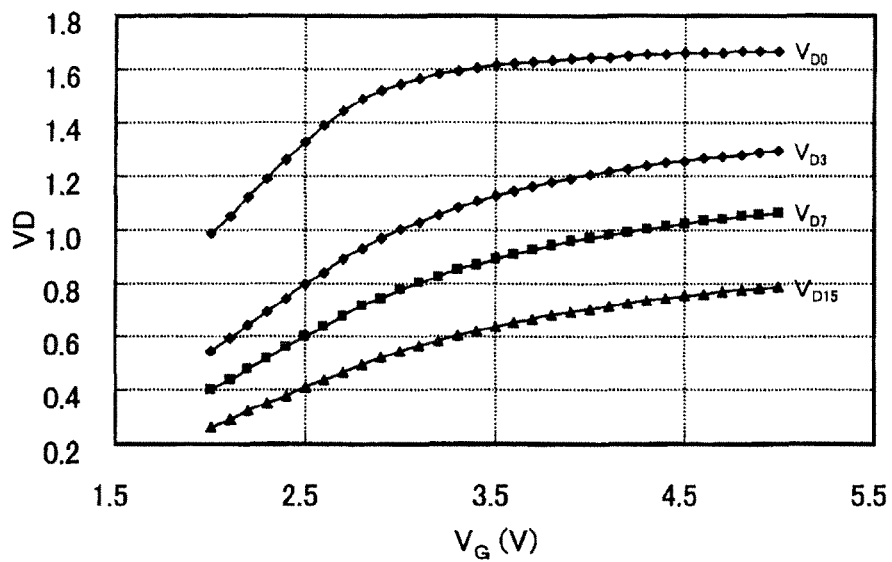
FIG. 46 is a view showing result of the electric potential drop because of the substrate bias effect, which is obtained by conducting a simulation based on the conceptual view of FIG. 45.
Figure 47:
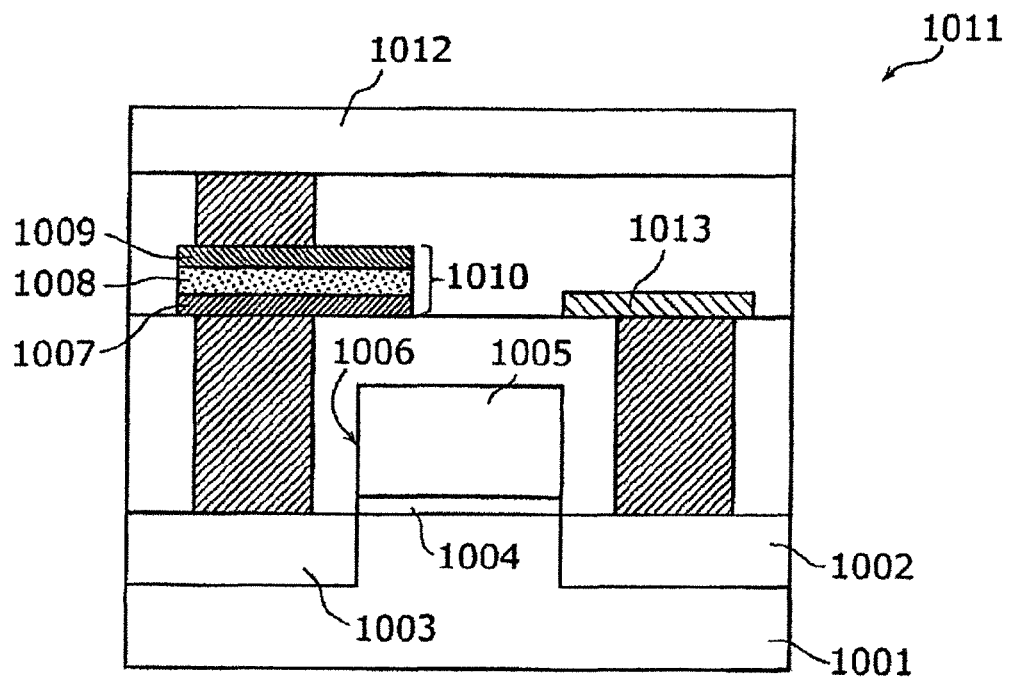
FIG. 47 is a schematic view of a cross-section of a memory cell disclosed in Patent literature 2.
Figure 48:
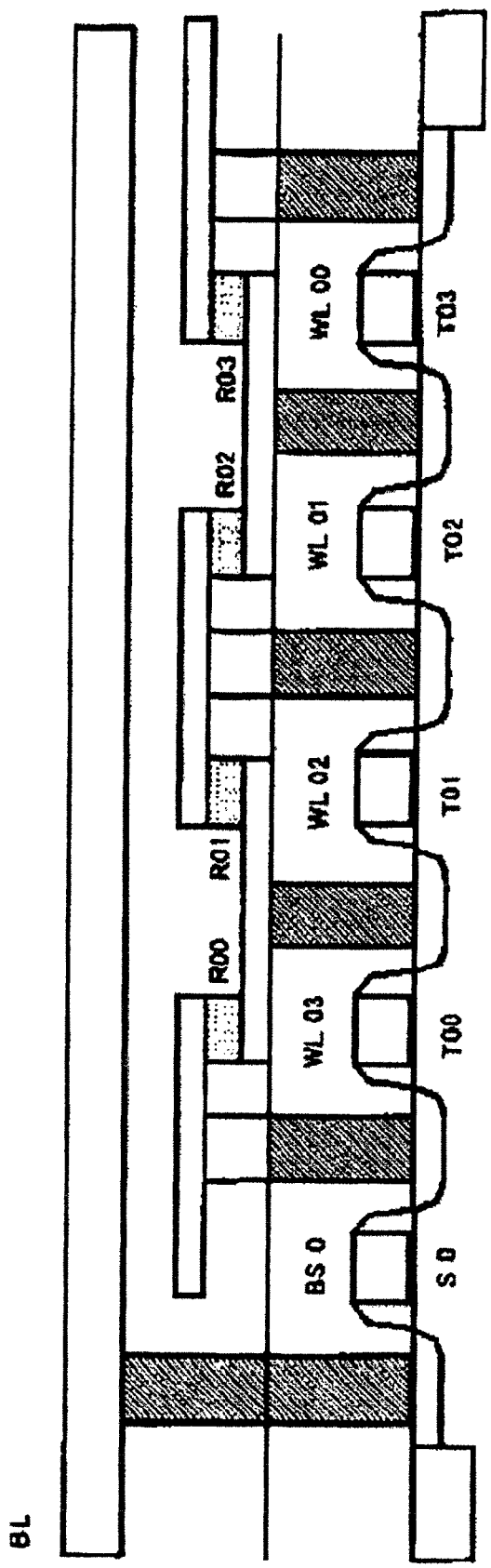
FIG. 48 is a circuit diagram disclosed in Patent literature 3.

FIG. 45 is a view showing a circuit used to simulate an electric potential drop because of the substrate bias effect. In FIG. 45, A-Tr designates a control transistor located between the electric power supply circuit and the memory cells. $Tr_0 \sim Tr_{15}$ designate transistors connected to the memory cells, respectively. $V_{E0} \sim V_{E15}$ designate voltages on the source line, respectively, in the case where $V_D$ ($V_{D0} \sim V_{D15}$) of the transistors constituting the memory cells are 0V. FIG. 46 is a view showing result of the electric potential drops of $V_D$ ($V_{D0} \sim V_{D15}$) of the transistors because of the substrate bias effect, which is a obtained by conducting simulation, based on the circuit diagram of FIG. 45. The transistors $Tr_0 \sim Tr_{15}$ and A-Tr used in the simulation have an identical configuration and are 3.3V based NMOS transistors (gate width W=440 nm, gate length L=380 nm, and a gate oxide layer thickness=9.7 nm).

As shown in FIG. 45, transistors are arranged successively in a line shape such that the first main terminal (source/drain) of one of adjacent transistors is connected to the second main terminal (source/drain) of the other transistor. The control terminals (gates) of the respective transistors are connected to each other and is applied with an equal electric potential ($V_G$). The lower electrode of the resistance variable element is connected to each connecting portion (main terminal) of adjacent two transistors. It is supposed that the resistance variable element is not connected to the right main terminal of the rightmost transistor $Tr_0$, but to the bit line BL, among the transistors connected to the memory cells. It is also supposed that the upper electrodes of the resistance variable elements are electrically grounded.

In this configuration, the voltage applied to the bit line connected to the main terminal of A-Tr is expressed as $V_{BL}$, and the voltages actually applied to the first to fifteenth resistance variable elements from the right are expressed as $V_{D0} \sim V_{D15}$, respectively. When $V_{BL}$=+1.8V, the electric potentials of $V_{D0} \sim V_{D15}$ are lower as the associated nodes are more distant from A-Tr. $V_{D0} \sim V_{D15}$ are variable according to the magnitude of $V_G$. FIG. 46 is a view showing the relationship between $V_{D0}$, $V_{D3}$, $V_{D7}$, and $V_{D15}$, and $V_G$. When $V_G$=VDD=+4.5V, $V_{D0}$ to $V_{D3}$ are not less than +1.2V. To change the resistance variable element to the high-resistance state, it is necessary to apply a positive voltage larger in absolute value than +1.2V which is a threshold for attaining the high-resistance state in the example of FIG. 5. Therefore, in accordance with the element characteristic of FIG. 5 and the above voltage relation, up to four memory cells can be connected to one series path. By reducing ON-resistance of each transistor or reducing the substrate bias effect, more memory cells can be connected to one series path. For the above mentioned reason, in Embodiment 1, four memory cells are connected to one series path (four memory cells are included in one row within the memory block). By regulating $V_G$ or $V_{BL}$, more memory cells can be connected to one series path.

The degree of a voltage drop due to the substrate bias effect is different according to the location on the series path (the number of transistors included in a path connecting the resistance variable elements to the bit line) so long as $V_{BL}$ is constant, and therefore, the voltage actually applied to the resistance variable element changes. In order to uniformize the respective resistance values after writing and to prevent an unnecessary voltage stress from being applied to the resistance variable element, the applied voltage is desirably constant irrespective of the location of the memory cell on the series path. To this end, it is desired that $V_{BL}$ be regulated preliminarily so that the voltage applied between the both electrodes of the resistance variable element RR is equal irrespective of the location of the resistance variable element within the memory block according to the path length of the shortest series path connecting the first electrode E1 of the memory cell to the bit line BL (the number of transistors included in the shortest series path connecting the resistance variable element to the bit line). In this embodiment, such control is achieved by using the first high-resistance state attaining voltage generating circuit 125, the second high-resistance state attaining voltage generating circuit 126, the third high-resistance state attaining voltage generating circuit 127 and the fourth high-resistance state attaining voltage generating circuit 128 to change $V_{BL}$ to $V2_0 \sim V2_3$ as described above according to the location of the memory cell.

In accordance with the above configuration, the voltage applied between the electrodes of the resistance variable element RR can be made constant irrespective of the location of the memory cell MC, the respective resistance values after writing can be more uniformized, and an unnecessary voltage stress applied to the resistance variable element can be suppressed more effectively, as compared to the configuration conventionally used.

[Modification Example]

In this embodiment, modification example similar to that of Embodiment 1 can be made.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A nonvolatile memory device of the present invention is useful as a nonvolatile memory device capable of implementing a memory cell of $4F^2$ while effectively suppressing a current flowing through an unselected memory cell.

Reference Signs List 100, 100' nonvolatile memory device
102 column decoder
104 row decoder
106 memory cell array
108 address input circuit
110 control circuit
112 electric power supply circuit
114 data input/output circuit
116 write circuit
118 clamping circuit
120 sense amplifier
122 low-resistance state attaining voltage generating circuit
124 high-resistance state attaining voltage generating circuit
125 first high-resistance state attaining voltage generating circuit
126 second high-resistance state attaining voltage generating circuit
127 third high-resistance state attaining voltage generating circuit
128 fourth high-resistance state attaining voltage generating circuit
130 P-type silicon substrate layer
132 silicon dioxide layer
134 P-implanted region 136 platinum silicide layer
138 Si$_3$N$_4$ portions
140 tantalum oxide layer
142 tantalum nitride layer
144 tungsten layer
146 Si$_3$N$_4$ layer
148 silicon dioxide layer
149 titanium/titanium nitride layer
150 titanium/titanium nitride layer
152 tungsten layer
153 contact
154 copper layer
156 silicon dioxide layer
158 silicon dioxide layer
160 polysilicon layer
161 contact
162 copper layer
163 trench
164 memory trench
166 contact wire trench
168 trench
170 hole
172 trench
174 hole
200 nonvolatile memory device
BL bit line
CL contact wire
C1, C2 contacts
D/S drain/source
E1 first electrode
E2 second electrode
G gate
MC memory cell
RR resistance variable element
SL source line
T1 first main terminal (drain/source)
T2 second main terminal (drain/source)
T3 control terminal (gate)
TR transistor
VR resistance variable layer
WL word line

The invention claimed is:

1. A nonvolatile memory device comprising:
a plurality of first wires extending in parallel with each other in a first direction within a first plane;
a plurality of second wires extending in parallel with each other in a second direction within a second plane parallel to the first plane such that the plurality of second wires three-dimensionally cross the plurality of first wires, respectively; and
memory cells provided to respectively correspond to three-dimensional cross-points of the first wires and the second wires;
each of the memory cells including one resistance variable element and only one transistor;
the transistor including a first main terminal, a second main terminal and a control terminal;
the resistance variable element including a first electrode, a second electrode and a resistance variable layer provided between the first electrode and the second electrode;
the memory cells including a plurality of memory cells which are arranged along the first direction and configured such that a first main terminal of one of two adjacent memory cells is connected to a second main terminal of the other memory cell, to form a series path extending in the first direction and sequentially connecting main terminals of the plurality of memory cells in series; and
each of the memory cells being configured such that:
the control terminal is connected to a first wire associated with the memory cell;
the second electrode is a part of a second wire associated with the memory cell or is connected to the second wire associated with the memory cell; and
the first electrode is a part of a series path associated with the memory cell or is connected to the series path associated with the memory cell.

2. The nonvolatile memory device according to claim 1, further comprising:
a plurality of third wires extending in parallel with each other in the first direction,
wherein the plurality of memory cells arranged along the first direction constitute a plurality of memory blocks each of which includes a predetermined number of memory cells arranged successively, and
the series path is connected to the third wire for each of the memory blocks.

3. The nonvolatile memory device according to claim 2, wherein both ends of the series path are connected to the third wire for each of the memory blocks.

4. The nonvolatile memory device according to claim 2, further comprising:
an electric power supply circuit for applying voltages to the resistance variable element included in each of the memory cells,
wherein the electric power supply circuit is configured to change output voltages, according to the number of transistors included in a portion of a series path associated with a selected memory cell, from a connecting point of the associated series path and the associated third wire to the first electrode of the selected memory cell.

5. The nonvolatile memory device according to claim 2, wherein the resistance variable element is changed from a high-resistance state to a low-resistance state by application of a first voltage of a first polarity, and the resistance variable element is changed from the low-resistance state to the high-resistance state by application of a second voltage of a second polarity, which is opposite to the first polarity.

6. The nonvolatile memory device according to claim 1, wherein each of the first main terminal and the second main terminal includes a silicide layer; and the silicide layer constitutes the first electrode.

7. The nonvolatile memory device according to claim 6, wherein the silicide layer comprises platinum silicide.

8. The nonvolatile memory device according to claim 1, wherein the resistance variable element is changed from a high-resistance state to a low-resistance state by application of a first voltage of a first polarity, and the resistance variable element is changed from the low-resistance state to the high-resistance state by application of a second voltage of a second polarity, which is opposite to the first polarity.

9. The nonvolatile memory device according to claim 1, wherein the resistance variable element is located below the first wires.

* * * * *